(12) United States Patent
Kim et al.

(10) Patent No.: US 9,257,441 B2
(45) Date of Patent: Feb. 9, 2016

(54) SEMICONDUCTOR MEMORY DEVICES AND METHODS OF FORMING THE SAME

(71) Applicant: Samsung Electronics Co., Ltd., Suwon-si (KR)

(72) Inventors: Jung Ho Kim, Suwon-si (KR); Daehyun Jang, Seongnam-si (KR); Myoungbum Lee, Seoul (KR); Kihyun Hwang, Seongnam-si (KR); Sangryol Yang, Hwaseong-si (KR); Yong-Hoon Son, Yongin-si (KR); Ju-Eun Kim, Seoul (KR); Sunghae Lee, Suwon-si (KR); Dongwoo Kim, Incheon (KR); JinGyun Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 135 days.

(21) Appl. No.: 14/082,657

(22) Filed: Nov. 18, 2013

(65) Prior Publication Data
US 2014/0162440 A1    Jun. 12, 2014

Related U.S. Application Data

(62) Division of application No. 13/167,858, filed on Jun. 24, 2011, now Pat. No. 8,592,873.

(30) Foreign Application Priority Data

Jun. 24, 2010  (KR) .................. 10-2010-0060186
May 2, 2011  (KR) .................. 10-2011-0041678

(51) Int. Cl.
| H01L 29/76 | (2006.01) |
| H01L 27/115 | (2006.01) |
| H01L 29/792 | (2006.01) |
| H01L 21/02 | (2006.01) |

(52) U.S. Cl.
CPC .... *H01L 27/11551* (2013.01); *H01L 21/02675* (2013.01); *H01L 27/11578* (2013.01); *H01L 27/11582* (2013.01); *H01L 29/7926* (2013.01)

(58) Field of Classification Search
None
See application file for complete search history.

(56) References Cited

U.S. PATENT DOCUMENTS

| 7,615,502 | B2 | 11/2009 | Gu |
| 2007/0284580 | A1* | 12/2007 | Lim et al. ................ 257/66 |
| 2008/0073635 | A1 | 3/2008 | Kiyotoshi et al. |

(Continued)

FOREIGN PATENT DOCUMENTS

| JP | 2007-180389 | 7/2007 |
| JP | 2008078404 | 4/2008 |

(Continued)

*Primary Examiner* — Robert Bachner
(74) *Attorney, Agent, or Firm* — Myers Bigel Sibley & Sajovec, PA

(57) ABSTRACT

Methods of forming semiconductor devices may be provided. A method of forming a semiconductor device may include patterning first and second material layers to form a first through region exposing a substrate. The method may include forming a first semiconductor layer in the first through region on the substrate and on sidewalls of the first and second material layers. In some embodiments, the method may include forming a buried layer filling the first through region on the first semiconductor layer. In some embodiments, the method may include removing a portion of the buried layer to form a second through region between the sidewalls of the first and second material layers. Moreover, the method may include forming a second semiconductor layer in the second through region.

19 Claims, 68 Drawing Sheets

(56) References Cited

U.S. PATENT DOCUMENTS

| | | |
|---|---|---|
| 2008/0179659 A1 | 7/2008 | Enda et al. |
| 2009/0026541 A1 | 1/2009 | Chung |
| 2009/0121271 A1 | 5/2009 | Son et al. |
| 2009/0173981 A1 * | 7/2009 | Nitta .............. 257/302 |
| 2010/0112769 A1 | 5/2010 | Son et al. |
| 2010/0120214 A1 | 5/2010 | Park et al. |
| 2010/0155810 A1 | 6/2010 | Kim et al. |
| 2010/0159657 A1 | 6/2010 | Arai et al. |
| 2010/0327323 A1 | 12/2010 | Choi |
| 2011/0151636 A1 | 6/2011 | Hemink et al. |
| 2011/0272745 A1 | 11/2011 | Kiyotoshi et al. |
| 2012/0292686 A1 | 11/2012 | Son et al. |

FOREIGN PATENT DOCUMENTS

| | | |
|---|---|---|
| JP | 2009-164485 | 7/2009 |
| JP | 2010-114369 | 5/2010 |
| KR | 20080070583 | 7/2008 |
| KR | 100880377 | 1/2009 |
| KR | 20090047614 | 5/2009 |
| KR | 1020090083288 | 8/2009 |
| KR | 1020100133212 | 12/2010 |

* cited by examiner

SEMICONDUCTOR MEMORY DEVICES AND METHODS OF FORMING THE SAME

CROSS-REFERENCE TO RELATED APPLICATIONS

This U.S. non-provisional patent application is a divisional of U.S. patent application Ser. No. 13/167,858, filed on Jun. 24, 2011, which claims priority under 35 U.S.C. §119 to Korean Patent Application Nos. 10-2010-0060186, filed on Jun. 24, 2010, and 10-2011-0041678, filed on May 2, 2011, the disclosures of which are hereby incorporated by reference herein in their entireties.

BACKGROUND

The present disclosure herein relates to semiconductor devices and methods of fabricating the same, and more particularly, to semiconductor memory devices and methods of fabricating the same.

Integration density of semiconductor devices has increased as the electronics industry has advanced. Higher integration of semiconductor devices may be a factor in determining product price. For example, as integration density of semiconductor devices increases, product prices of semiconductor devices may decrease. Accordingly, demand for higher integration of semiconductor devices has increased. Because integration density of semiconductor devices may be determined by the area occupied by a unit memory cell, integration density may be influenced by the level of fine pattern forming technology. However, pattern fineness may be limited due to expensive semiconductor equipment and/or difficulties in semiconductor fabrication processes.

Three-dimensional semiconductor memory devices have been proposed for increasing integration density. Production of three-dimensional semiconductor memory devices, however, may be expensive when compared with two-dimensional semiconductor memory devices and may have concerns regarding providing reliable product characteristics.

SUMMARY

Embodiments of the inventive concept may provide semiconductor devices including gate patterns and insulation patterns repeatedly and alternatingly stacked on a substrate. The semiconductor devices may also include a through region penetrating the gate patterns and the insulation patterns. The semiconductor devices may further include a channel structure extending from the substrate through the through region. The channel structure may include a first channel pattern having a first shape. The first channel pattern may include a first semiconductor region on a sidewall of a portion of the through region, and a buried pattern dividing the first semiconductor region. The channel structure may also include a second channel pattern having a second shape. The second channel pattern may include a second semiconductor region in the through region. A grain size of the second semiconductor region may be larger than that of the first semiconductor region.

In some embodiments, grains of the second semiconductor region may have longer lengths in a direction substantially perpendicular to a top surface of the substrate than widths in a direction substantially parallel to the top surface of the substrate.

In some embodiments, the first channel pattern may be recessed within the top surface of the substrate.

In other embodiments, the second channel pattern may be on the first channel pattern, and the gate patterns may include an uppermost cell gate pattern and an upper selection gate pattern on the uppermost cell gate pattern, and a boundary between the first channel pattern and the second channel pattern may be between the uppermost cell gate pattern and the upper selection gate pattern.

In still other embodiments, the first shape is a tube shape within the first semiconductor region.

In even other embodiments of the inventive concept, a semiconductor device may include a third channel pattern between the first channel pattern and the second channel pattern, and may include a third semiconductor region having a grain size larger than a grain size of the first semiconductor region and smaller than a grain size of the second semiconductor region.

In yet other embodiments, the first channel pattern may be on the second channel pattern such that the second channel pattern is between the substrate and the first channel pattern, and the gate patterns may include a lower selection gate pattern and a lowermost cell gate pattern on the lower selection gate pattern, and a boundary between the first channel pattern and the second channel pattern may be between the lower selection gate pattern and the lowermost cell gate pattern.

In further embodiments, the second channel pattern includes a wider channel region than the first channel pattern.

In some embodiments, a drain region may be in the through region, and the first semiconductor region and the second semiconductor region may be between the drain region and the substrate.

In still further embodiments of inventive concept, a semiconductor device may further include a data storage layer between the gate patterns and the first channel pattern and between the gate patterns and the second channel pattern.

In some embodiments, the data storage layer may include a first data storage layer, and the semiconductor device may further include a second data storage layer extending along upper surfaces, lower surfaces, and sidewalls of the gate patterns.

In some embodiments, a top surface of the buried pattern may extend from the first semiconductor region through a portion of the second semiconductor region.

In even further embodiments of the inventive concept, a method of fabricating a semiconductor device may include: stacking first and second material layers repeatedly and alternatingly on a substrate; patterning the first and second material layers to form a first through region exposing the substrate; forming a first semiconductor layer in the first through region on the substrate and on sidewalls of the first and second material layers; forming a buried layer filling the first through region on the first semiconductor layer; removing a portion of the buried layer to form a second through region between the sidewalls of the first and second material layers; and forming a second semiconductor layer in the second through region, the second semiconductor layer having a grain size larger than the first semiconductor layer.

In yet further embodiments of the inventive concept, before forming the second through region, a method of fabricating a semiconductor device may further include performing a first heat treatment on the first semiconductor layer to crystallize the first semiconductor layer.

In further embodiments of the inventive concept, after forming the second semiconductor layer, a method of fabricating a semiconductor device may further include performing a second heat treatment on the second semiconductor layer and the portions of the first semiconductor layer in the second through region to crystallize the second semiconductor layer.

In still further embodiments, the second heat treatment may be a laser heat treatment.

In further embodiments, the first material layer may be a sacrificial layer and the second material layer may be an insulation layer having an etch selectivity with respect to the first material layer, and the sacrificial layer may include an uppermost cell gate sacrificial layer and an upper selection gate sacrificial layer, and a bottom surface of the second through region may be formed between the uppermost cell gate sacrificial layer and the upper selection gate sacrificial layer.

In further embodiments, the first material layer may include an uppermost cell gate layer and an upper selection gate layer on the uppermost cell gate layer, the second material layer may include an insulation layer, and a bottom surface of the second through region may be formed between the uppermost cell gate layer and the upper selection gate layer. The bottom surface of the second through region may be defined by a top surface of the buried layer and a top surface of the first semiconductor layer.

In some embodiments, removing the portion of the buried layer may include etching the buried layer such that a top surface of the buried layer is higher than that of the first semiconductor layer.

In some embodiments of the inventive concept, a method of fabricating a semiconductor device may include: stacking first and second material layers sequentially on a substrate; penetrating the first and second material layers to form a first preliminary semiconductor layer extending vertically from the substrate; performing a laser heat treatment process on the first preliminary semiconductor layer to form a first semiconductor layer; stacking a third material layer and a fourth material layer alternatingly and repeatedly on the second material layer; and penetrating the third and fourth material layers to form a second semiconductor layer connected to the first semiconductor layer.

In other embodiments, forming the second semiconductor layer may include: forming a through region by etching the third and fourth material layers and some of an upper portion of the first semiconductor layer; forming a second preliminary semiconductor layer in the through region; and performing a second heat treatment on the second preliminary semiconductor layer.

In still other embodiments, the second heat treatment may be a laser heat treatment.

In even other embodiments of the inventive concept, before forming the third and fourth material layers, a method of fabricating a semiconductor device may further include: patterning the first and second material layers to form a first trench exposing the substrate; forming a trench sacrificial layer along a lower portion and a sidewall of the first trench; and forming a trench insulation layer filling the first trench on the trench sacrificial layer.

In yet other embodiments of the inventive concept, a method of fabricating a semiconductor device may further include: patterning the third and fourth material layers to expose the trench insulation layer; and removing the trench insulation layer.

In further embodiments of the inventive concept, a method of fabricating a semiconductor device may further include forming a data storage layer on an inner sidewall of the through region.

In some embodiments, methods of forming semiconductor devices may include forming insulation layers and sacrificial layers on a substrate, and patterning the insulation layers and the sacrificial layers to form a first through region therethrough exposing the substrate. Methods may also include forming a first preliminary semiconductor layer in the first through region, and forming a first semiconductor layer by performing a first heat treatment process on the first preliminary semiconductor layer. Methods may also include forming a second through region in a portion of the first through region, forming a second preliminary semiconductor layer in the second through region, and forming a second semiconductor layer by performing a second heat treatment process on the second preliminary semiconductor layer. The second semiconductor layer may have a grain size larger than that of the first semiconductor layer. Methods may additionally include patterning the insulation layers and the sacrificial layers to form a first trench exposing the substrate. Methods may also include forming recess regions between the insulation layers by removing the sacrificial patterns, and forming a data storage layer in the recess regions. Methods may further include forming a gate conductive layer in the first trench and in the recess regions such that the data storage layer is between the gate conductive layer and the first and second semiconductor layers.

In some embodiments, methods may further include forming gate electrodes in the recess regions by removing portions of the gate conductive layer that are outside of the recess regions.

In some embodiments, removing portions of the gate conductive layer may include forming a second trench in the first trench.

In some embodiments, the methods may include, before forming the first preliminary semiconductor layer, forming a first data storage layer in the first through region. Also, forming the first preliminary semiconductor layer may include forming the first preliminary semiconductor layer on the first data storage layer, and the data storage layer formed in the recess regions may include a second data storage layer.

In some embodiments, methods may also include forming a device isolation pattern in the second trench.

In some embodiments, methods may further include forming a buried layer in the first through region to divide the first preliminary semiconductor layer. Forming the second through region may include removing a portion of the buried layer.

In some embodiments, methods may additionally include forming a buried layer in the second through region to divide the second preliminary semiconductor layer. Forming the second through region may include removing a portion of the first semiconductor layer in the first trench.

BRIEF DESCRIPTION OF THE DRAWINGS

The foregoing and other features and advantages of the disclosure will become more apparent by describing in detail exemplary embodiments thereof with reference to the following drawings. In the drawings.

DETAILED DESCRIPTION OF EXAMPLE EMBODIMENTS ACCORDING TO THE INVENTIVE CONCEPT

Figure 1:
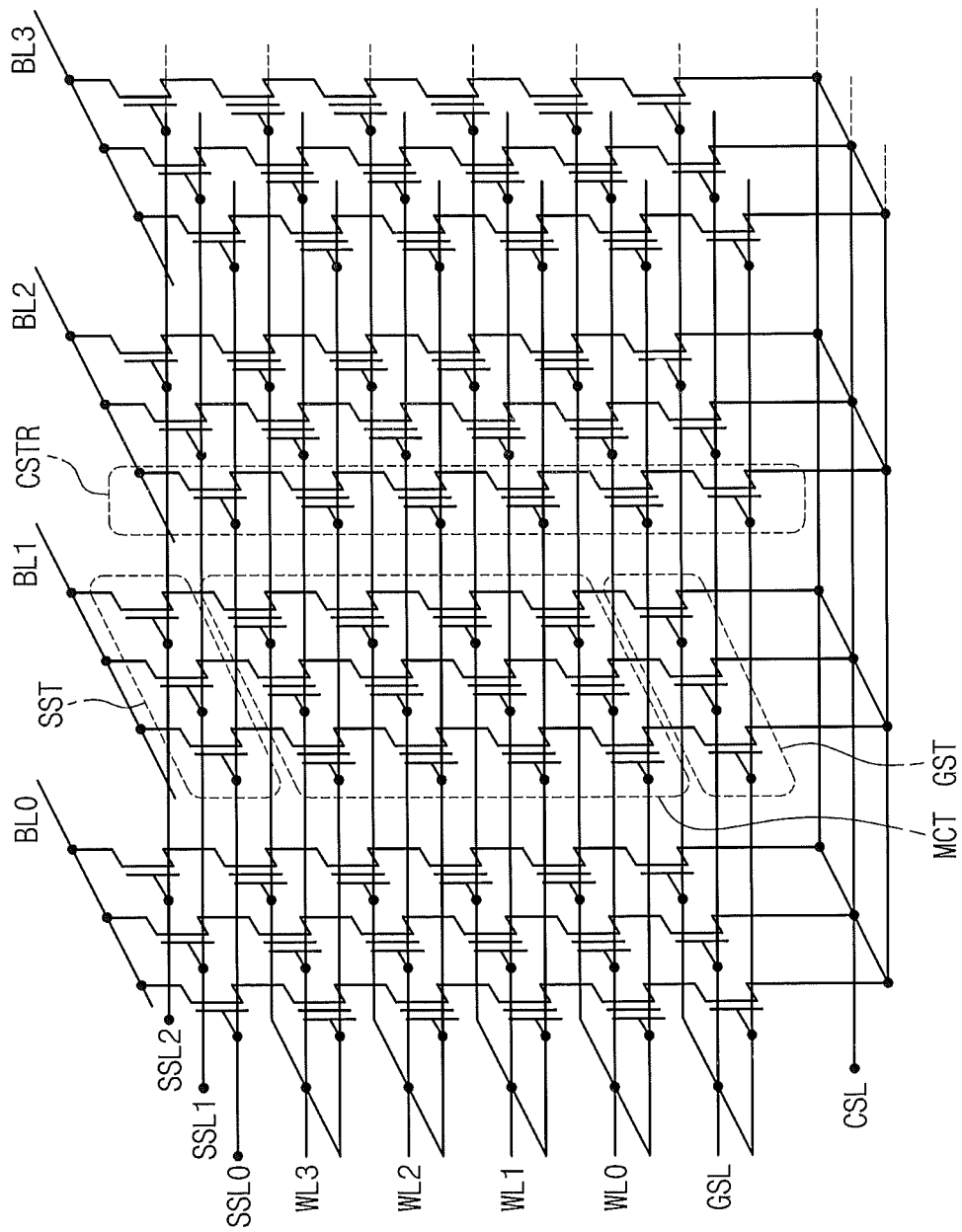
FIG. 1 is a circuit diagram of a semiconductor device according to some embodiments.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

Example embodiments are described herein with reference to cross-section illustrations that are schematic illustrations of idealized example embodiments (and intermediate structures). As such, variations from the shapes of the illustrations as a result, for example, of manufacturing techniques and/or tolerances, are to be expected. Thus, example embodiments may not be construed as limited to the particular shapes of regions illustrated herein but may be construed to include deviations in shapes that result, for example, from manufacturing.

The terminology used herein is for the purpose of describing particular embodiments only and is not intended to be limiting of the embodiments. As used herein, the singular forms "a", "an," and "the" are intended to include the plural forms as well, unless the context clearly indicates otherwise. It will be further understood that the terms "comprises," "comprising," "includes," and/or "including," when used herein, specify the presence of stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that, although the terms first, second, etc. may be used herein to describe various elements, these elements should not be limited by these terms. These terms are only used to distinguish one element from another. Thus, a first element could be termed a second element without departing from the teachings of the present embodiments.

Unless otherwise defined, all terms (including technical and scientific terms) used herein have the same meaning as commonly understood by one of ordinary skill in the art to which these embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a circuit diagram of a semiconductor device according to some embodiments of the inventive concept.

Referring to FIG. 1, a semiconductor memory device according to some embodiments may include a common source line CSL, a plurality of bit lines BL0, BL1, BL2 and BL3, and a plurality of cell strings CSTR arranged between the common source line CSL and the bit lines BL0-BL3.

The common source line CSL may be a conductive thin film disposed on a semiconductor substrate, or an impurity region formed in the substrate. The bit lines BL0-BL3 may be conductive patterns (e.g., metal lines) that are spaced apart from the semiconductor substrate and disposed thereon. The bit lines BL0-BL3 are arranged in two-dimensions, and the plurality of cell strings CSTR are connected in parallel to each of the bit lines BL0-BL3. Therefore, the cell strings CSTR are two-dimensionally arranged on the common source line CSL or the substrate.

Each of the cell strings CSTR may include a ground selection transistor GST connected to the common source line CSL, a string selection transistor SST connected to the bit lines BL0-BL3, and a plurality of memory cell transistors MCT arranged between the ground and string selection transistors GST and SST. The ground selection transistor GST, the string selection transistor SST, and the memory cell transistors MCT may be connected in series. In addition, a ground selection line GSL, a plurality of word lines WL0-WL3, and a plurality of string selection lines SSL, which are arranged between the common source line CSL and the bit lines BL0-BL3, may be used as gate electrodes of the ground selection transistor GST, the memory cell transistors MCT, and the string selection transistors SST, respectively.

The ground selection transistors GST may be arranged at a substantially equal distance from the substrate, and gate electrodes thereof may be connected in common to the ground selection line GSL, thus enabling the gate electrodes of the GSTs to be in an equipotential state. For this purpose, the ground selection line GSL may be a conductive pattern having a plate shape or a comb shape which is arranged between the common source line CSL and the memory cell transistor MCT most adjacent thereto. Similarly, the gate electrodes of the memory cell transistors MCT, which are arranged at a substantially equal distance from the common source line CSL, may also be connected in common to one of the word lines WL0-WL3, thereby enabling the gate electrodes of the MCTs to be in an equipotential state. For this purpose, each of the word lines WL0-WL3 may be a conductive pattern having a plate shape or a comb shape which is parallel to an upper surface of the substrate. Meanwhile, since one cell string CSTR includes the plurality of memory cell transistors MCT having different distances from the common source line CSL from each other, the multi-layered word lines WL0-WL3 are arranged between the common source line CSL and the bit lines BL0-BL3.

Each of the cell strings CSTR may include a semiconductor pillar which vertically extends from the common source line CSL to be connected to the bit lines BL0-BL3. The semiconductor pillars may be formed to penetrate the ground selection line GSL and the word lines WL0-WL3. In addition, the semiconductor pillar may include a body portion and impurity regions formed at one end or both ends of the body portion. For example, a drain region may be formed at an upper end of the semiconductor pillar.

Meanwhile, a data storage layer may be arranged between the word lines WL0-WL3 and the semiconductor pillar. According to some embodiments, the data storage layer may be a charge storage layer. For example, the data storage layer may be one of insulation layers including a trap insulation layer, a floating gate electrode, or conductive nano dots.

Between the ground selection line GSL and the semiconductor pillar or between the string selection line SSL and the semiconductor pillar, a dielectric layer, which may be used for a gate dielectric of the ground selection transistor GST or the string selection transistor SST, may be arranged. The gate dielectric of at least one of the ground and string selection transistors GST and SST may be formed with the same material as the data storage layer of the memory cell transistor MCT, but may be a gate dielectric (e.g., silicon oxide layer) for a typical metal-oxide-semiconductor field-effect-transistor (MOSFET).

The ground and string selection transistors GST and SST and memory cell transistors MCT may be MOSFETs using the semiconductor pillar as a channel region. According to some embodiments, the semiconductor pillar, together with the ground selection line GSL, the word lines WL0-WL3 and the string selection lines SSL, may constitute a metal-oxide-semiconductor (MOS) capacitor. In this case, the ground selection transistor GST, the memory cell transistors MCT and the string selection transistor SST may be electrically connected by sharing an inversion layer formed by a fringe field from the ground selection line GSL, the word lines WL0-WL3 and the string selection lines SSL.

Figure 2:
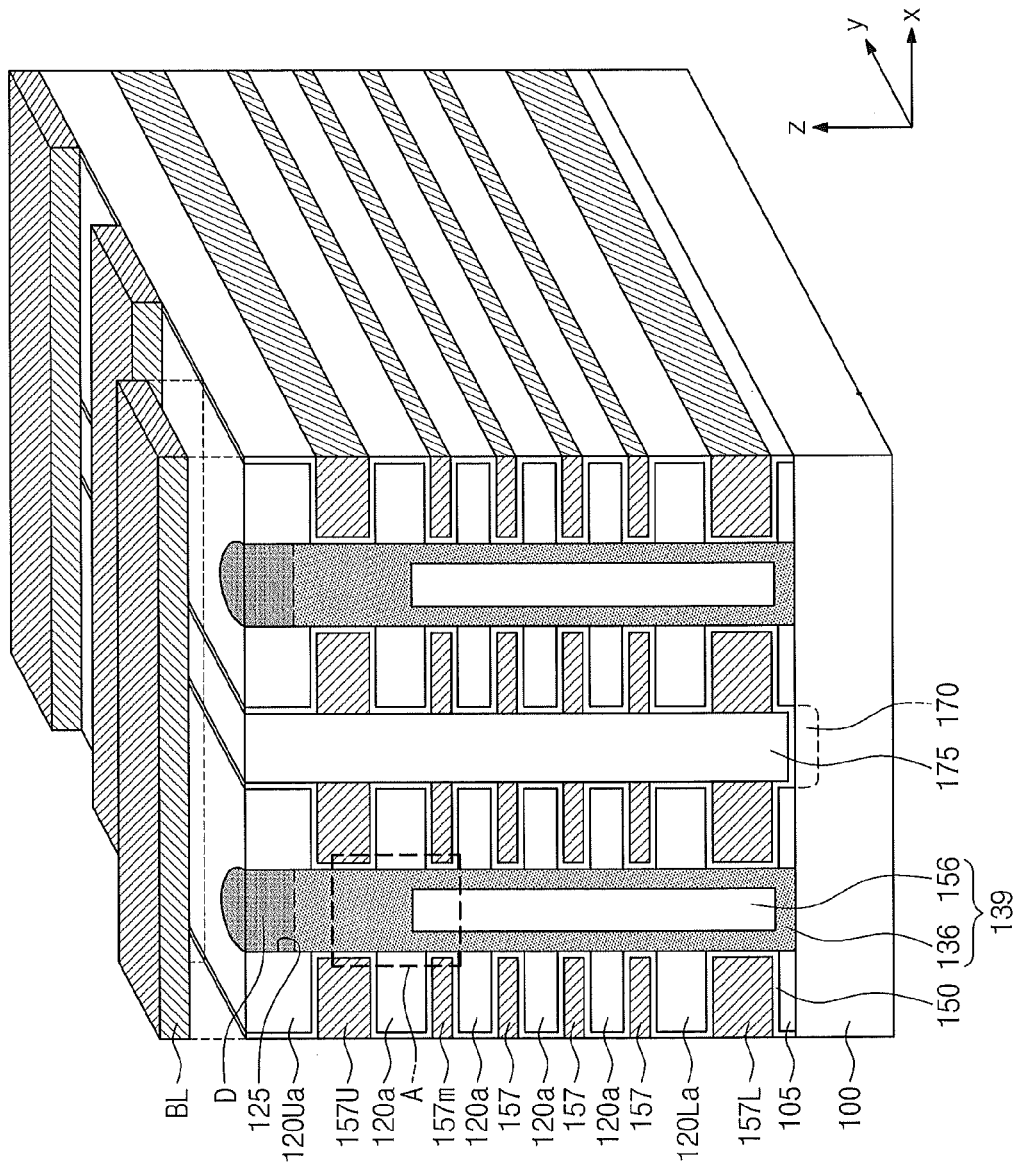
FIG. 2 is a perspective view of a semiconductor device according to some embodiments.
Figure 3:
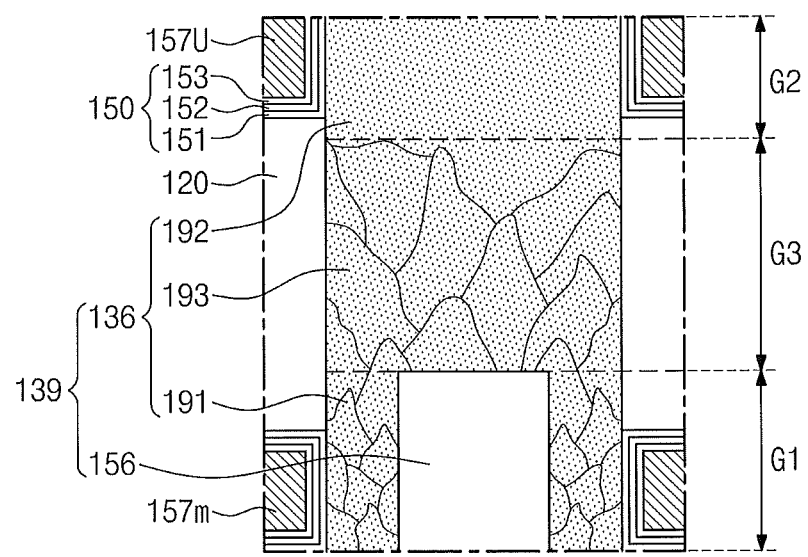
FIG. 3 is an enlarged view of the area 'A' in FIG. 2.

FIG. 2 is a perspective view of a semiconductor device according to some embodiments of the inventive concept, and FIG. 3 is an enlarged view of the area 'A' in FIG. 2.

Referring to FIGS. 2 and 3, a substrate 100 is provided. The substrate 100 may be a silicon substrate, a germanium substrate or a silicon-germanium substrate. The substrate 100 may have a structure doped with a first-type dopant. First material layers and second material layers including a material different from the first material layers, which are repeatedly and alternatingly stacked on the substrate 100, may be provided. The first material layers are gate patterns 157U, 157m, 157 and 157L, and the second material layers may be insulation patterns 120Ua, 120a and 120La. The gate patterns may include a lower selection gate pattern 157L, cell gate patterns 157m and 157 and an upper selection gate pattern 157U. The cell gate patterns may include an uppermost cell gate pattern 157m and a cell gate pattern 157 thereunder. A buffer insulation layer 105 may be provided between the substrate 100 and the lower selection gate pattern 157L. The buffer insulation layer 105 may be a silicon oxide layer. The lower selection gate pattern 157 L and the upper selection gate pattern 157U may be formed thicker than the cell gate patterns 157m and 157. The insulation patterns may include an uppermost insulation pattern 120Ua, a lowermost insulation pattern 120La and an insulation pattern 120a between the uppermost insulation pattern 120Ua and the lowermost insulation pattern 120La. The gate patterns 157U, 157m, 157 and 157L and the insulation patterns 120Ua, 120a and 120La may extend in a horizontal direction, for example, a y direction. While only six of the gate patterns 157U, 157m, 157 and 157L and the insulation patterns 120Ua, 120a and 120La are illustrated, respectively, some patterns are omitted for the simplicity of the description. Also, although only one of each of the selection gate patterns 157U and 157L are illustrated, they may be provided in plurality.

The gate patterns 157U, 157m, 157 and 157L may include at least one of metal, metal silicide, conductive metal nitride, and a doped semiconductor material. The insulation patterns 120Ua, 120a and 120La may be provided in a space that is spaced apart between the gate patterns 157U, 157m, 157 and 157L. The insulation patterns 120Ua, 120a and 120La may be oxide layers.

A channel structure 139 extending vertically from the substrate 100 may be provided. The channel structure 139 may be provided in a first through region 125 which penetrates the gate patterns 157U, 157m, 157 and 157L and the insulation patterns 120Ua, 120a and 120La. The channel structure 139 may include a semiconductor pattern 136 and a buried pattern 156.

Referring to FIG. 3, the channel structure 139 may include a first channel pattern G1 and a second channel pattern G2. The first channel pattern G1 may be formed at a lower portion of the first through region 125, and the second channel pattern G2 may be formed over the first channel pattern G1. The first channel pattern G1 may include a first semiconductor region 191 provided at a lower portion and a portion of an inner sidewall of the first through region 125, and the buried pattern 156 may be provided in the first semiconductor region 191. That is, the first channel pattern G1 of the channel structure 139 may have a macaroni shape or a shell shape in which the buried pattern 156 is filled in the tube-shaped first semiconductor region 191. The buried pattern 156 may be a dielectric pattern. Alternatively, the second channel pattern G2 may include a second semiconductor region 192 completely filling a remaining portion of the first through region 125 which is partially filled with the first channel pattern G1. That is, the second channel pattern G2 of the channel structure 139 may have a shape even without including the buried pattern 156. A grain size of the second semiconductor region 192 may be larger than that of the first semiconductor region 191.

A boundary between the first channel pattern G1 and the second channel pattern G2 may be provided between the uppermost cell gate pattern 157m and the upper selection gate pattern 157U. That is, a top surface of the buried pattern 156 may be higher (e.g., closer to the second channel pattern G2) than a top surface of the uppermost cell gate pattern 157m.

A third channel pattern G3 may be provided between the first channel pattern G1 and the second channel pattern G2. The third channel pattern G3 may include a third semiconductor region 193 having a grain size larger than the grain size of the first semiconductor region 191 and smaller than the grain size of the second semiconductor region 192. The first through third semiconductor regions 191-193 may constitute the semiconductor pattern 136.

The channel structures 139 arranged in a first direction (x-axis direction) constitute one row, and the channel structures 139 arranged in a second direction (y-axis direction) constitute one column. Hereinafter, throughout the specification, the first, the second and a third directions may denote the x-axis, the y-axis and the z-axis directions in FIG. 2, respectively. A plurality of rows and a plurality of columns may be arranged on the substrate 100. A device isolation pattern 175 may be arranged between a pair of adjacent ones of the rows. That is, the device isolation pattern 175 may extend in the second direction. The device isolation pattern 175 may include an insulating material. For example, the device isolation pattern 175 may be formed of a high-density plasma oxide layer, a spin on glass (SOG) layer and/or a chemical vapor deposition (CVD) oxide layer, or the like. A first impurity region 170 may be formed in the substrate 100 under a bottom surface of the device isolation pattern 175. The first impurity region 170 may have a line shape extending in the second direction (y-axis direction). The first impurity region 170 may be a region doped with a second-type dopant. The second-type may provide a conductivity type different from the first-type.

A data storage layer 150 may be provided between the gate patterns 157U, 157m, 157 and 157L and the channel structure 139. The data storage layer 150 may include a charge storage layer 152 for storing charges. In addition, the data storage layer 150 may further include a tunnel insulation layer 151 between the charge storage layer 152 and the channel structure 139, and a blocking layer 153 between the charge storage layer 152 and the gate patterns 157U, 157m, 157 and 157L. The charge storage layer 152 may be formed of a material having traps which store charges. For example, the charge storage layer 152 may include at least one of a silicon nitride layer, a metal nitride layer, a metal oxynitride layer, a metal silicon oxide layer, a metal silicon oxynitride layer and nano dots. The blocking layer 153 may include at least one of a silicon oxide layer, a silicon nitride layer, a silicon oxynitride layer and a high-k dielectric layer. The high-k dielectric layer may include at least one of a metal oxide layer, a metal nitride layer and a metal oxynitride layer. The high-k dielectric layer may include hafnium (Hf), zirconium (Zr), aluminum (Al), tantalum (Ta), lanthanum (La), cerium (Ce), praseodymium (Pr) and the like. A dielectric constant of the blocking layer 153 may be larger than that of the tunnel insulation layer 151.

A drain region D may be provided to the channel structure 139 adjacent the uppermost insulation pattern 120Ua on the upper selection gate pattern 157U. Bit lines BL, which extend alongside in a direction (e.g., x direction) crossing the gate patterns 157U, 157m, 157 and 157L and are electrically connected to the drain region D, are provided. The bit lines BL may include a conductive material.

According to some embodiments, a selection transistor region is provided having an active region wider than an active region of a cell region. Also, the selection transistor region may have a channel region with a large grain size. Therefore, the selection transistor region may secure a wide channel region and reduce resistance.

Figure 4:
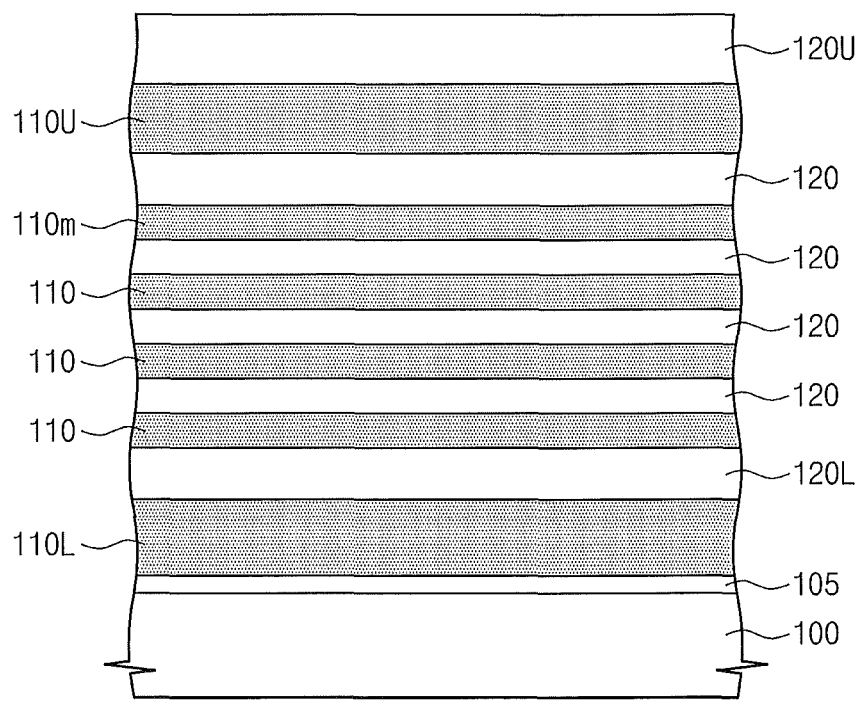
FIGS. 4 through 12 are cross-sectional views illustrating a method of fabricating a semiconductor device according to some embodiments.

FIG. 4 illustrates a method of fabricating a semiconductor device according to some embodiments. Referring to FIG. 4, a substrate 100 is prepared. The substrate 100 may be a semiconductor substrate. For example, the substrate 100 may be a silicon substrate, a germanium substrate, a silicon-germanium substrate, a compound semiconductor substrate, or the like. The substrate 100 may be doped with a first-type dopant.

First material layers and second material layers including a material different from the first material layers may be repeatedly and alternatingly stacked on the substrate 100. The first material layers may be sacrificial layers 110L, 110m, 110 and 110U. The second material layers may be insulation layers 120L, 120 and 120U. The sacrificial layers 110L, 110m, 110 and 110U may be formed of a material having an etch selectivity with respect to the insulation layers 120L, 120 and 120U. For example, the insulation layers 120L, 120 and 120U may be formed of oxide, and the sacrificial layers 110L, 110m, 110 and 110U may include nitride and/or oxynitride, or the like. The sacrificial layers 110L, 110m, 110 and 110U may each be formed of the same material. Likewise, the insulation layers 120L, 120 and 120U may each be formed of the same material.

An upper selection gate sacrificial layer 110U and a lower selection gate sacrificial layer 110L among the sacrificial layers 110L, 110m, 110 and 110U may be formed thicker than the cell gate sacrificial layers 110m and 110 between the upper selection gate sacrificial layer 110U and the lower selection gate sacrificial layer 110L. Alternatively, the sacrificial layers 110L, 110m, 110 and 110U may be formed with the same thickness. The upper selection gate sacrificial layer 110U occupies a space where an upper selection gate pattern is formed, and the cell gate sacrificial layers 110m and 110 may occupy a space where cell gate patterns are formed. The cell gate sacrificial layer may include an uppermost cell gate sacrificial layer 110m and a cell gate sacrificial layer 110 thereunder. The lower selection gate sacrificial layer 110L may occupy a space where a lower selection gate pattern is formed. The uppermost insulation layer 120U among the insulation layers 120L, 120 and 120U may be formed thicker than the insulation layers 120 and 120L thereunder.

Before forming the sacrificial layers 110L, 110m, 110 and 110U and the insulation layers 120L, 120 and 120U, a buffer insulation layer 105 may be formed on the substrate 100. The sacrificial layers 110L, 110m, 110 and 110U and the insulation layers 120L, 120 and 120U may be formed on the buffer insulation layer 105. The lower selection gate sacrificial layer 110L may be formed directly on the buffer insulation layer 105. The buffer insulation layer 105 may be formed of a dielectric material having an etch selectivity with respect to the sacrificial layers 110L, 110m, 110 and 110U. For example, the buffer insulation layer 105 may be formed of an oxide, such as a thermal oxide, for example.

Figure 5:
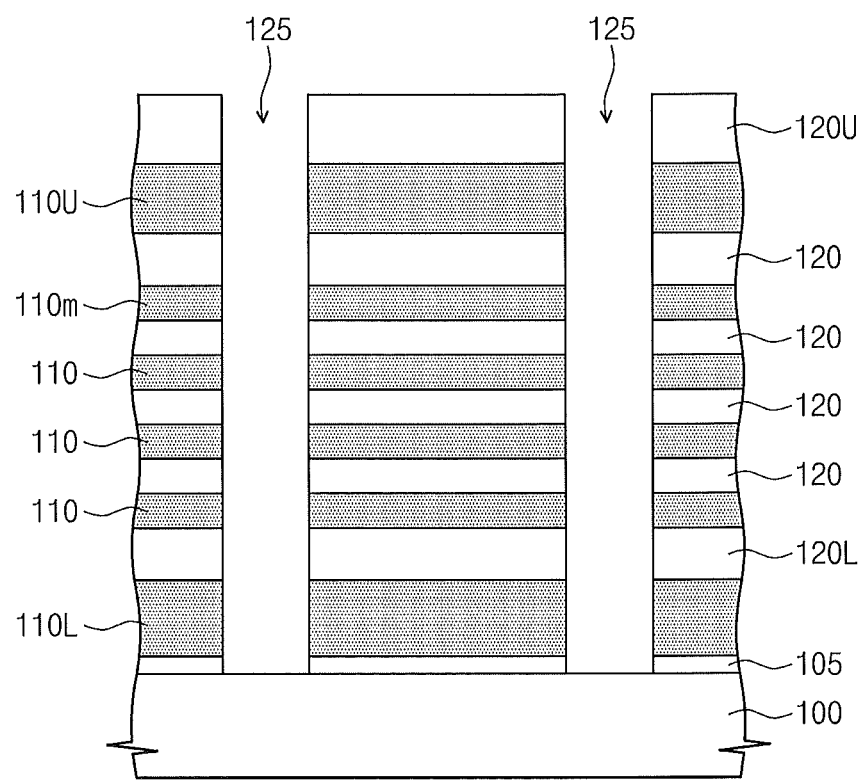

Referring to FIG. 5, the buffer insulation layer 105, the insulation layers 120L, 120 and 120U and the sacrificial layers 110L, 110m, 110 and 110U are continuously patterned such that a first through region 125 exposing an upper surface of the substrate 100 may be formed. The first through region 125 may be formed using an anisotropic etching process. The first through region 125 may have a hole shape. The first through region 125 may be two-dimensionally arranged along a first direction and a second direction perpendicular to the first direction. The first direction and the second direction are parallel to the upper surface of the substrate 100. The first through region 125 may have a round shape, an oval shape, or a polygonal shape in plan view.

Figure 6:
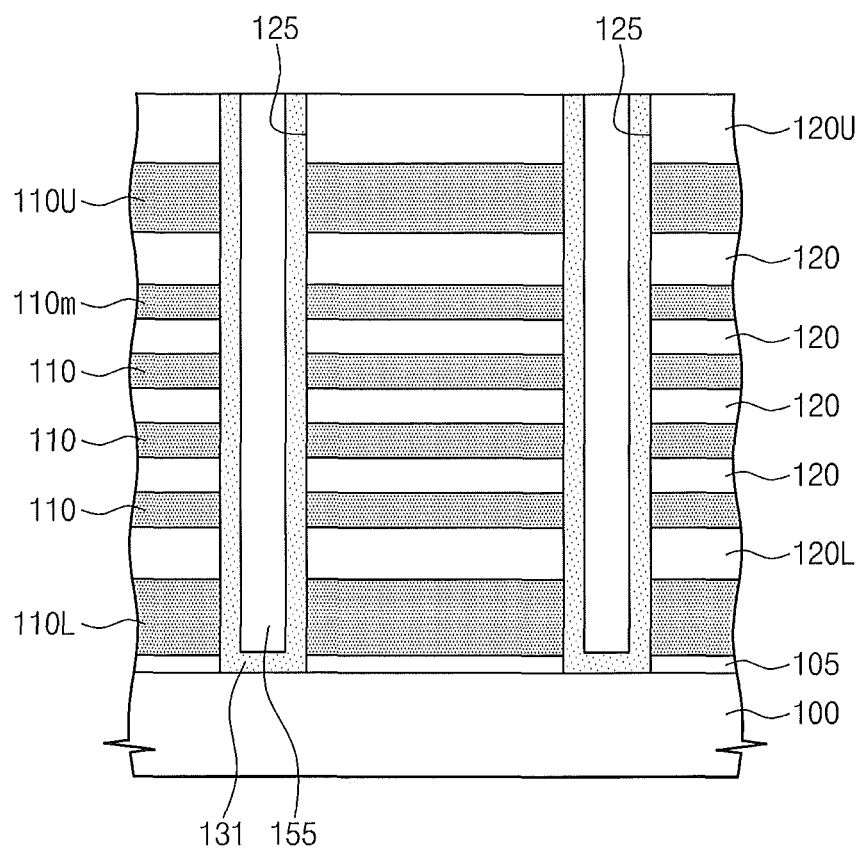

Referring to FIG. 6, a first preliminary semiconductor layer 131 may be formed along a sidewall and a lower portion of the first through region 125. The first preliminary semiconductor layer 131 may be a silicon layer. A buried layer 155 filling the first through region 125 may be formed on the first preliminary semiconductor layer 131. For example, when the insulation layers 120L, 120 and 120U are oxide layers, the buried layer 155 may be a nitride layer or oxynitride layer. The first preliminary semiconductor layer 131 and the buried layer 155 may be formed by chemical vapor deposition (CVD) or atomic layer deposition (ALD). After the first preliminary semiconductor layer 131 and the buried layer 155 are deposited, the uppermost insulation layer 120U may be exposed by a planarization process.

Figure 7:
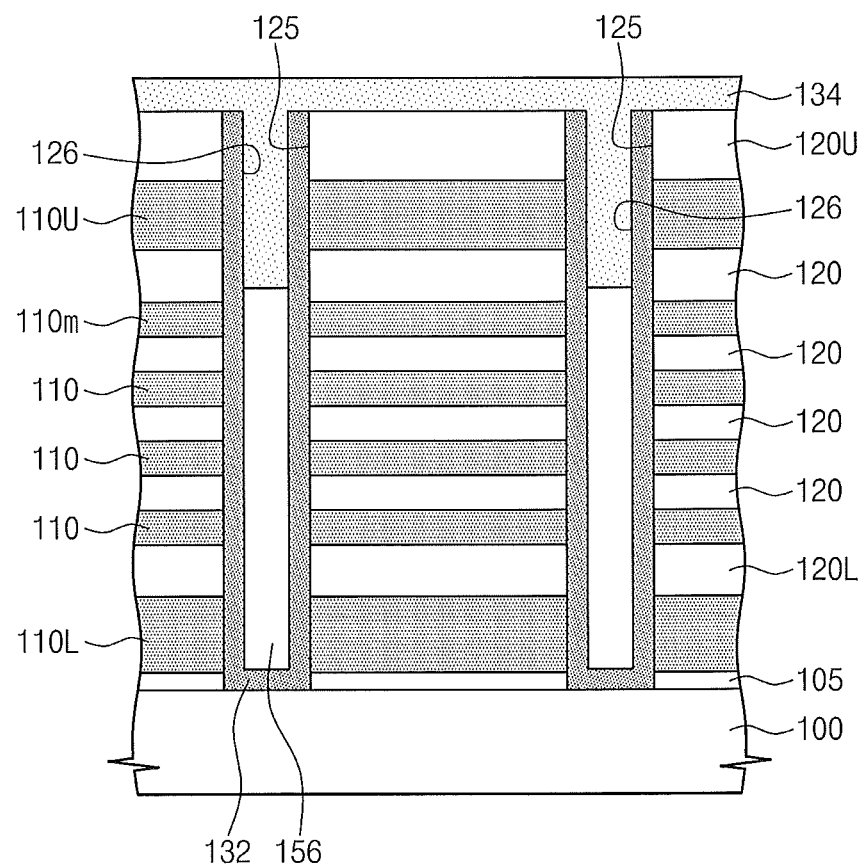

Referring to FIG. 7, a first semiconductor layer 132 may be formed by performing a first heat treatment process on the first preliminary semiconductor layer 131. The first preliminary semiconductor layer 131 is recrystallized by the first heat treatment process, thereby enabling it to have a relatively small grain size like the first channel pattern G1 in FIG. 3. The first heat treatment process may be a solid phase crystallization process.

A portion of the buried layer 155 is removed such that a buried pattern 156 and a second through region 126 may be formed. The removal of the buried layer 155 may be performed with a solution having an etch selectivity with respect to the buried layer 155. A portion of the first semiconductor layer 132 may be etched during forming the second through region 126. A bottom surface of the second through region 126 may be provided between the uppermost cell gate sacrificial layer 110m and the upper selection gate sacrificial layer 110U. A second preliminary semiconductor layer 134 filling the second through region 126 may be formed. The second preliminary semiconductor layer 134 may be formed with the same method as the first preliminary semiconductor layer 131.

Figure 8:
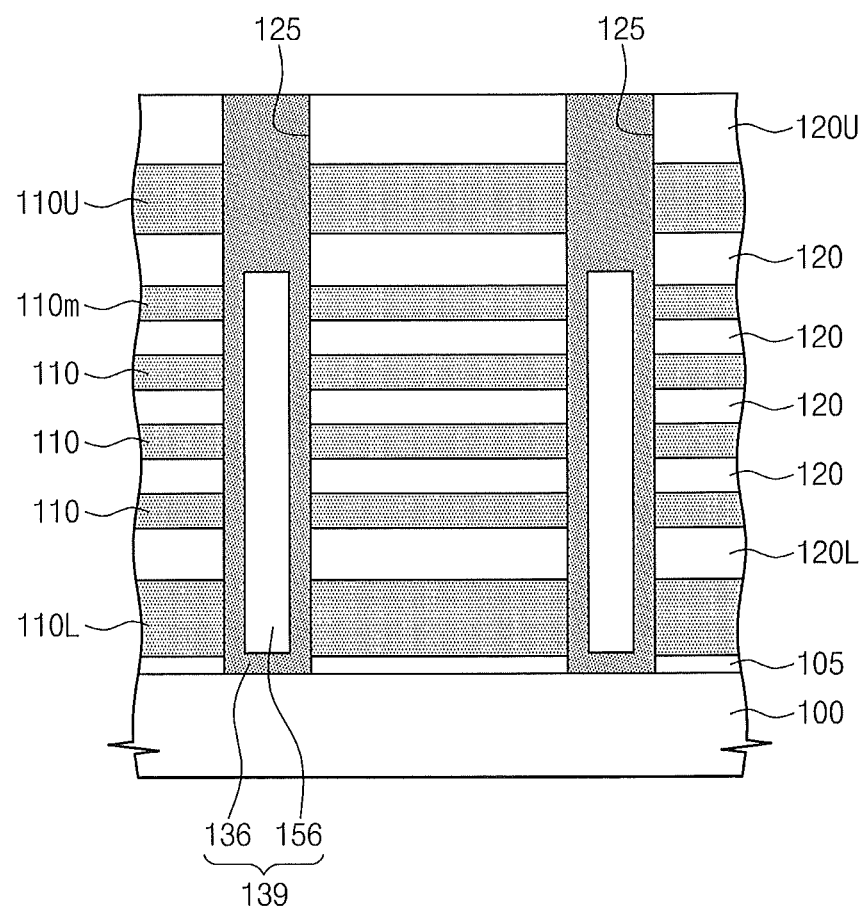

Referring to FIGS. 3 and 8, a second heat treatment process may be performed on the second preliminary semiconductor layer 134. The second heat treatment process may be performed on a portion of the first semiconductor layer 132 constituting a sidewall of the second through region 126. As a result of the second heat treatment, the second channel pattern G2 in FIG. 3 may be formed. The second channel pattern G2 includes a second semiconductor region 192. The first channel pattern G1 includes a first semiconductor region 191 and the buried pattern 156. The second semiconductor region 192 may have a larger grain size than the first semiconductor region 191 due to recrystallization by the second heat treatment process. For example, the second semiconductor region 192 may be substantially mono-crystalline. The second heat treatment process may be a laser heat treatment process. The laser heat treatment process may include at least a liquid phase melting operation of a semiconductor layer. Therefore, a semiconductor layer having a larger grain size than a semiconductor layer that is formed by solid phase crystallization may be formed during recrystallization.

A third channel pattern G3 including a third semiconductor region 193, which has a grain size larger than a grain size of the first semiconductor region 191 and smaller than a grain size of the second semiconductor region 192, may be provided between the first channel pattern G1 and the second channel pattern G2. The third channel pattern G3 may be formed by recrystallization that has partially progressed during the second heat treatment process. Before or after the second heat treatment process, a planarization process is performed to expose the uppermost insulation layer 120U. The first through third semiconductor regions 191-193 constitute a semiconductor pattern 136, and the semiconductor pattern 136 and the buried pattern 156 may constitute a channel structure 139.

Figure 9:
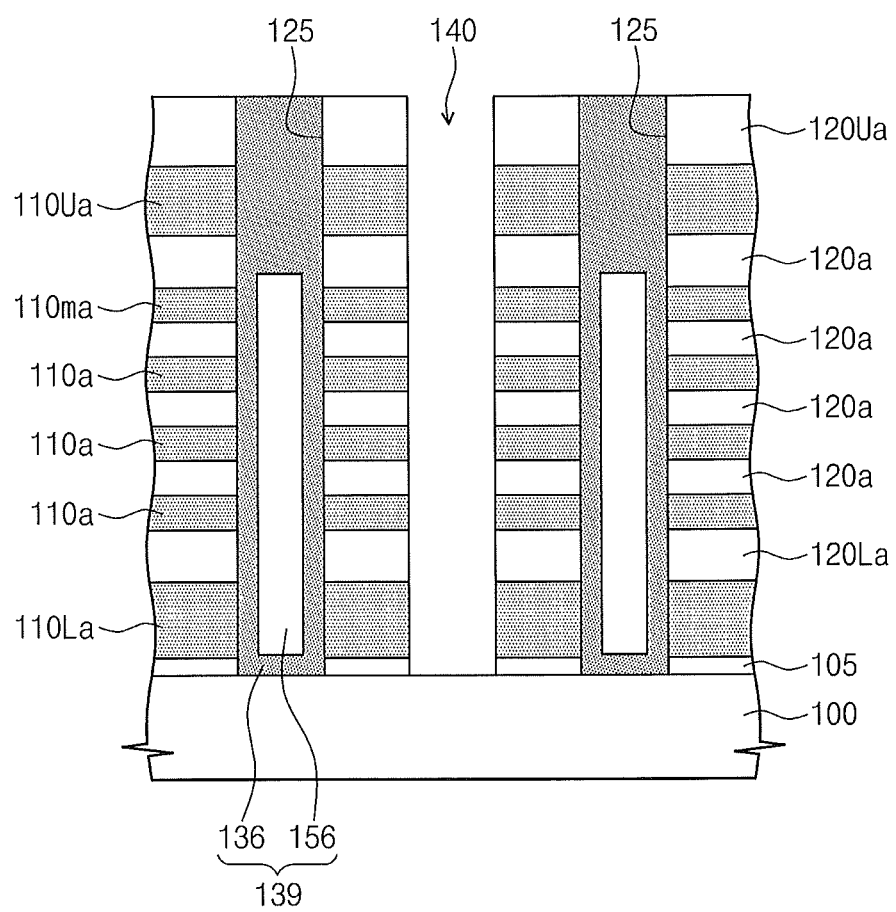

Referring to FIG. 9, the insulation layers 120L, 120 and 120U and the sacrificial layers 110L, 110m, 110 and 110U are continuously patterned to form a first trench 140. The first trench 140 defines sacrificial patterns 110La, 110ma, 110a and 110Ua and insulation patterns 120La, 120a and 120Ua which are alternatingly and repeatedly stacked. Forming the first trench 140 may be performed by an anisotropic etching process. The first trench 140 may extend in the second direction. Therefore, the sacrificial patterns 110La, 110ma, 110a and 110Ua and the insulation patterns 120La, 120a and 120Ua may also have line shapes extending in the second direction.

The sacrificial patterns 110La, 110ma, 110a and 110Ua and the insulation patterns 120La, 120a and 120Ua are exposed at a sidewall of the first trench 140. The substrate 100 may be exposed at a bottom of the first trench 140. Alternatively, the buffer insulation layer 105 may be exposed at the bottom of the first trench 140.

Figure 10:
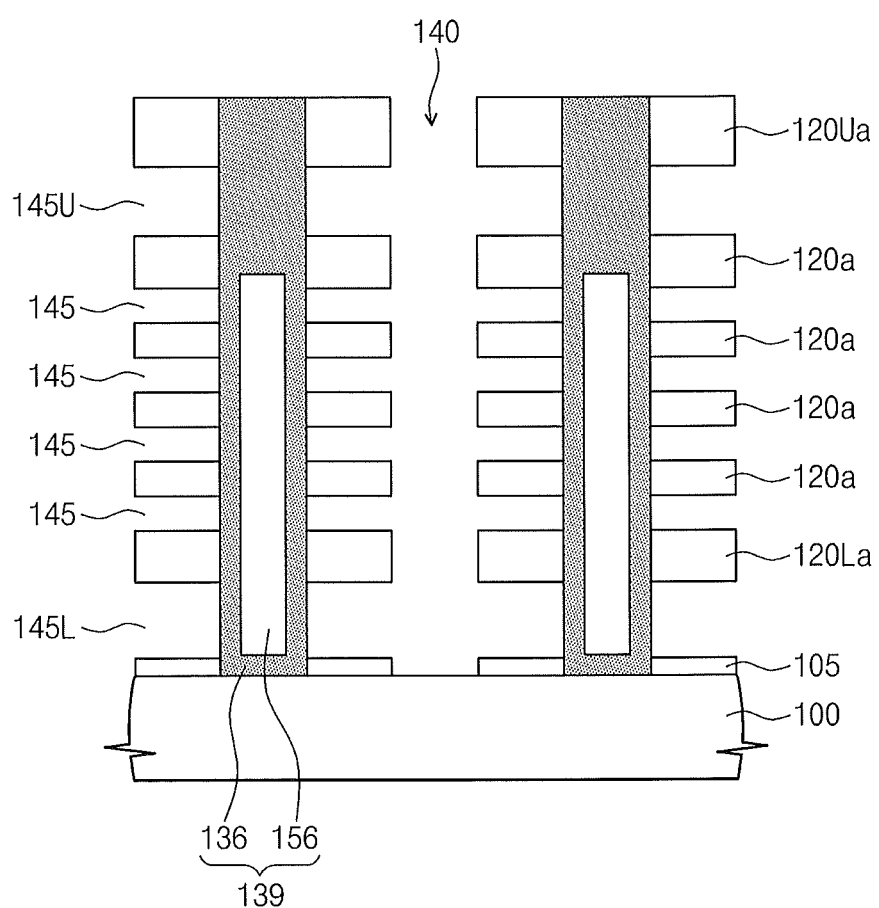

Referring to FIG. 10, the sacrificial patterns 110La, 110ma, 110a and 110Ua exposed by the first trench 140 are removed by performing a selective etching process such that recess regions 145L, 145, 145U may be formed. The selective etching process may be an isotropic etching process. The selective etching process may be performed by a wet etching and/or an isotropic dry etching. An etch rate of the sacrificial patterns 110La, 110ma, 110a and 110Ua by the selective etching process may be larger/faster than etch rates of the insulation patterns 120La, 120a and 120Ua, the buffer insulation layer 105 and the semiconductor pattern 136. Therefore, after performing the selective etching process, the insulation patterns 120La, 120a and 120Ua, the buffer insulation layer 105 and the channel structure 139 may remain. The recess regions 145L, 145, 145U may expose portions of a sidewall of the channel structure 139 which were in contact with the sacrificial patterns 110La, 110ma, 110a and 110Ua, respectively.

Figure 11:
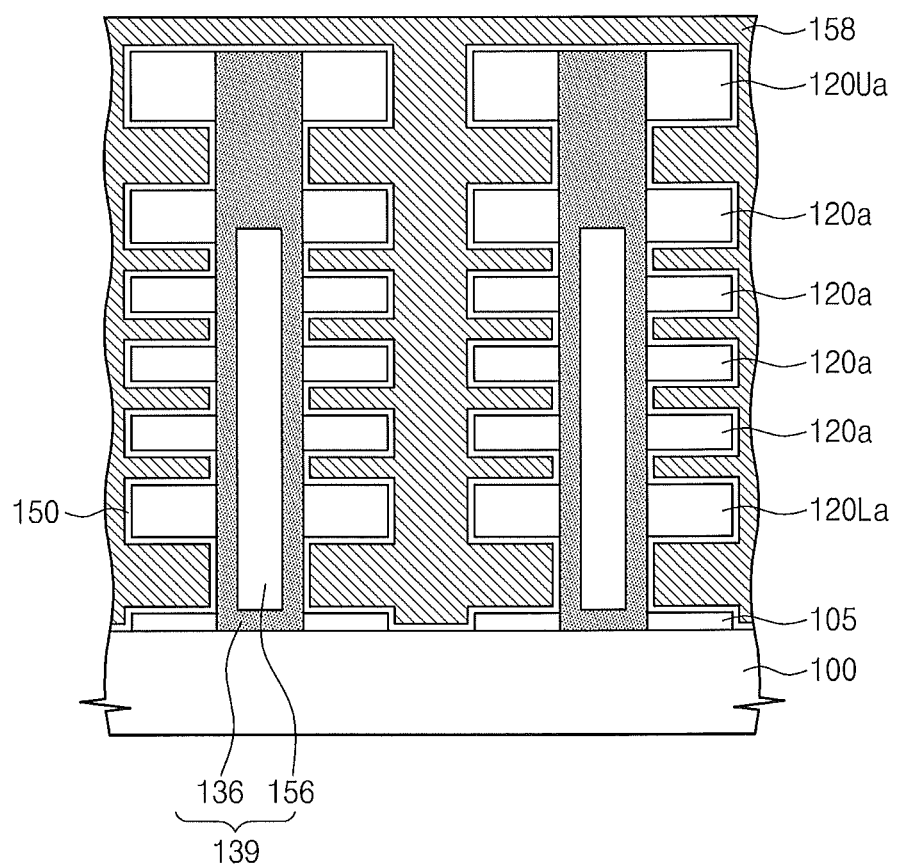

Referring to FIGS. 3 and 11, after the recess regions 145L, 145, 145U are formed, a data storage layer 150 may be disposed on the substrate 100. The data storage layer 150 may be formed using a deposition technology (e.g., CVD or ALD, etc.) which can provide excellent step coverage. Therefore, the data storage layer 150 may be substantially formed conformally. The data storage layer 150 may be formed conformally along inner surfaces of the recess regions 145L, 145, 145U. The data storage layer 150 may fill a portion of the recess regions 145L, 145, 145U.

As described in FIG. 3, forming the data storage layer 150 may include forming a tunnel insulation layer 151, a charge storage layer 152 and a blocking layer 153 in sequence.

The tunnel insulation layer 151 may be formed to cover a sidewall of the channel structure 139. The tunnel insulation layer 151 may be a single layer or multiple layers. For example, the tunnel insulation layer 151 may include at least one of a silicon oxynitride layer, a silicon nitride layer, a silicon oxide layer and a metal oxide layer.

The charge storage layer 152 may be spaced apart from the channel structure 139 by the tunnel insulation layer 151. The charge storage layer 152 may include charge trap sites capable of storing charges. For example, the charge storage layer 152 may include at least one of a silicon nitride layer, a metal nitride layer, a metal oxynitride layer, a metal silicon oxide layer, a metal silicon oxynitride layer and nano dots.

The blocking layer 153 may cover the charge storage layer 152. The blocking layer 153 may include at least one of a silicon oxide layer, a silicon nitride layer, a silicon oxynitride layer and a high-k dielectric layer. The high-k dielectric layer may include at least one of a metal oxide layer, a metal nitride layer and a metal oxynitride layer. The high-k dielectric layer may include hafnium (Hf), zirconium (Zr), aluminum (Al), tantalum (Ta), lanthanum (La), cerium (Ce), praseodymium (Pr) and the like. A dielectric constant of the blocking layer 153 may be larger than a dielectric constant of the tunnel insulation layer 151.

After the data storage layer 150 is formed, a gate conductive layer 158 may be disposed on the substrate 100. The gate conductive layer 158 may fill the recess regions 145L, 145, 145U. The gate conductive layer 158 may fill at least a portion of the first trench 140. The gate conductive layer 158 may be electrically isolated from the channel structure 139 and the substrate 100 by the data storage layer 150. The gate conductive layer 158 may be formed by a CVD method, a physical vapor deposition (PVD) method, or an ALD method. The gate conductive layer 158 may include at least one of metal, metal silicide, conductive metal nitride, a doped semiconductor material and the like.

Figure 12:
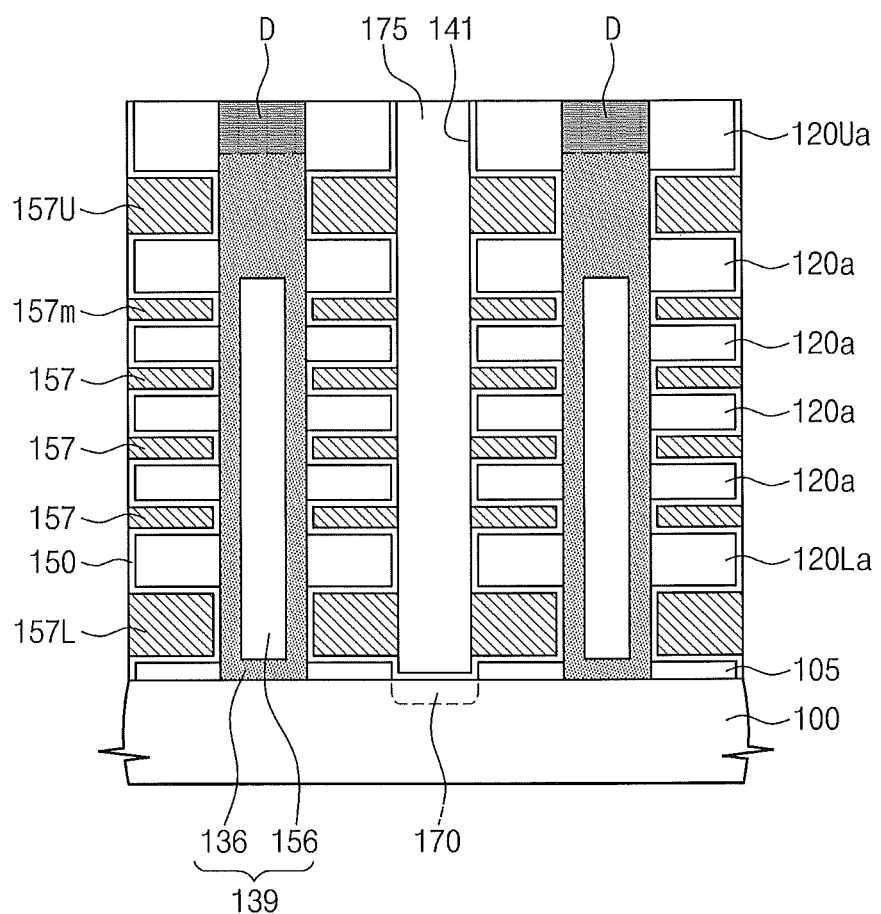

Referring to FIG. 12, after forming the gate conductive layer 158, portions of the gate conductive layer 158 that are positioned outside of the recess regions 145L, 145, 145U are removed to form gate electrodes 157L, 157m, 157 and 157U in the recess regions 145L, 145, 145U. For example, the portions of the gate conductive layer 158 outside of the recess regions 145L, 145, 145U may be removed by forming a second trench 141. Forming the second trench 141 may be performed by a wet etching and/or a dry etching process. The gate electrodes 157L, 157m, 157 and 157U may be positioned at other stacks in the third direction from an upper surface of the substrate 100 and may be isolated from each other.

The gate electrodes 157L, 157m, 157 and 157U and the insulation patterns 120La, 120a and 120Ua stacked alternatingly may be defined as one stack structure. A plurality of stack structures extending in the second direction may be arranged on the substrate 100 spaced apart from each other in the first direction.

The gate electrodes 157L, 157m, 157 and 157U correspond to portions of the gate conductive layers 158 positioned in the recess regions 145L, 145, 145U, respectively. A lowermost pattern among the gate electrodes is a lower selection gate pattern 157L, and an uppermost pattern may be an upper selection gate pattern 157U. Cell gate patterns 157m and 157 may be provided between the lower selection gate pattern 157L and the upper selection gate pattern 157U. The cell gate patterns may include an uppermost cell gate pattern 157m and a cell gate pattern 157 thereunder.

A first impurity region 170 may be formed in the substrate 100 under a bottom surface of the second trench 141. The first impurity region 170 may have a line shape extending in the second direction. The first impurity region 170 is a region doped with a second-type dopant. The first impurity region 170 may be formed by implanting second-type dopant ions into the substrate 100. The uppermost insulation pattern 120Ua may be used as an ion implantation mask. The data storage layer 150 positioned on the bottom surface of the second trench 141 may be used as an ion implantation buffer layer.

A drain region D may be formed at an upper portion of the channel structure 139. The drain region D may be doped with the second-type dopant. A bottom surface of the drain region D may be higher than a top surface of the upper selection gate pattern 157U. Alternatively, the bottom surface of the drain region D may have a height close to the upper surface of the upper selection gate pattern 157U. The drain region D and the first impurity region 170 may be formed at the same time. Alternatively, the drain region D may be formed before forming the first impurity region 170. As such, the drain region D may be formed before forming the second trench 141 and after forming the channel structure 139. Alternatively, the drain region D may also be formed after forming the first impurity region 170.

A device isolation pattern 175 filling the second trench 141 may be formed. Forming the device isolation pattern 175 may include forming a device isolation layer filling the second trench 141 and performing a planarization process on an upper surface of the data storage layer 150 using the uppermost insulation pattern 120Ua as an etch stop layer. The device isolation pattern 175 may include an insulating material. For example, the device isolation pattern 175 may be formed of a high-density plasma oxide layer, a spin on glass (SOG) layer and/or a chemical vapor deposition (CVD) oxide layer, or the like. After forming the device isolation pattern 175, the exposed data storage layer 150 may be etched such that the uppermost insulation pattern 120Ua may be exposed. As such, the drain region D may be exposed.

Referring again to FIG. 2, a bit line BL, which is electrically connected to the drain region D, may be formed. The bit line BL may extend in the first direction. The bit line BL may be formed on the uppermost insulation pattern 120Ua and the device isolation pattern 175. Alternatively, an interlayer dielectric, which covers the uppermost insulation pattern 120Ua and the device isolation pattern 175, is formed, and then the bit line BL may be formed on the interlayer dielectric. As such, the bit line BL may be electrically connected to the drain region D via a contact plug penetrating the interlayer dielectric.

According to some embodiments, a semiconductor device having channel pattern regions with different shapes from each other may be formed. Also, the selection transistor region may have a channel region with large grain size. Therefore, the selection transistor region may secure a wide channel region and reduce resistance.

Figure 13:
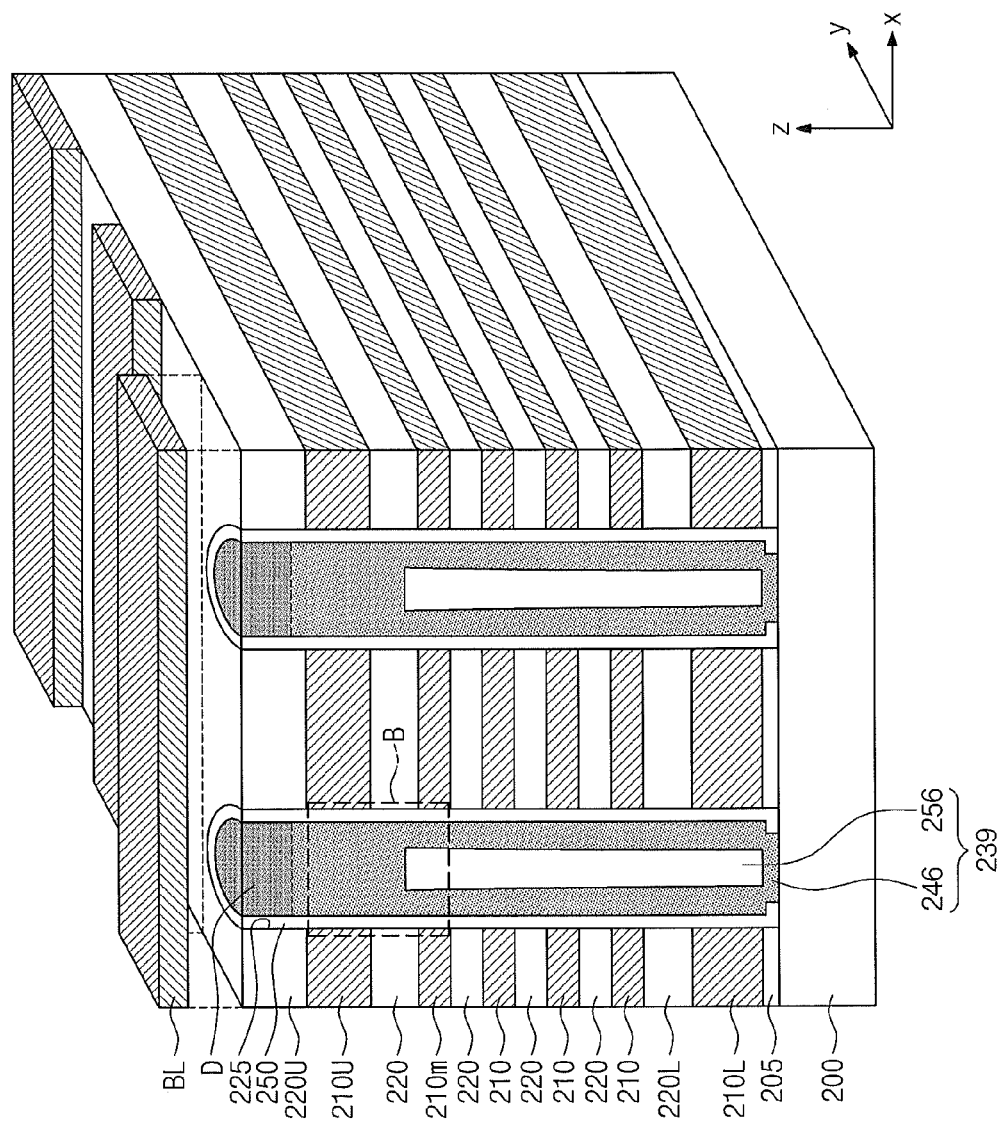
FIG. 13 is a perspective view of a semiconductor device according to some embodiments.
Figure 14:
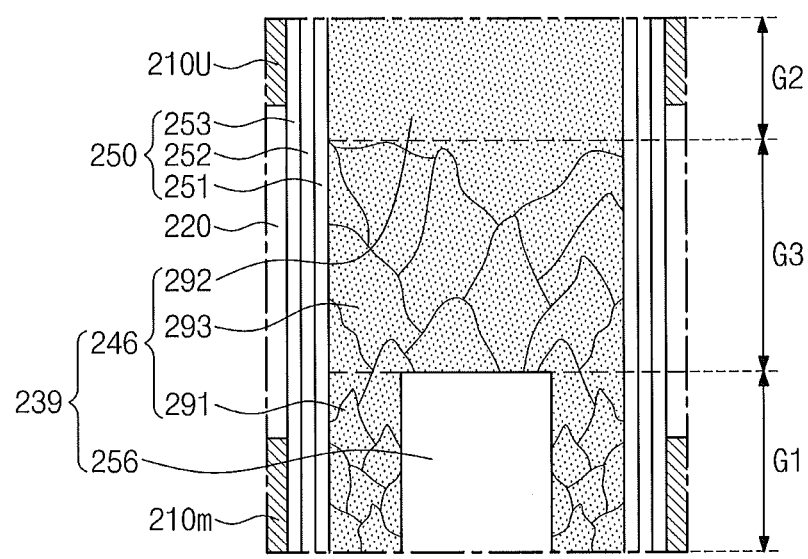
FIG. 14 is an enlarged view of the area 'B' in FIG. 13.

FIG. 13 is a perspective view of a semiconductor device according to some embodiments, and FIG. 14 is an enlarged view of the area 'B' in FIG. 13.

A structure and a method of forming the semiconductor device illustrated in FIGS. 13 and 14 may be similar to those illustrated in FIGS. 2-12. Therefore, for descriptive simplicity, the description related to the overlapping technical characteristics may be omitted.

Referring to FIGS. 13 and 14, a substrate 200 is provided. First material layers and second material layers including a material different from the first material layers, which are repeatedly and alternately stacked on the substrate 200, may be provided. The first material layers are gate layers 210U, 210m, 210 and 210L, and the second material layers may be insulation layers 220U, 220 and 220L. The gate layers may include a lower selection gate layer 210L, cell gate layers 210m and 210 and an upper selection gate layer 210U. The cell gate layers may include an uppermost cell gate layer 210m and a cell gate layer 210 thereunder. The uppermost cell gate layer 210m may be a dummy gate layer. A buffer insulation layer 205 may be provided between the substrate 200 and the lower selection gate layer 210L. The buffer insulation layer 205 may be a silicon oxide layer. The lower and upper selection gate layers 210L and 210U may be formed thicker than the cell gate layers 210m and 210. The gate layers 210U, 210m, 210 and 210L and the insulation layers 220U, 220 and 220L may extend in a horizontal direction, for example, a y direction. Although only six of the gate layers 210U, 210m, 210 and 210L and the insulation layers 220U, 220 and 220L are illustrated, respectively, some layers are omitted for the simplicity of the description. Also, although one of each of the selection gate layers 210U and 210L are illustrated, a plurality thereof may be provided.

A first through region 225, which extends from the substrate 200 by penetrating the gate layers 210U, 210m, 210 and 210L and the insulation layers 220U, 220 and 220L, may be provided. A blocking layer 253, a charge storage layer 252 and a tunnel insulation layer 251 may be sequentially provided on a sidewall of the first through region 225. A vertical channel structure 239 extending vertically from the substrate 200 may be provided in the first through region 225. The vertical channel structure 239 may include a semiconductor pattern 246 and a buried pattern 256.

The vertical channel structure 239 may include a first channel pattern G1 and a second channel pattern G2. The first channel pattern G1 may be formed at a lower portion of the first through region 225, and the second channel pattern G2 may be formed over the first channel pattern G1. The first channel pattern G1 may include a first semiconductor region 291 provided at a lower portion and on a portion of an inner sidewall of the first through region 225, and the buried pattern 256 may be provided in the first semiconductor region 291. That is, the first channel pattern G1 of the first vertical channel structure 239 may have a macaroni shape or a shell shape. Alternatively, the second channel pattern G2 may include a second semiconductor region 292 completely filling a remaining portion of the first through region 225 which is partially filled by the first channel pattern G1. That is, the second channel pattern G2 of the first vertical channel structure 239 may have a shape even without including the buried pattern 256. A grain size of the second semiconductor region 292 may be larger than a grain size of the first semiconductor region 291.

A boundary between the first channel pattern G1 and the second channel pattern G2 may be provided between the uppermost cell gate layer 210m and the upper selection gate layer 210U. That is, a top surface of the buried pattern 256 may be higher (e.g., closer to the second channel pattern G2) than a top surface of the uppermost cell gate layer 210m.

A third channel pattern G3 may be provided between the first channel pattern G1 and the second channel pattern G2. The third channel pattern G3 may include a third semiconductor region 293 having a grain size which is larger than the grain size of the first semiconductor region 291 and is smaller than the grain size of the second semiconductor region 292. The first through third semiconductor regions 291-293 may constitute the semiconductor pattern 246. The semiconductor pattern 246 may have an intrinsic state.

A drain region D may be provided to the vertical channel structure 239 adjacent the uppermost insulation layer 220Ua on the upper selection gate layer 210U. Bit lines BL, which extend alongside in a direction (e.g., a first direction) crossing the gate layers 210U, 210m, 210 and 210L, and are electrically connected to the drain region D, may be provided. The bit lines BL may include a conductive material.

Figure 15:
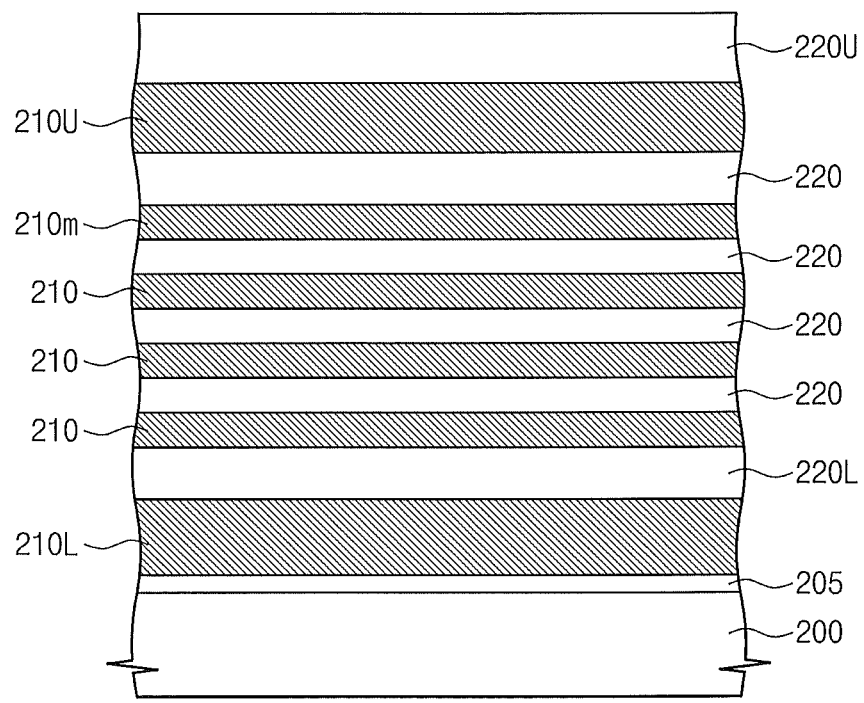
FIGS. 15 through 20 are cross-sectional views illustrating a method of fabricating a semiconductor device according to some embodiments.

FIG. 15 illustrates a method of fabricating a semiconductor device according to some embodiments. Referring to FIG. 15, first material layers and second material layers including a material different from the first material layers may be repeatedly and alternatingly stacked on a substrate 200. The first material layers may be gate layers 210U, 210m, 210 and 210L. The second material layers may be insulation layers 220L, 220 and 220U. The gate layers 210U, 210m, 210 and 210L, for example, may be formed of impurity-doped polycrystalline silicon or a metallic material. For example, the insulation layers 220L, 220 and 220U may be formed of a silicon oxide layer or a silicon nitride layer.

The gate layers 210U, 210m, 210 and 210L may include an upper selection gate layer 210U, a lower selection gate layer 210L and cell gate layers 210m and 210 between the upper selection gate layer 210U and the lower selection gate layer 210L. The cell gate layer may include an uppermost cell gate layer 210m and a cell gate layer 210 thereunder. The gate layers 210U, 210m, 210 and 210L may be formed with the same thickness. Alternatively, the upper and lower selection gate layers 210U and 210L may be formed thicker than the cell gate layers 210m and 210. An uppermost insulation layer 220U among the insulation layers 220L, 220 and 220U may be formed thicker than the insulation layers 220 and 220L thereunder.

Before forming the gate layers 210U, 210m, 210 and 210L and the insulation layers 220L, 220 and 220U, a buffer insulation layer 205 may be formed on the substrate 200. The gate layers 210U, 210m, 210 and 210L and the insulation layers 220L, 220 and 220U may be formed on the buffer insulation layer 205. The lower selection gate layer 210L may be formed directly on the buffer insulation layer 205. The buffer insulation layer 205 may be formed of oxide, particularly, thermal oxide.

Figure 16:
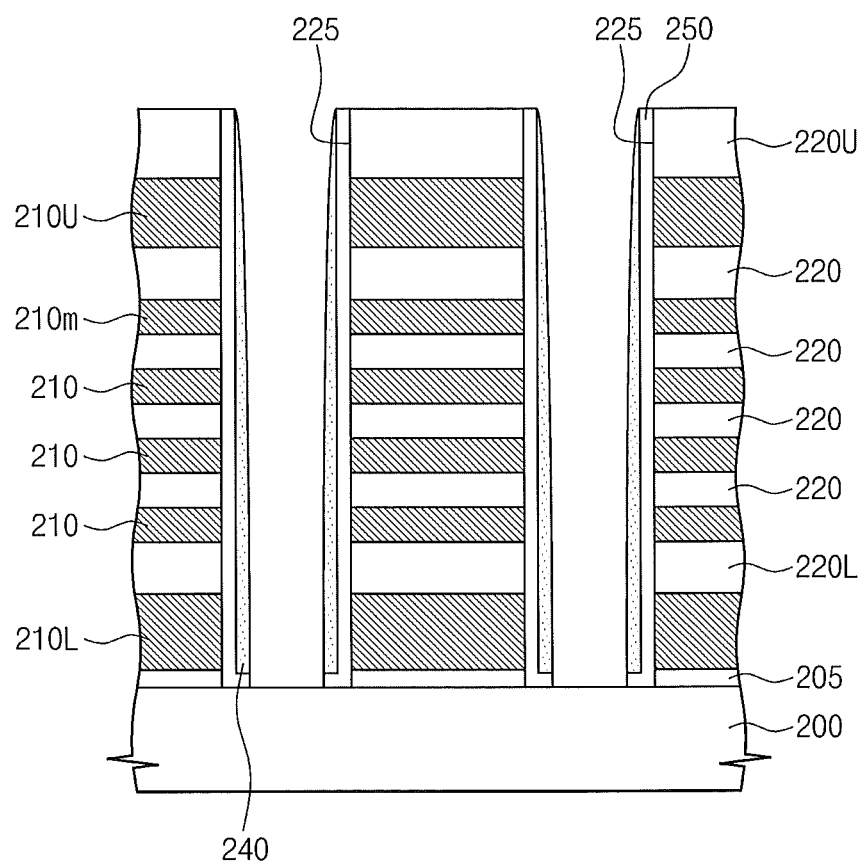

Referring to FIGS. 14 and 16, the buffer insulation layer 205, the insulation layers 220L, 220 and 220U and the gate layers 210U, 210m, 210 and 210L are continuously patterned such that a first through region 225 exposing an upper surface of the substrate 200 may be formed. The first through region 225 may be formed using an anisotropic etching process. The first through region 225 may have a hole shape. A plurality of the first through regions 225 may be spaced apart from each other.

A data storage layer 250, which covers a sidewall of the first through region 225, may be formed. As described in FIG. 14, forming the data storage layer 250 may include forming a blocking layer 253, a charge storage layer 252 and a tunnel insulation layer 251 on the sidewall of the first through region 225 in sequence. A preliminary data storage layer (not illustrated), which conformally covers an inner wall of the first through region 225 and the substrate 200, may be formed, and a spacer 240, which covers an inner sidewall of the preliminary data storage layer, may be formed. The preliminary data storage layer is etched using the spacer 240 as an etch mask such that the data storage layer 250 exposing the substrate 200 may be formed. The substrate 200 may be etched together with the data storage layer 250. During an etching process for exposing the substrate 200, the preliminary data storage layer, which is disposed on an upper surface of the uppermost insulation layer 220U, is etched also, thereby exposing the upper surface of the uppermost insulation layer 220U. The spacer 240 may be formed of amorphous or polycrystalline silicon.

Figure 17:
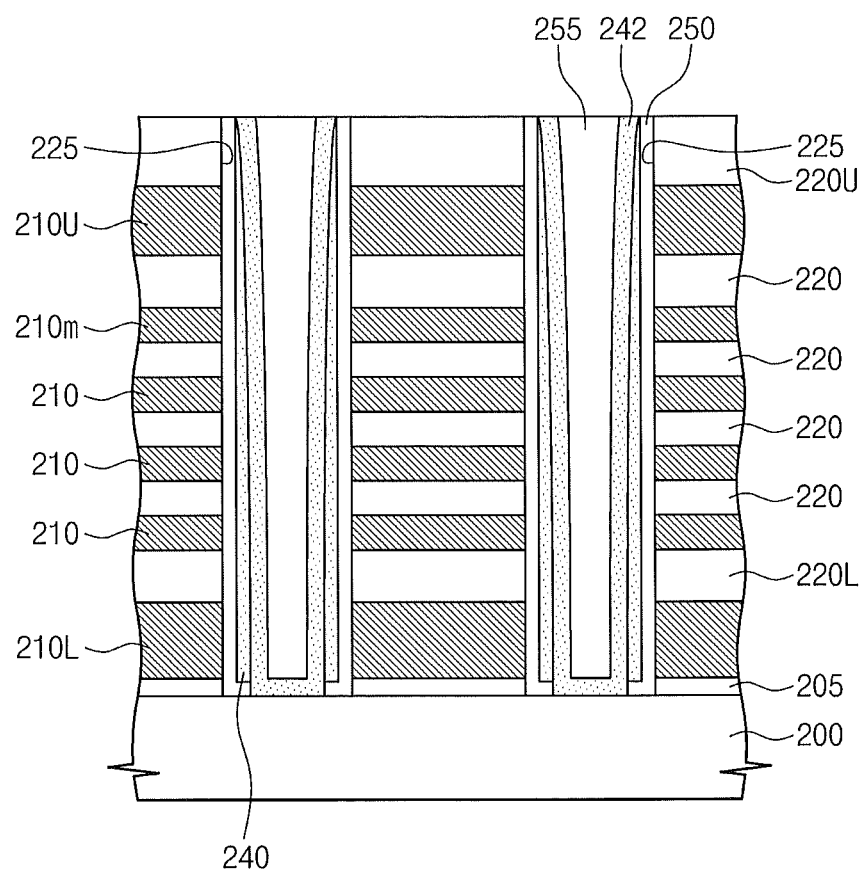

Referring to FIG. 17, a first preliminary semiconductor layer 242 may be formed along a sidewall and a lower portion of the first through region 225. The first preliminary semiconductor layer 242 may be a silicon layer. A buried layer 255 filling the first through region 225 may be formed on the first preliminary semiconductor layer 242. The first preliminary semiconductor layer 242 and the buried layer 255 may be formed by CVD or ALD. After the first preliminary semiconductor layer 242 and the buried layer 255 are deposited, the uppermost insulation layer 220U may be exposed by a planarization process.

Figure 18:
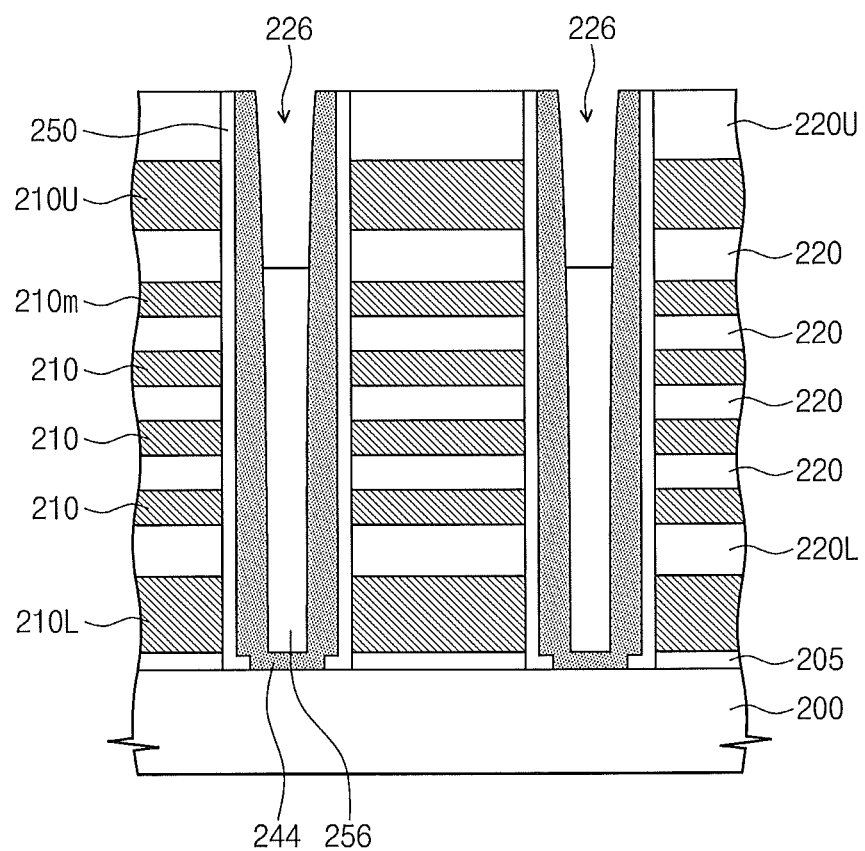

Referring to FIG. 18, a first semiconductor layer 244 may be formed by performing a first heat treatment process on the first preliminary semiconductor layer 242 and the spacer 240. The first preliminary semiconductor layer 242 and the spacer 240 are recrystallized by the first heat treatment process, thereby enabling a relatively small grain size like the first channel pattern G1 in FIG. 14. The first heat treatment process may be a solid phase crystallization process.

A portion of the buried layer 255 is removed such that the buried pattern 256 is formed and a second through region 226 may be formed. The removal of the buried layer 255 may be performed with a solution having an etch selectivity with respect to the buried layer 255. A portion of the first semiconductor layer 244 may be etched during forming the second through region 226. A bottom surface of the second through region 226 (and/or a top surface of the buried pattern 256) may be provided between the uppermost cell gate layer 210$m$ and the upper selection gate layer 210U.

Figure 19:
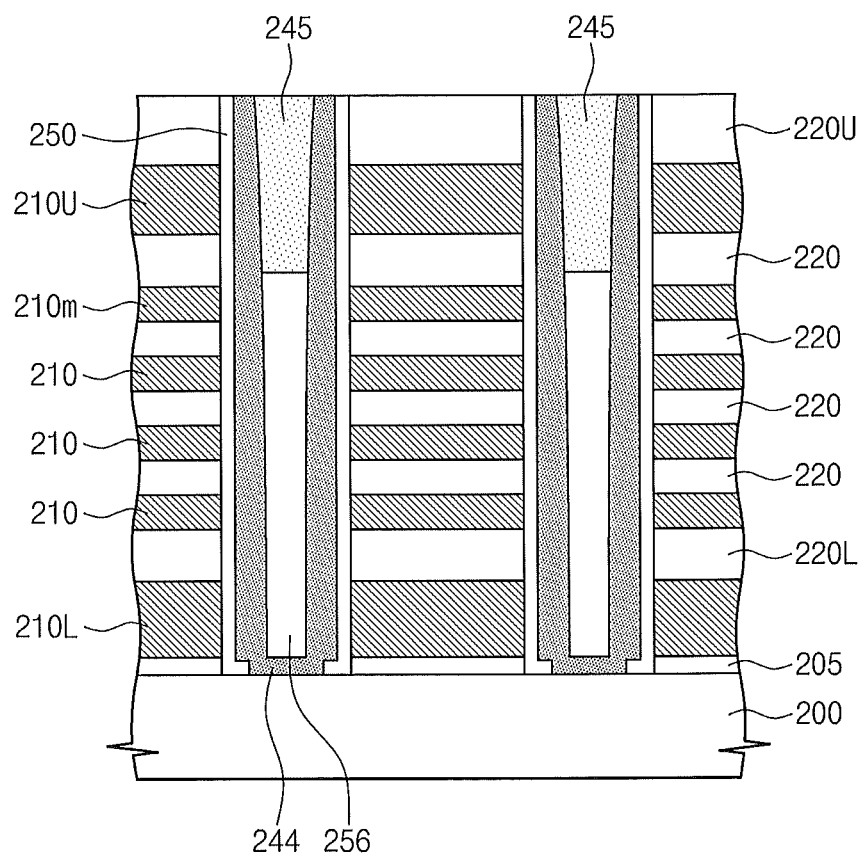

Referring to FIG. 19, a second preliminary semiconductor layer 245 filling the second through region 226 may be formed. The second preliminary semiconductor layer 245 may be formed with the same method as the first preliminary semiconductor layer 242.

Figure 20:
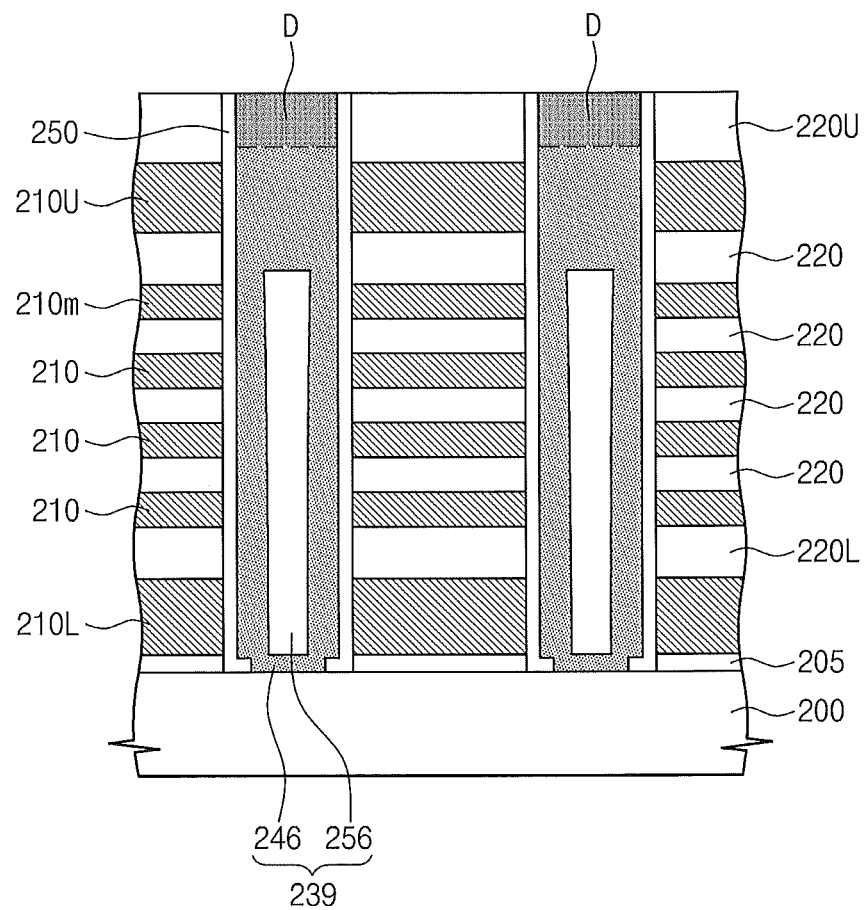

Referring to FIGS. 14 and 20, a second heat treatment process may be performed on the second preliminary semiconductor layer 245 of FIG. 19. The second heat treatment process may be performed on a portion of the first semiconductor layer 244 constituting a sidewall of the second through region 226. As a result of the second heat treatment, the second channel pattern G2 in FIG. 14 may be formed. The second channel pattern G2 includes a second semiconductor region 292. The first channel pattern G1 includes a first semiconductor region 291 and a buried pattern 256. The second semiconductor region 292 may have a larger grain size than the first semiconductor region 291 due to recrystallization by the second heat treatment process. The second heat treatment process may be a laser heat treatment process. A third channel pattern G3 including a third semiconductor region 293, which has a grain size larger than a grain size of the first semiconductor region 291 and smaller than a grain size of the second semiconductor region 292, may be provided between the first channel pattern G1 and the second channel pattern G2. The third channel pattern G3 may be formed by recrystallization that has partially progressed during the second heat treatment process. The first through third semiconductor regions 291-293 constitute a semiconductor pattern 246, and the semiconductor pattern 246 and the buried pattern 256 may constitute a vertical channel structure 239.

A drain region D may be formed at an upper portion of the vertical channel structure 239. The drain region D may be doped with a second-type dopant. A bottom surface of the drain region D may be higher than a top surface of the upper selection gate layer 210U. Alternatively, the bottom surface of the drain region D may have a height close to the top surface of the upper selection gate layer 210U.

Referring again to FIG. 13, a bit line BL, which is electrically connected to the drain region D, may be formed. The bit line BL may extend in the first direction (x-axis direction). The bit line BL may be formed on the uppermost insulation layer 220U. Alternatively, an interlayer dielectric covering the uppermost insulation layer 220U may be formed, and then the bit line BL may be formed on the interlayer dielectric. As such, the bit line BL may be electrically connected to the drain region D via a contact plug penetrating the interlayer dielectric.

According to some embodiments, semiconductor device channel pattern regions with different shapes and grain sizes from each other may be formed. Also, the selection transistor region may have a channel region with large grain size. Therefore, the selection transistor region may secure a wide channel region and reduce resistance.

Figure 21:
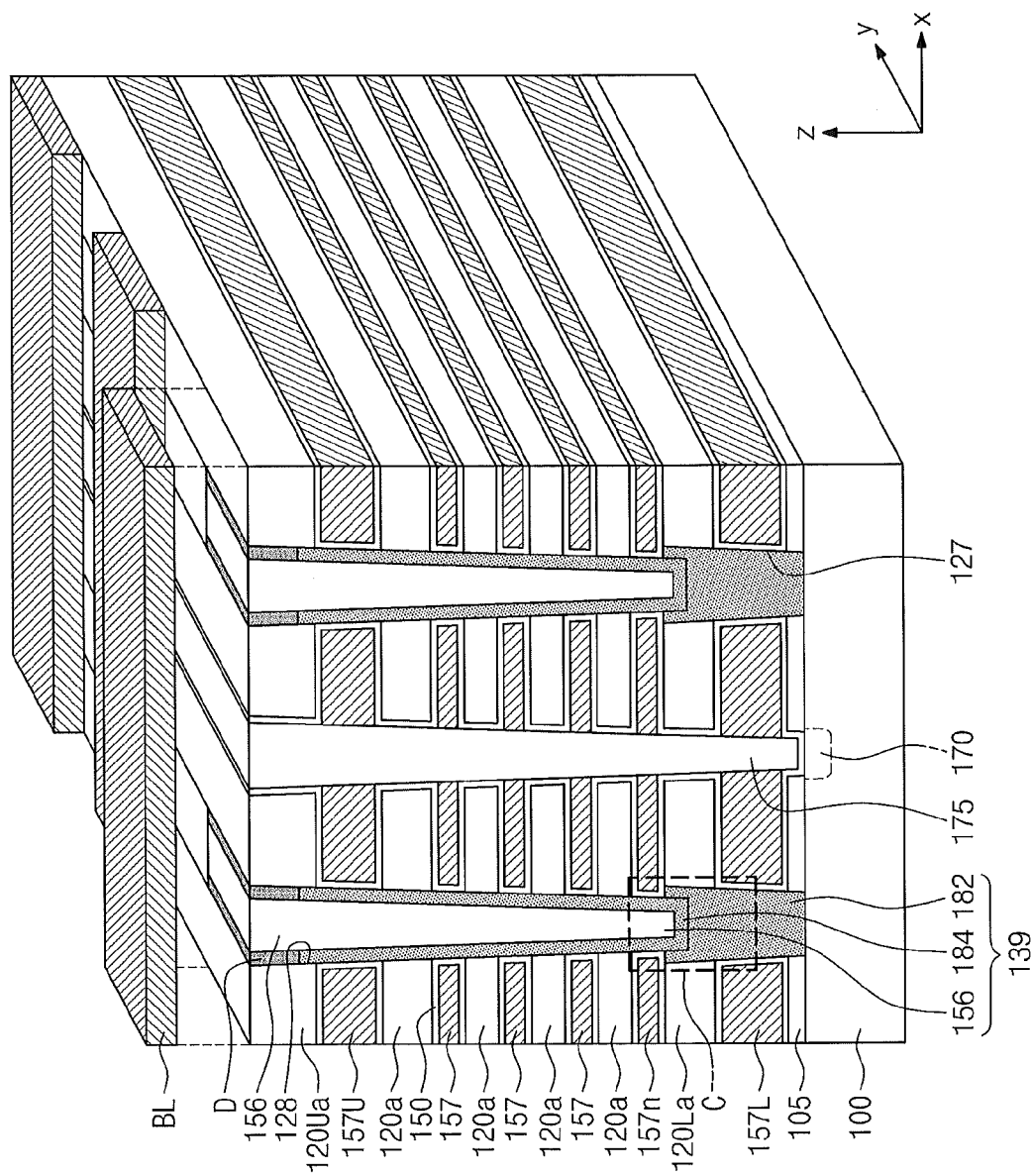
FIG. 21 is a perspective view of a semiconductor device according to some embodiments.
Figure 22:
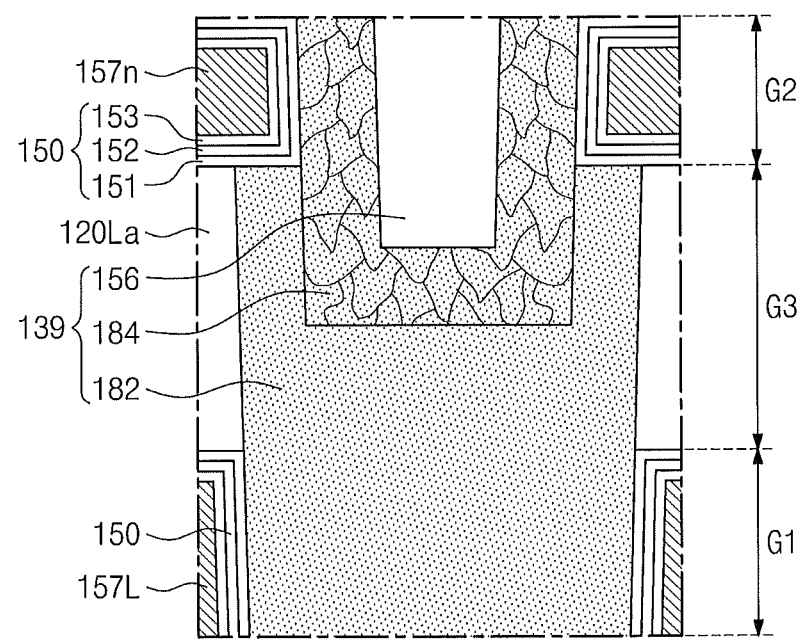
FIG. 22 is an enlarged view of the area 'C' in FIG. 21.

FIG. 21 is a perspective view of a semiconductor device according to some embodiments, and FIG. 22 is an enlarged view of the area 'C' in FIG. 21.

A structure and a method of forming the semiconductor device illustrated in FIGS. 21 and 22 according to some embodiments are similar to those of FIGS. 2-12. Therefore, for descriptive simplicity, the description related to the overlapping technical characteristics may be omitted.

Referring to FIGS. 21 and 22, first material layers and second material layers including a material different from the first material layers, which are repeatedly and alternatingly stacked on the substrate 100, may be provided. The first material layers are gate patterns 157U, 157$n$, 157 and 157L, and the second material layers may be insulation patterns 120Ua, 120$a$ and 120La. The gate patterns may include a lower selection gate pattern 157L, cell gate patterns 157$n$ and 157 and an upper selection gate pattern 157U. The cell gate patterns may include a lowermost cell gate pattern 157$n$ and a cell gate pattern 157 thereabove. The insulation patterns may include an uppermost insulation pattern 120Ua, a lowermost insulation pattern 120La and an insulation pattern 120$a$ between the uppermost and lowermost insulation patterns 120Ua and 120La. A buffer insulation layer 105 may be provided between the substrate 100 and the lower selection gate pattern 157L.

A channel structure 139 extending vertically from the substrate 100 is provided. The channel structure 139 may include a first channel pattern G1 in a first through region 127 which penetrates the lower selection gate pattern 157L and the lowermost insulation pattern 120La. The channel structure 139 may include a second channel pattern G2 in a second through region 128 which penetrates the upper selection gate pattern and the cell gate patterns 157U, 157 and 157$n$ and the uppermost insulation pattern and insulation patterns 120Ua and 120$a$. The first channel pattern G1 may include a first semiconductor layer 182 filling the first through region 127. The first semiconductor layer 182 may have a larger grain size than a second semiconductor layer 184. The second channel pattern G2 may include the second semiconductor layer 184 provided on sidewalls and a lower portion of the second through region 128, and a buried pattern 156 filling the second through region 128. That is, the second channel pattern G2 of the channel structure 139 may have a macaroni shape or a shell shape. A bottom surface of the buried pattern 156 may be lower (e.g., closer to the first channel pattern G1) than a bottom surface of the lowermost cell gate pattern 157$n$. Alternatively, the first channel pattern G1 may include the second semiconductor layer 184 filling the first through region 127. That is, the second channel pattern G2 of the channel structure 139 may have a shape even without including the buried pattern 156.

The second semiconductor layer 184 may have a grain size smaller than a grain size of the first semiconductor layer 182. A third channel pattern G3 may be provided between the first channel pattern G1 and the second channel pattern G2. The third channel pattern G3 may have a structure where the first semiconductor layer 182 and the second semiconductor layer 184 are overlapped. The third channel pattern G3 may be provided adjacent the lowermost insulation pattern 120La. A bottom surface of the second channel pattern G2 may be positioned between the lower selection gate pattern 157L and the lowermost cell gate pattern 157n. The first and second semiconductor layers 182 and 184 may have an intrinsic state.

The channel structures 139 arranged in the first direction constitute one row, and the channel structures 139 arranged in the second direction constitute one column. A plurality of rows and a plurality of columns may be arranged on the substrate 100. A device isolation pattern 175 may be arranged between a pair of adjacent ones of the rows. That is, the device isolation pattern 175 may extend in a second direction. The device isolation pattern 175 may include an insulating material. A first impurity region 170 may be formed in the substrate 100 under a bottom surface of the device isolation pattern 175. The first impurity region 170 may have a line shape extending in the second direction (y-axis direction). The first impurity region 170 may be a region doped with a second-type dopant.

A data storage layer 150 may be provided between the gate patterns 157U, 157n, 157 and 157L and the channel structure 139. The data storage layer 150 may include the charge storage layer 152 configured to store charges. In addition, the data storage layer 150 may further include a tunnel insulation layer 151 between the charge storage layer 152 and the channel structure 139, and a blocking layer 153 between the charge storage layer 152 and the gate patterns 157U, 157n, 157 and 157L. The charge storage layer 152 may be formed of a material having traps which store charges.

A drain region D may be provided to the channel structure 139 adjacent the uppermost insulation pattern 120Ua on the upper selection gate pattern 157U. Bit lines BL, which extend in a direction crossing the gate patterns 157U, 157n, 157 and 157L and are electrically connected to the drain region D, are provided. The bit lines BL may include a conductive material.

According to some embodiments, a selection transistor region having an active region wider than an active region of a cell region is provided. Also, the selection transistor region may have a channel region with a large grain size. Therefore, the selection transistor region may secure a wide channel region and reduce resistance.

Figure 23:
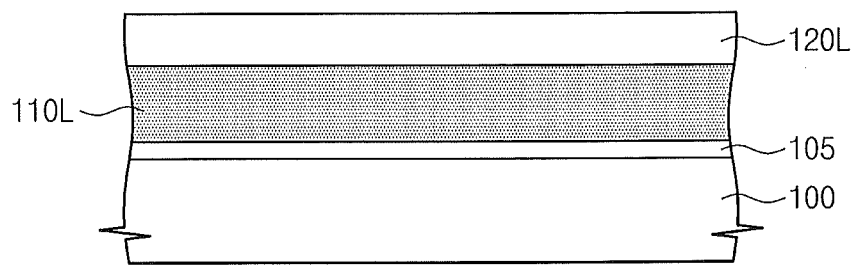
FIGS. 23 through 31 are cross-sectional views illustrating a method of fabricating a semiconductor device according to some embodiments.
Figure 24:
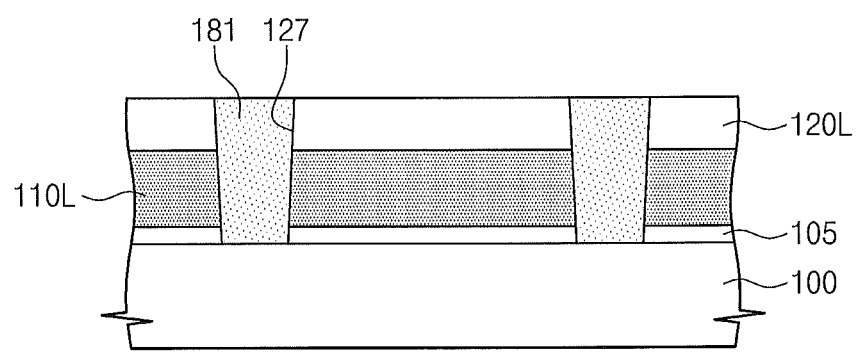

FIG. 23 illustrates a method of fabricating a semiconductor device according to some embodiments. Referring to FIG. 23, a substrate 100 is prepared. A lower selection gate sacrificial layer 110L and a lowermost insulation layer 120L may be sequentially stacked on the substrate 100. A buffer insulation layer 105 may be provided between the lower selection gate sacrificial layer 110L and the substrate 100. Referring to FIG. 24, a first through region 127 may be formed at portions of the lower selection gate sacrificial layer 110L and the lowermost insulation layer 120L. The first through region 127 may have a shape which gradually becomes narrower as it extends downward (e.g., closer to the substrate 100). A first preliminary semiconductor layer 181 filling the first through region 127 may be formed. The first preliminary semiconductor layer 181 may be a silicon layer.

Figure 25:
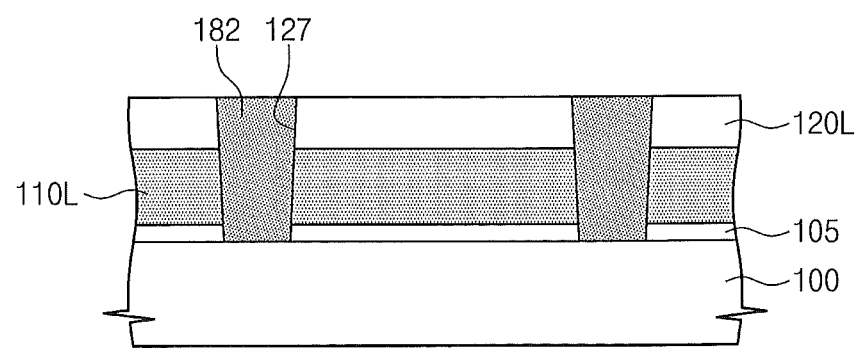

Referring to FIG. 25, a first semiconductor layer 182 may be formed by performing a first heat treatment process on the first preliminary semiconductor layer 181. The first semiconductor layer 182 may have a larger grain size than a second semiconductor layer. The first heat treatment process may be a laser heat treatment process. A portion of the first semiconductor layer 182 may constitute the first channel pattern G1 in FIG. 22.

Figure 26:
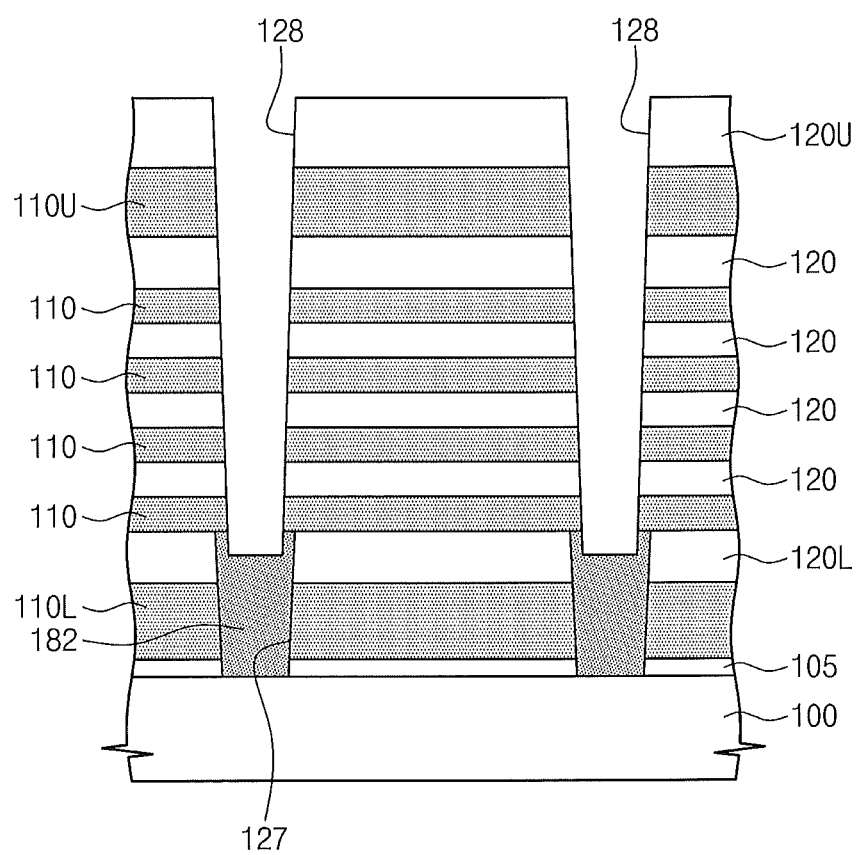

Referring to FIG. 26, sacrificial layers 110 and 110U and insulation layers 120 and 120U may be alternatingly and repeatedly stacked on the lowermost insulation layer 120L. The sacrificial layers may include an upper selection gate sacrificial layer 110U and sacrificial layers 110 between the lower selection gate sacrificial layer 110L and the upper selection gate sacrificial layer 110U. The insulation layers may include an uppermost layer 120U and insulation layers 120 between the uppermost insulation layer 120U and the lowermost insulation layer 120L. The upper selection gate sacrificial layer 110U occupies a space where an upper selection gate pattern may be formed, and the sacrificial layers 110 may occupy a space where cell gate patterns are formed. The lower selection gate sacrificial layer 110L may occupy a space where the lower selection gate pattern is formed.

The sacrificial layers 110U and 110 and the insulation layers 120U and 120 are continuously patterned such that a second through region 128 exposing an upper portion of the first semiconductor layer 182 may be formed. The second through region 128 may have a shape which gradually becomes narrower as it extends downward (e.g., toward the substrate 100). During the patterning, the upper portion of the first semiconductor layer 182 may be etched. A bottom surface of the second through region 128 may be higher (e.g., farther from the substrate) than the lower selection gate sacrificial layer 110L. A bottom surface of the second through region 128 may be lower (e.g., closer to the substrate) than bottom surfaces of the sacrificial layers 110.

Figure 27:
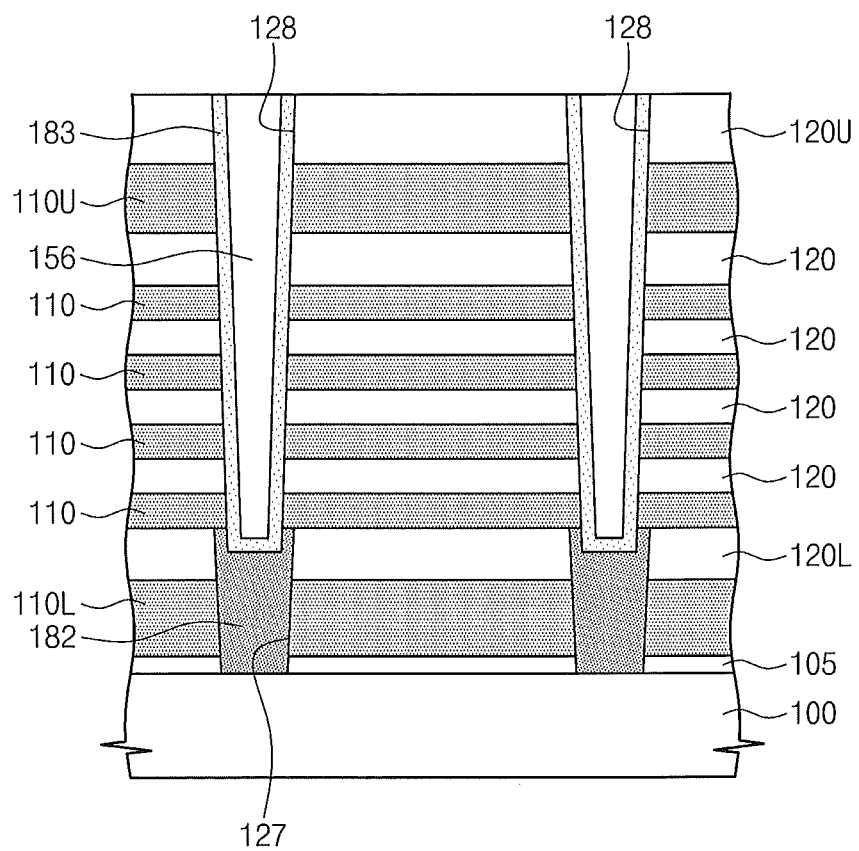

Referring to FIG. 27, a second preliminary semiconductor layer 183 may be formed on the bottom surface and sidewalls of the second through region 128. The second preliminary semiconductor layer 183 may be formed with the same method as the first preliminary semiconductor layer 181. A buried pattern 156 filling the second through region 128 may be formed on the second preliminary semiconductor layer 183.

Figure 28:
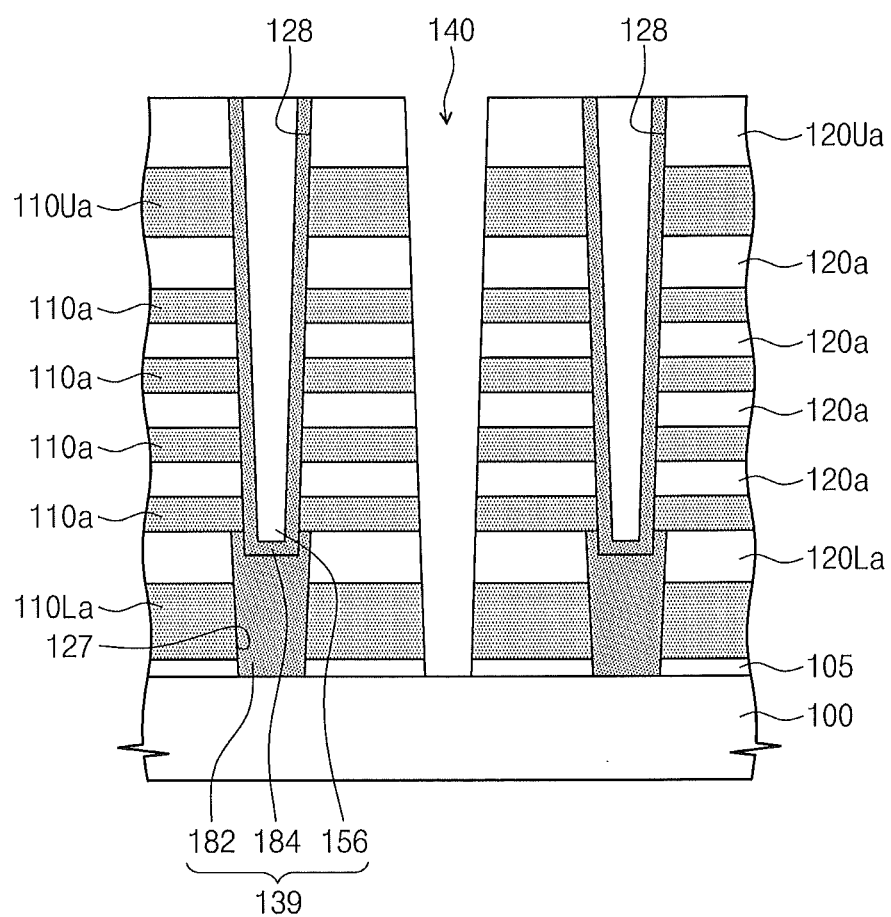

Referring to FIGS. 22 and 28, a second semiconductor layer 184 may be formed by performing a second heat treatment process on the second preliminary semiconductor layer 183. As illustrated in FIG. 22, the second semiconductor layer 184 may have a smaller grain size than the first semiconductor layer 182. The second heat treatment process may be a solid phase crystallization process. The second semiconductor layer 184 and the buried pattern 156 may constitute a second channel pattern G2. A third channel pattern G3 may be a portion where the first semiconductor layer 182 and the second semiconductor layer 184 overlap each other. The first and second semiconductor layers 182 and 184 and the buried pattern 156 may constitute a channel structure 139.

The insulation layers 120U, 120 and 120L and the sacrificial layers 110U, 110 and 110L are continuously patterned such that a first trench 140 may be formed. The first trench 140 defines the sacrificial patterns 110La, 110a and 110Ua and the insulation patterns 120La, 120a and 120Ua which are alternatingly and repeatedly stacked. Forming the first trench 140 may be performed by an anisotropic etching process. The first trench 140 may extend in the second direction. Therefore, the sacrificial patterns 110La, 110a and 110Ua and the insulation patterns 120La, 120a and 120Ua may have also line shapes extending alongside in the second direction. The sacrificial patterns 110La, 110a and 110Ua and the insulation patterns 120La, 120a and 120Ua are exposed at a sidewall of the first trench 140. The substrate 100 may be exposed at a bottom of the first trench 140.

Figure 29:
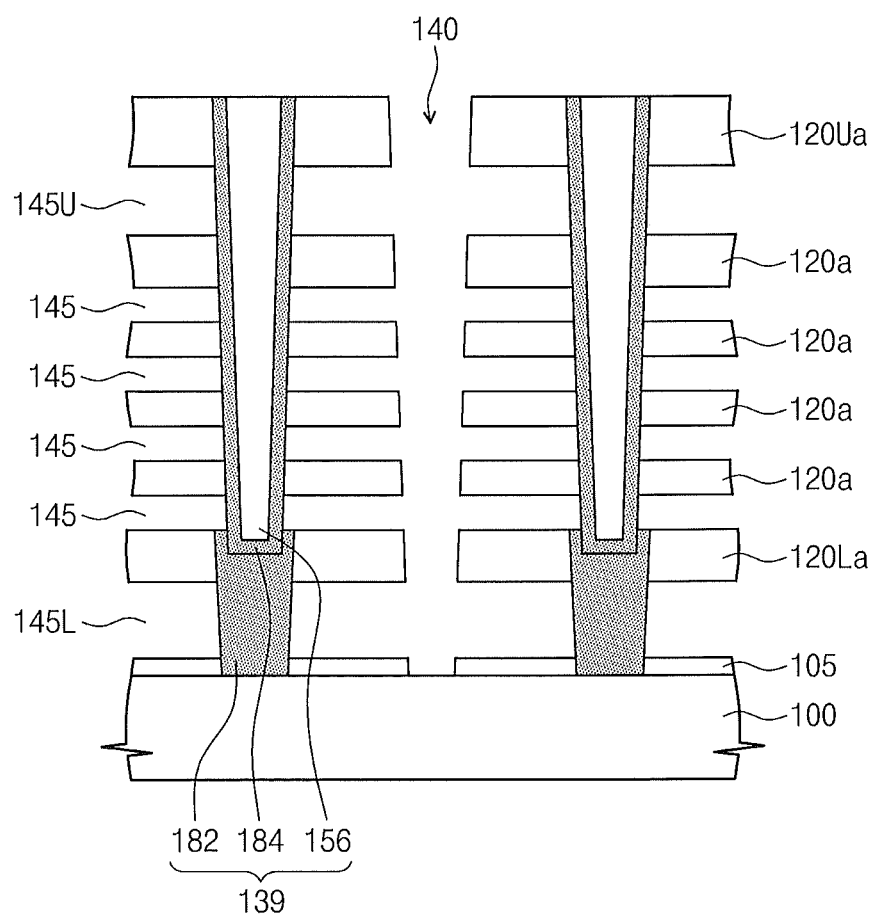

Referring to FIG. 29, the sacrificial patterns 110La, 110a and 110Ua exposed in the first trench 140 are removed by performing a selective etching process such that recess regions 145L, 145, 145U may be formed. The selective etching process may be an isotropic etching process. The selective etching process may be performed by a wet etching and/or an isotropic dry etching. An etch rate of the sacrificial patterns 110La, 110a and 110Ua by the selective etching process may be larger/faster than etch rates of the insulation patterns 120La, 120a and 120Ua, the buffer insulation layer 105 and the channel structure 139. Therefore, after the performing of the selective etching process, the insulation patterns 120La, 120a and 120Ua, the buffer insulation layer 105 and the channel structure 139 may remain.

Figure 30:
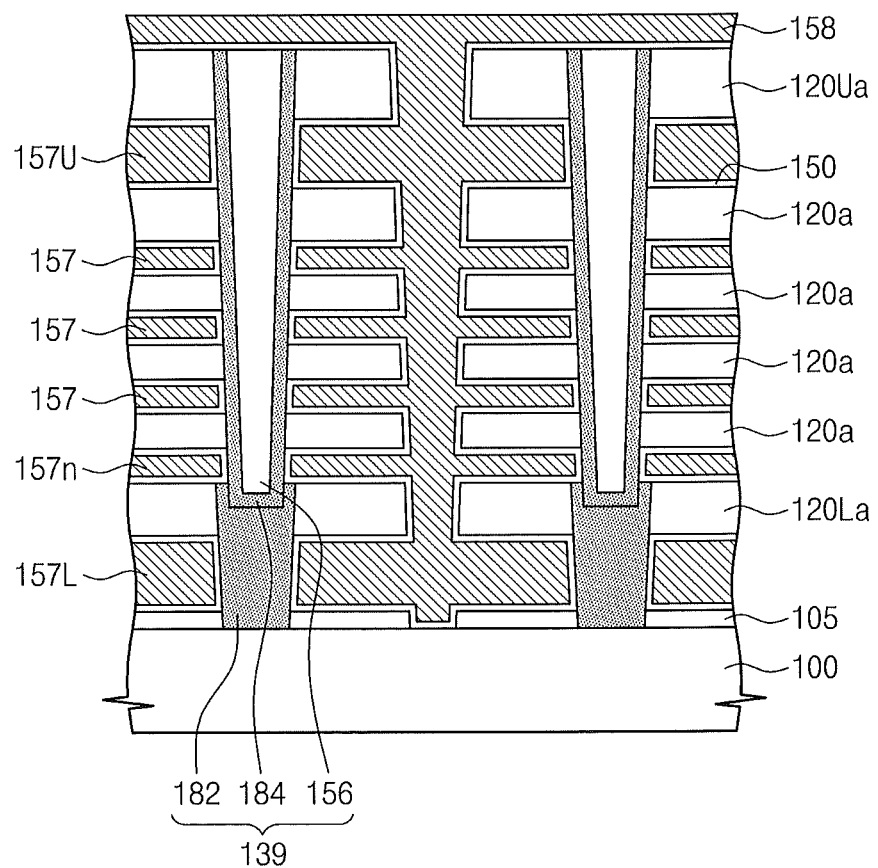

Referring to FIGS. 21 and 30, after the recess regions 145L, 145, 145U are formed, a data storage layer 150 may be formed on the substrate 100. Forming the data storage layer 150 may include forming a tunnel insulation layer 151, a charge storage layer 152 and a blocking layer 153 in sequence. After the data storage layer 150 is formed, the gate conductive layer 158 may be disposed on the substrate 100. The gate conductive layer 158 may fill the recess regions 145L, 145, 145U. The gate conductive layer 158 may fill at least a portion of the first trench 140. The gate conductive layer 158 may be electrically isolated from the channel structure 139 and the substrate 100 by the data storage layer 150.

Figure 31:
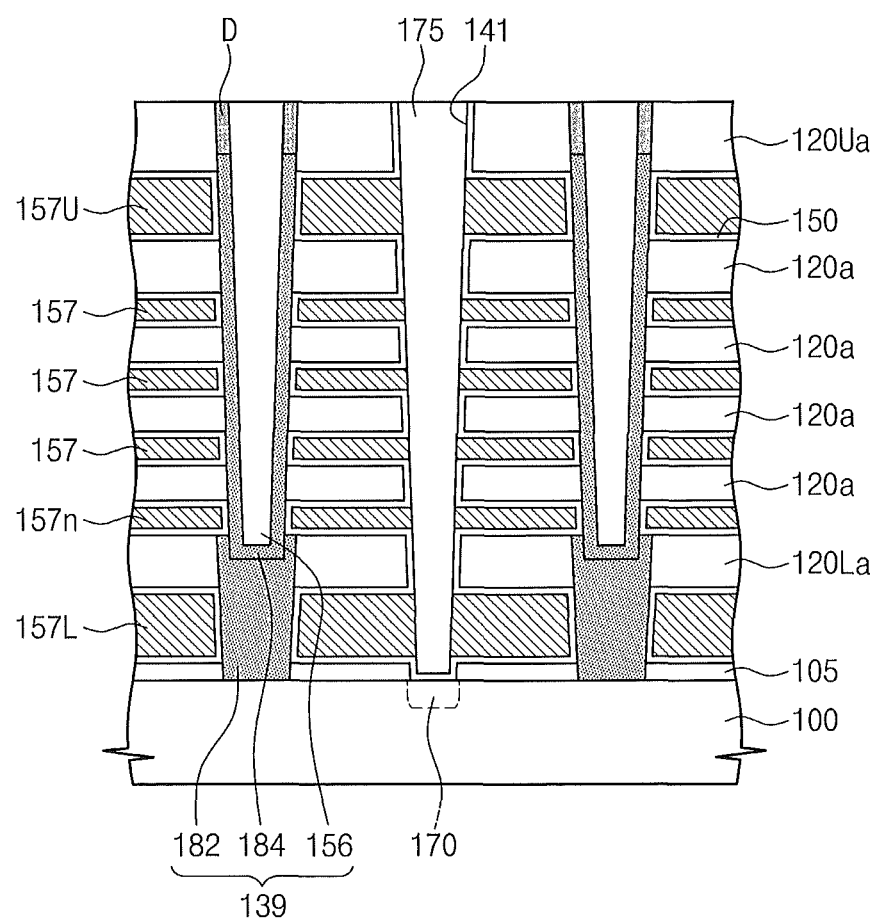

Referring to FIG. 31, portions of the gate conductive layer 158 positioned outside the recess regions 145L, 145, 145U are removed to form gate electrodes 157L, 157n, 157 and 157U in the recess regions 145L, 145, 145U. The gate conductive layer 158 positioned outside the recess regions 145L, 145, 145U may be removed by forming a second trench 141. Forming the second trench 141 may be performed by a wet etching and/or a dry etching process. The gate electrodes 157L, 157n, 157 and 157U may have a structure isolated from each other. A lowermost pattern among the gate electrodes is a lower selection gate pattern 157L, and an uppermost pattern may be an upper selection gate pattern 157U. Cell gate patterns 157n and 157 may be provided between the lower selection gate pattern 157L and the upper selection gate pattern 157U. The cell gate patterns may include a lowermost cell gate pattern 157n and a cell gate pattern 157 thereabove.

A first impurity region 170 may be formed in the substrate 100 under a bottom surface of the second trench 141. A drain region D may be formed at an upper portion of the channel structure 139. The drain region D may be doped with the second-type dopant. A device isolation pattern 175 filling the second trench 141 may be formed.

Referring again to FIG. 21, bit line BL, which is electrically connected to the drain region D, may be formed. The bit line BL may extend in the first direction. The bit line BL may be formed on the uppermost insulation pattern 120Ua and the device isolation pattern 175.

Figure 32:
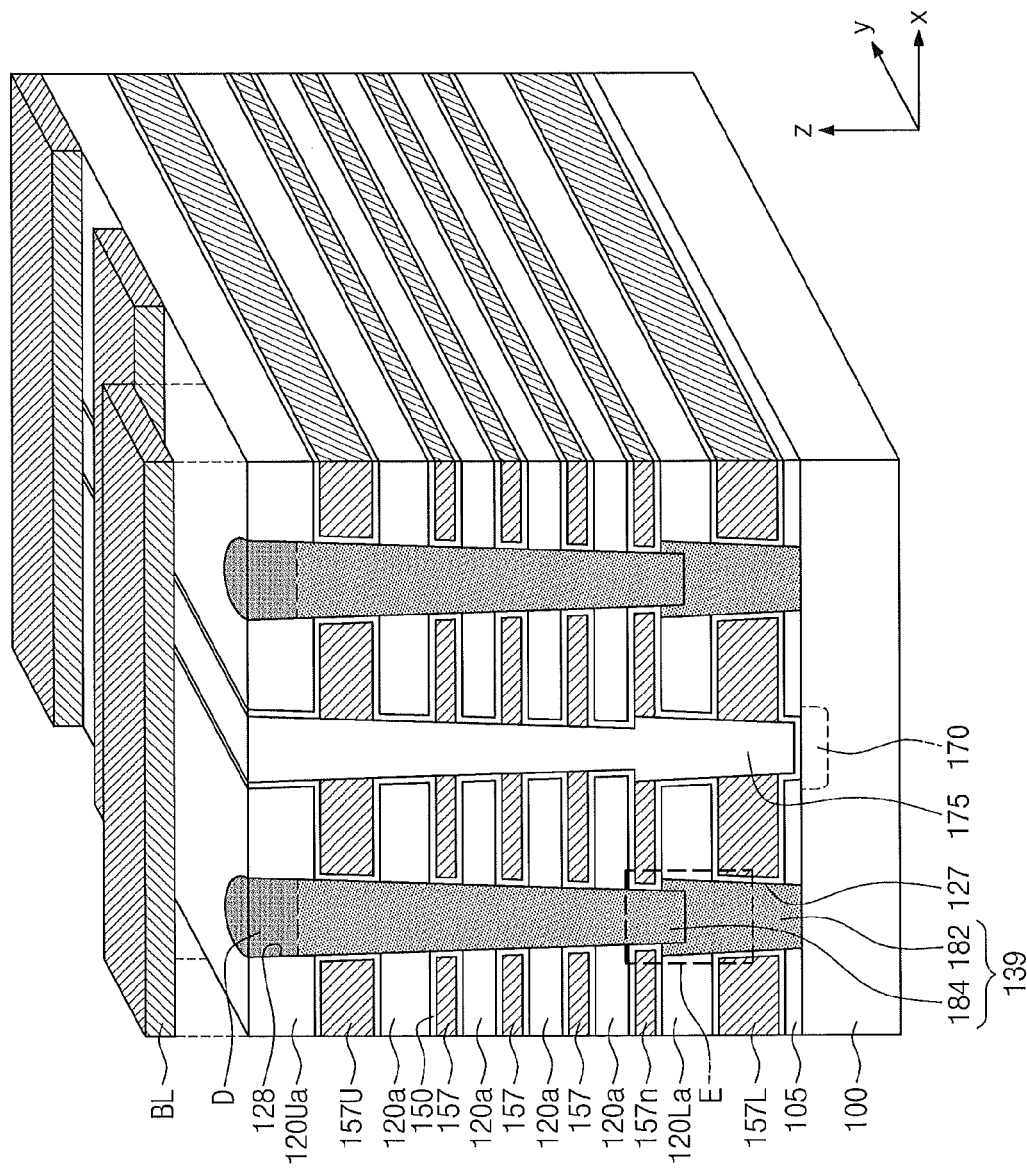
FIG. 32 is a perspective view of a semiconductor device according to some embodiments.
Figure 33:
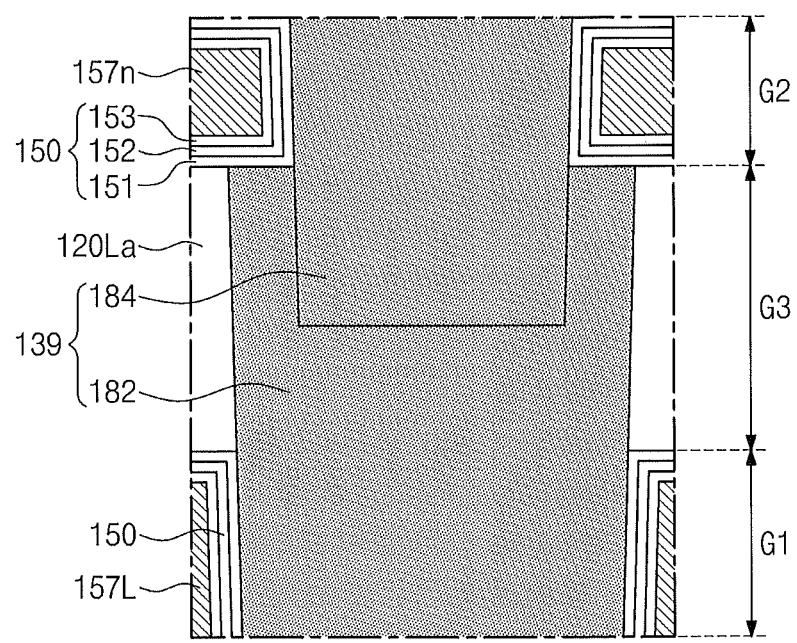
FIG. 33 is an enlarged view of the area 'E' in FIG. 32.

FIG. 32 is a perspective view of a semiconductor device according to some embodiments, and FIG. 33 is an enlarged view of the area 'E' in FIG. 32.

A structure and a forming method of the semiconductor devices in FIGS. 32 and 33 may be similar to those illustrated in FIGS. 21-31. Therefore, for descriptive simplicity, the description related to the overlapping technical characteristics may be omitted.

Referring to FIGS. 32 and 33, first material layers and second material layers including a material different from the first material layers, which are repeatedly and alternatingly stacked on the substrate 100, may be provided. The first material layers are gate patterns 157U, 157n, 157 and 157L, and the second material layers may be insulation patterns 120Ua, 120a and 120La. The gate patterns may include a lower selection gate pattern 157L, cell gate patterns 157n and 157 and an upper selection gate pattern 157U. The cell gate patterns may include a lowermost cell gate pattern 157n and a cell gate pattern 157 thereabove. The insulation patterns may include an uppermost insulation pattern 120Ua, a lowermost insulation pattern 120La and an insulation pattern 120a between the uppermost and lowermost insulation patterns 120Ua and 120La. A buffer insulation layer 105 may be provided between the substrate 100 and the lower selection gate pattern 157L.

A channel structure 139 extending vertically from the substrate 100 is provided. The channel structure 139 may include a first channel pattern G1 in a first through region 127 which penetrates the lower selection gate pattern 157L and the lowermost insulation pattern 120La. The channel structure 139 may include a second channel pattern G2 in a second through region 128 which penetrates the upper selection gate pattern and the cell gate patterns 157U, 157 and 157n and the uppermost insulation pattern and insulation patterns 120Ua and 120a. The first channel pattern G1 may include a first semiconductor layer 182 filling the first through region 127. The second channel pattern G2 may include a second semiconductor layer 184 filling the second through region 128.

A third channel pattern G3 may be provided between the first channel pattern G1 and the second channel pattern G2. The third channel pattern G3 may be a structure where the first semiconductor layer 182 and the second semiconductor layer 184 are overlapped. The third channel pattern G3 may be formed adjacent the lowermost insulation pattern 120La. A bottom surface of the second semiconductor layer 184 may be positioned between the lower selection gate pattern 157L and the lowermost cell gate pattern 157n. A data storage layer 150 may be provided between the gate patterns 157U, 157n, 157 and 157L and the channel structure 139.

Figure 34:
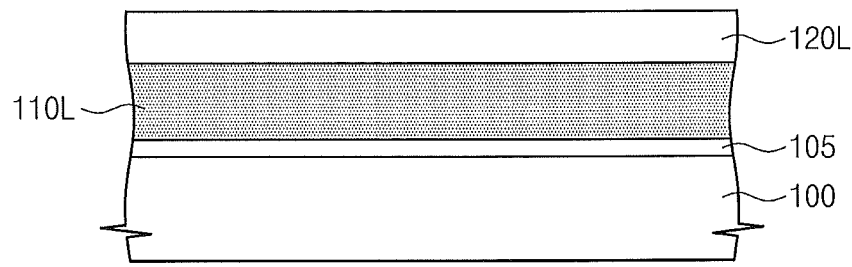
FIGS. 34 through 42 are cross-sectional views illustrating a method of fabricating a semiconductor device according to some embodiments.
Figure 35:
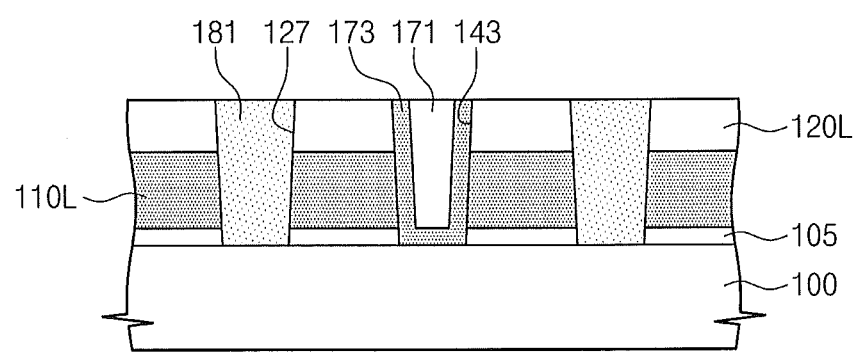
Figure 36:
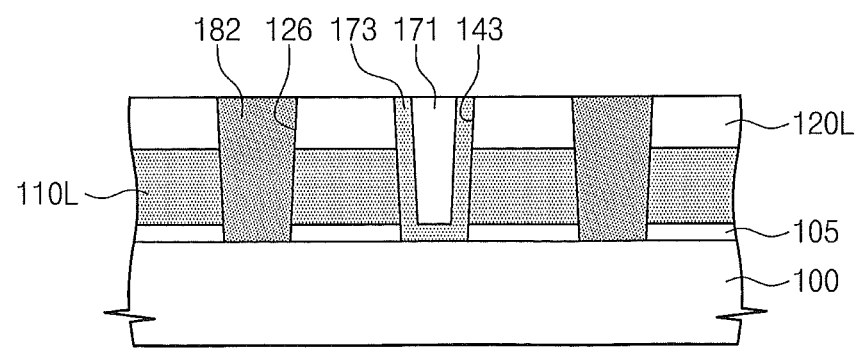

FIG. 34 illustrates a method of forming a semiconductor device according to some embodiments. Referring to FIG. 34, a substrate 100 is prepared. A lower selection gate sacrificial layer 110L and a lowermost insulation layer 120L may be sequentially stacked on the substrate 100. A buffer insulation layer 105 may be provided between the lower selection gate sacrificial layer 110L and the substrate 100. Referring to FIG. 35, a first through region 127 may be formed at the lower selection gate sacrificial layer 110L and the lowermost insulation layer 120L. The first through region 127 may have a round shape, an oval shape or a polygonal shape in plan view. A first preliminary semiconductor layer 181 filling the first through region 127 may be formed. A third trench 143, which penetrates the lower selection gate sacrificial layer 110L and the lowermost insulation layer 120L, may be formed between the first through regions 127. The third trench 143 may have a shape extending in the second direction. The third trench 143 may be formed together with the first through region 127. A trench sacrificial layer 173 may be formed on a bottom and a sidewall of the third trench 143. The trench sacrificial layer 173 may be formed with the same material as the lower selection gate sacrificial layer 110L. A trench insulation layer 171 filling the third trench 143 may be formed on the trench sacrificial layer 173. The trench insulation layer 171 may be formed with the same material as the lowermost insulation layer 120L. Referring to FIG. 36, a first semiconductor layer 182 may be formed by performing a first heat treatment process on the first preliminary semiconductor layer 181. The first heat treatment process may be a laser heat treatment process.

Figure 37:
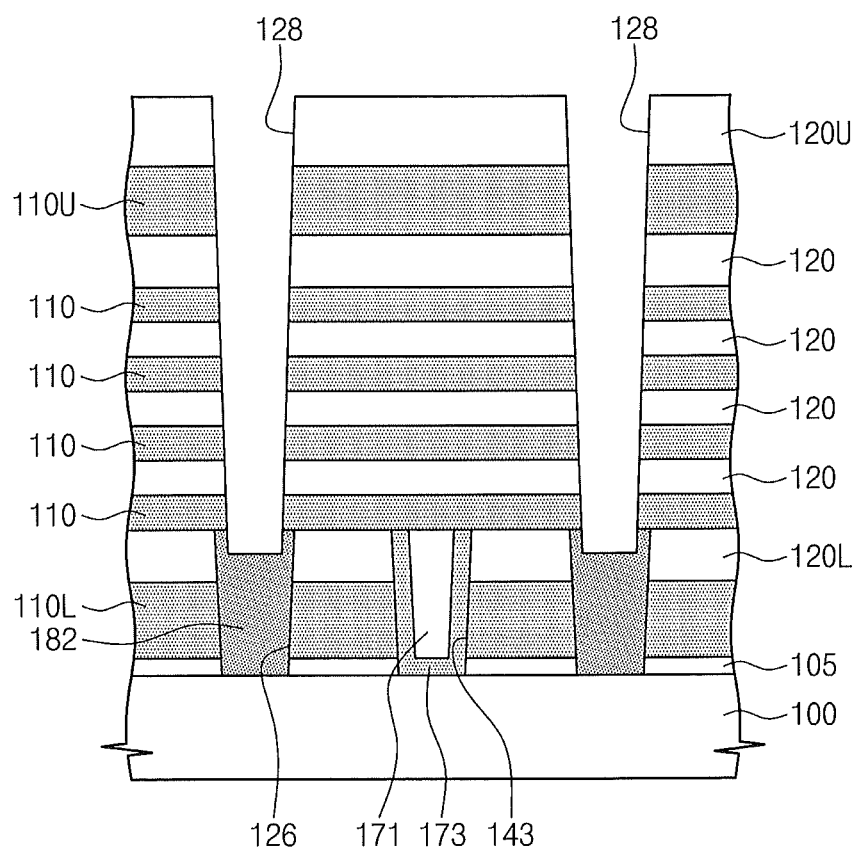

Referring to FIG. 37, sacrificial layers 110 and 110U and insulation layers 120 and 120U may be alternatingly and repeatedly stacked on the lowermost insulation layer 120L. The sacrificial layers may include the upper selection gate sacrificial layer 110U and the sacrificial layers 110 between the lower selection gate sacrificial layer 110L and the upper selection gate sacrificial layer 110U. The insulation layers may include the uppermost insulation layer 120U and the insulation layers 120 between the uppermost insulation layer 120U and the lowermost insulation layer 120L.

The sacrificial layers 110U and 110 and the insulation layers 120U and 120 are continuously patterned such that a second through region 128 exposing an upper portion of the first semiconductor layer 182 may be formed. During the patterning, the upper portion of the first semiconductor layer 182 may be etched. The second through region 128 may have a round shape, an oval shape or a polygonal shape in plan view. A bottom surface of the second through region 128 may be higher (e.g., farther from the substrate 100) than an upper surface of the lower selection gate sacrificial layer 110L. The bottom surface of the second through region 128 may be lower (e.g., closer to the substrate 100) than a bottom surface of the sacrificial layers 110.

Figure 38:
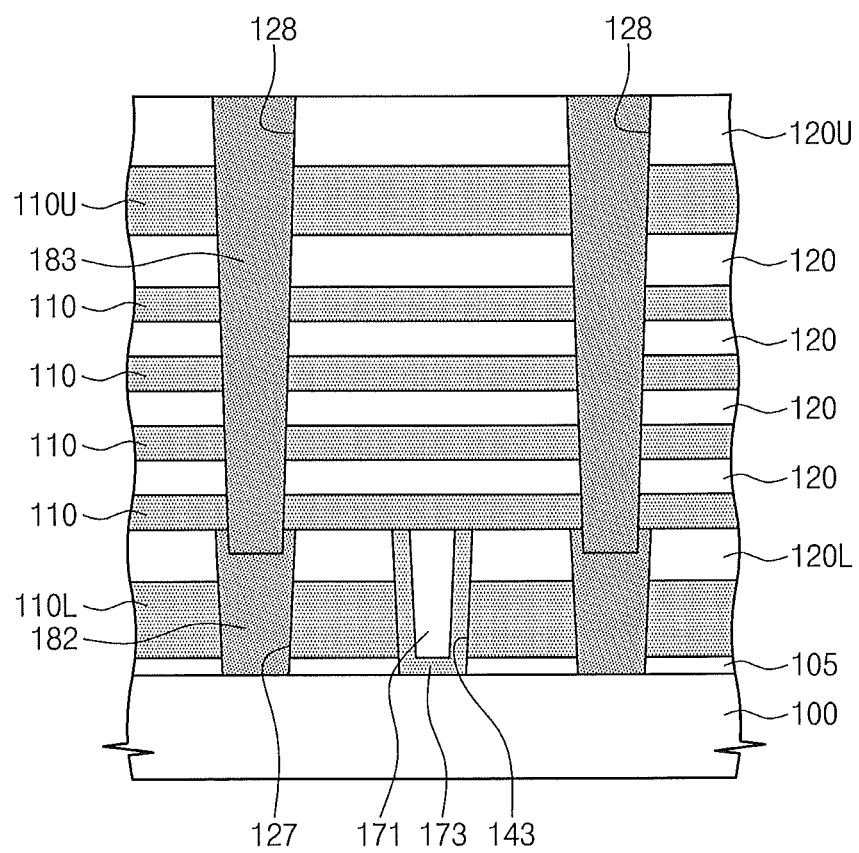

Referring to FIG. 38, a second preliminary semiconductor layer 183 filling the second through region 128 may be formed. The second preliminary semiconductor layer 183 may be formed with the same method as the first preliminary semiconductor layer 181.

Figure 39:
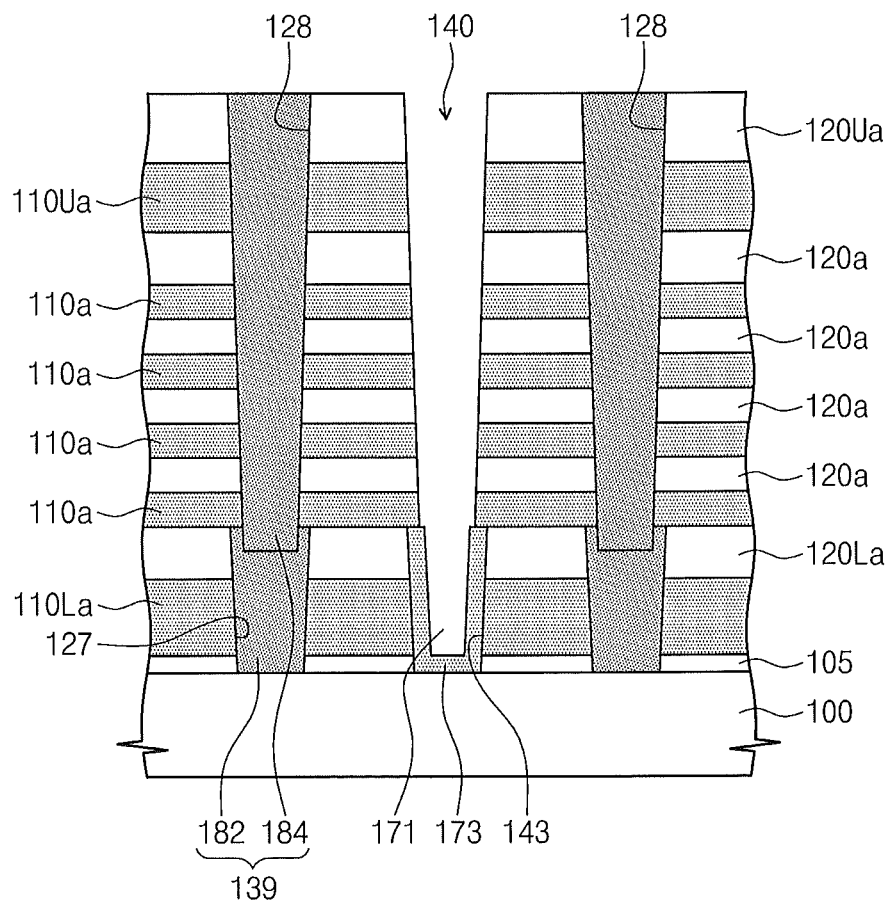

Referring to FIG. 39, a second semiconductor layer 184 may be formed by performing a second heat treatment process on the second preliminary semiconductor layer 183. The second heat treatment process may be a laser heat treatment or a solid phase crystallization process. The first and second semiconductor layers 182 and 184 may constitute a channel structure 139.

The insulation layers 120U and 120 and the sacrificial layers 110U and 110 are continuously patterned such that a first trench 140 may be formed. A forming process of the first trench 140 may include a removal process of the trench insulation layer 171. The removal process of the trench insulation layer 171 may be a wet etching process. The formation of the first trench 140 may be performed together with the formation of the second through region 128. The first trench 140 defines sacrificial patterns 110La, 110a and 110Ua and insulation patterns 120La, 120a and 120Ua which are alternatingly and repeatedly stacked. Forming the first trench 140 may be performed by an anisotropic etching process. The trench sacrificial layer 173 may be exposed at a bottom of the first trench 140.

Figure 40:
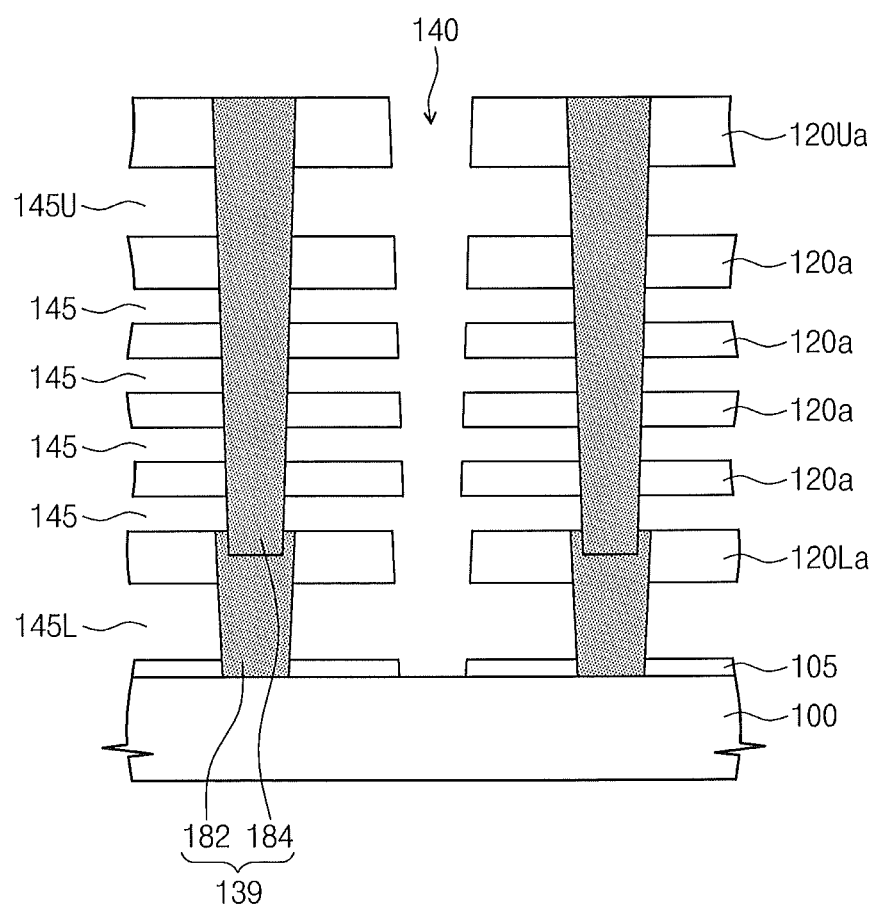

Referring to FIG. 40, the sacrificial patterns 110La, 110a and 110Ua and the trench sacrificial layer 173, which are exposed in the first trench 140, are removed by performing a selective etching process such that recess regions 145L, 145, 145U may be formed. The selective etching process may be an isotropic etching process. The selective etching process may be performed by a wet etching and/or an isotropic dry etching, or the like. Etch rates of the sacrificial patterns 110La, 110a and 110Ua and the trench sacrificial layer 173 by the selective etching process may be larger/faster than etch rates of the insulation patterns 120La, 120a and 120Ua, the buffer insulation layer 105 and the channel structure 139. Therefore, after the performing of the selective etching process, the insulation patterns 120La, 120a and 120Ua, the buffer insulation layer 105 and the channel structure 139 may remain.

Figure 41:
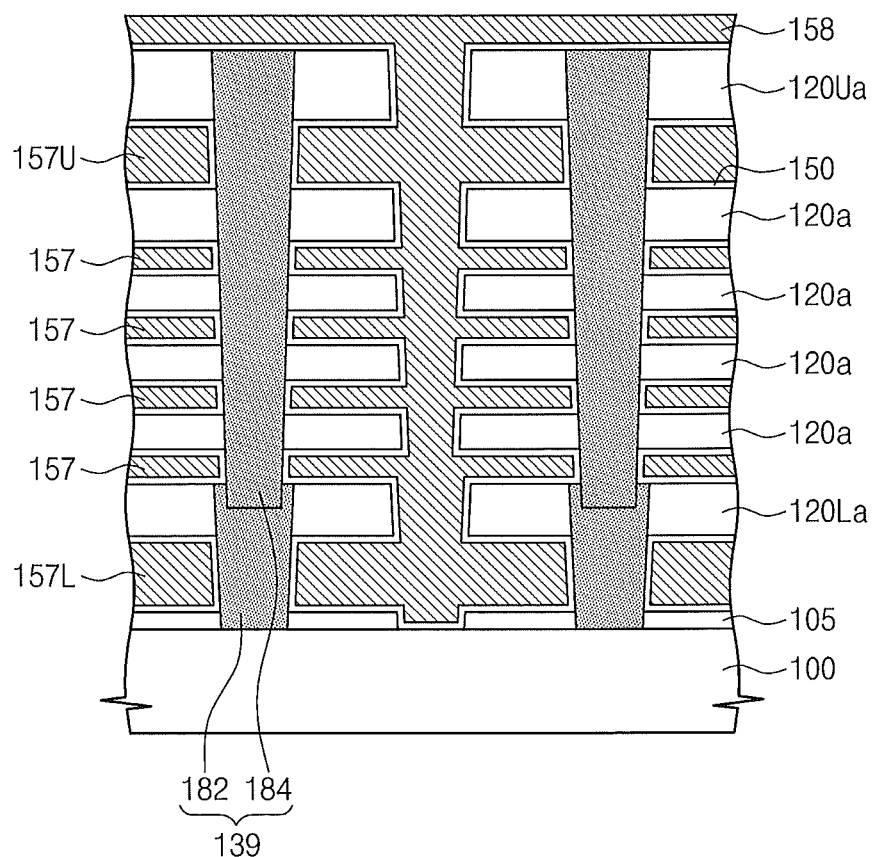

Referring to FIGS. 33 and 41, after the recess regions 145L, 145, 145U are formed, a data storage layer 150 may be formed on the substrate 100. Forming the data storage layer 150 may include forming a tunnel insulation layer 151, a charge storage layer 152 and a blocking layer 153 in sequence. After the data storage layer 150 is formed, the gate conductive layer 158 may be disposed on the substrate 100. The gate conductive layer 158 may be electrically isolated from the channel structure 139 and the substrate 100 by the data storage layer 150.

Figure 42:
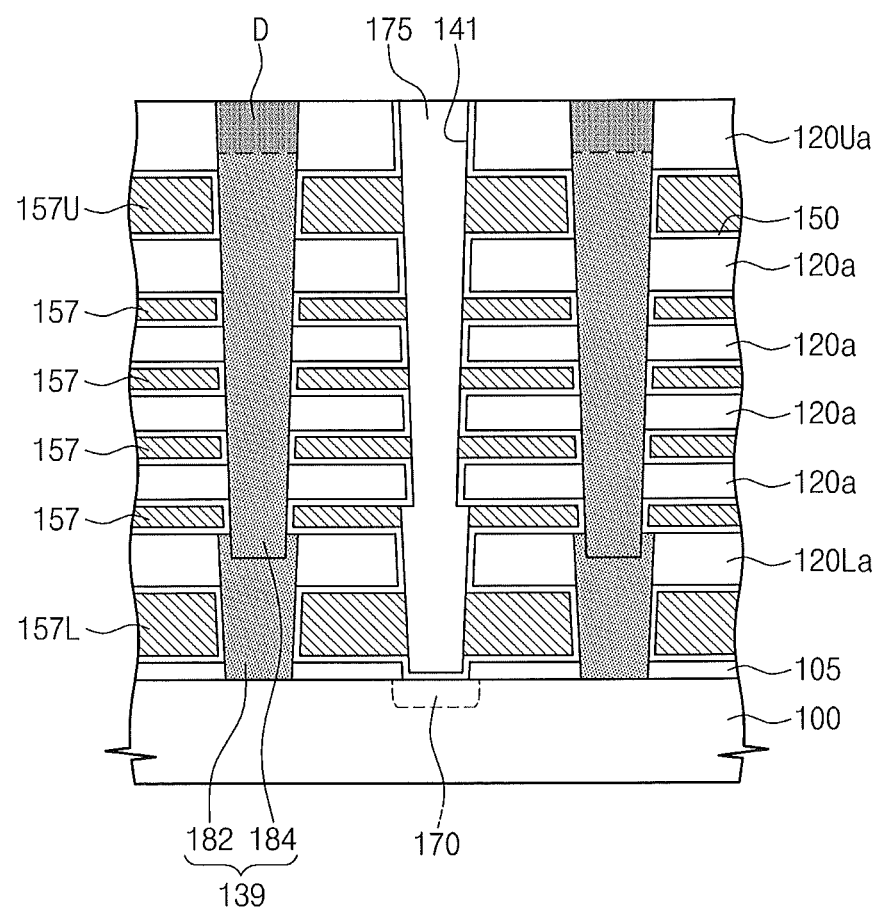

Referring to FIG. 42, portions of the gate conductive layer 158 positioned outside of the recess regions 145L, 145, 145U are removed to form gate electrodes 157L, 157n, 157 and 157U in the recess regions 145L, 145, 145U. The portions of the gate conductive layer 158 outside of the recess regions 145L, 145, 145U may be removed by forming a second trench 141. A first impurity region 170 may be formed in the substrate 100 under a bottom surface of the second trench 141. A drain region D may be formed at a top portion of the channel structure 139. A device isolation pattern 175 may be formed in the second trench 141.

Referring again to FIG. 32, bit line BL, which is electrically connected to the drain region D, may be formed. The bit line BL may extend in the first direction. The bit line BL may be formed on the uppermost insulation pattern 120Ua and the device isolation pattern 175.

Figure 43:
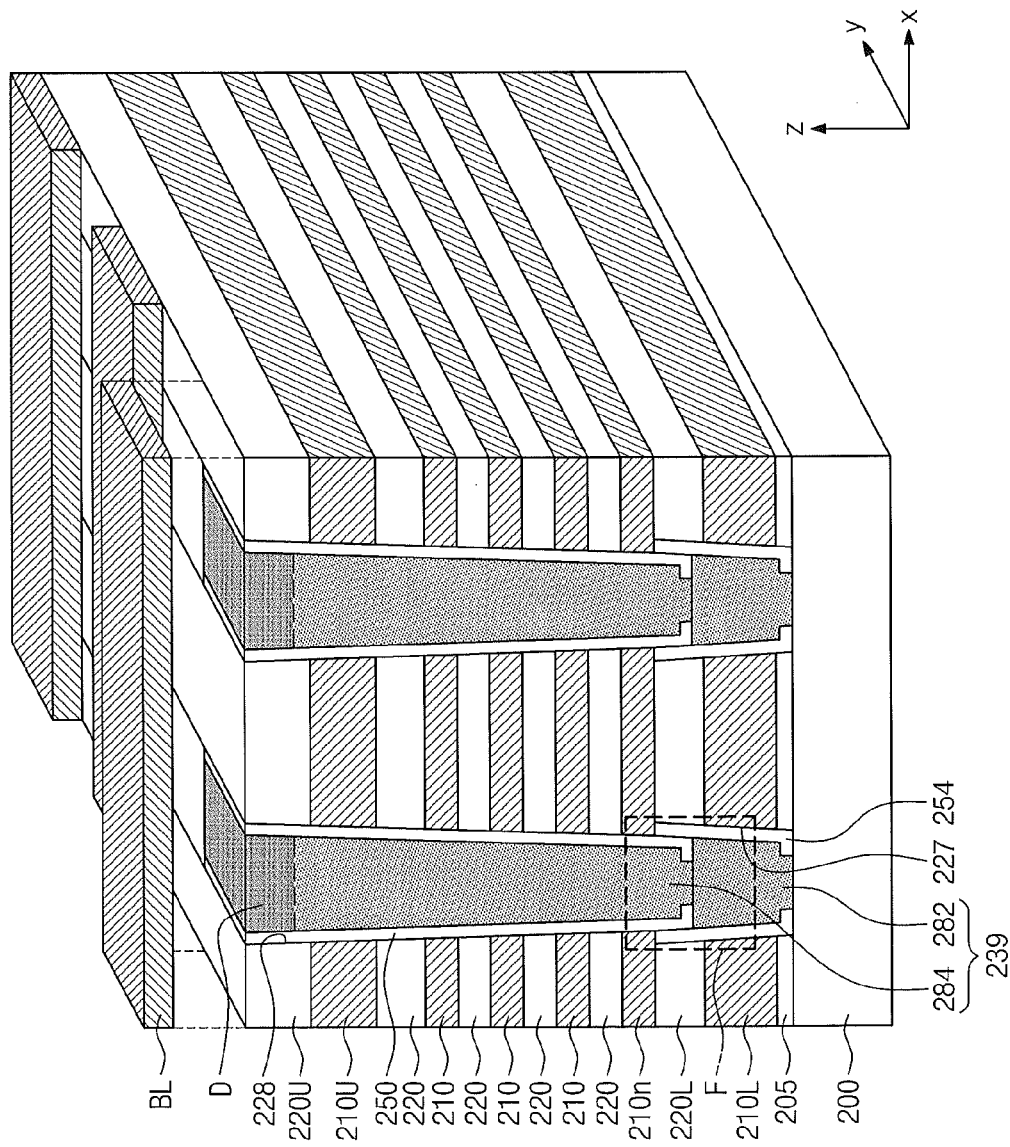
FIG. 43 is a perspective view of a semiconductor device according to some embodiments.
Figure 44:
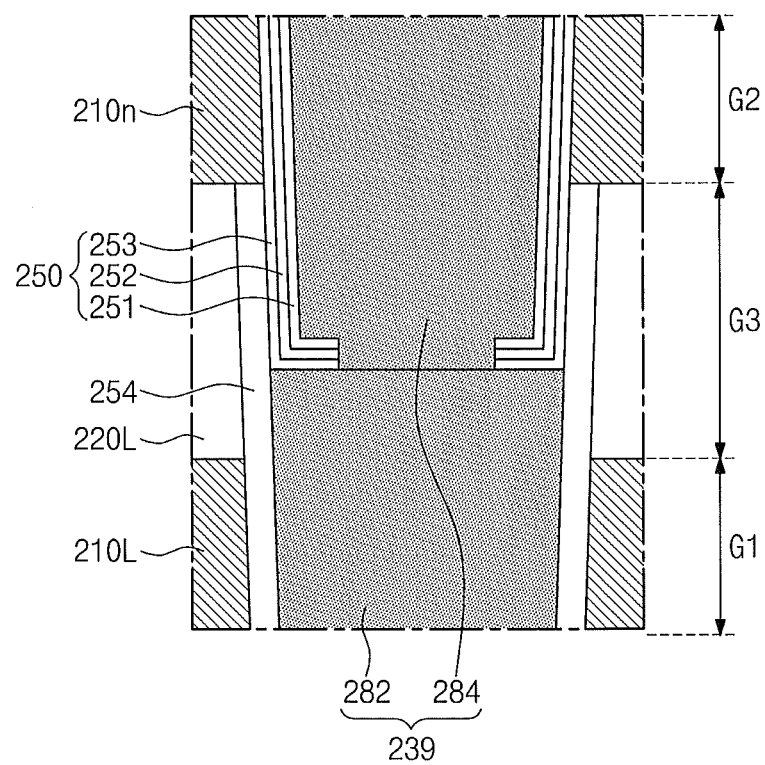
FIG. 44 is an enlarged view of the area 'F' in FIG. 43.

FIG. 43 is a perspective view of a semiconductor device according to some embodiments, and FIG. 44 is an enlarged view of the area 'F' in FIG. 43.

A portion of a structure and a forming method of FIGS. 43 and 44 are similar to those of FIGS. 13-20. Therefore, for the conciseness of the description, the description related to the overlapping technical characteristics may be omitted.

Referring to FIGS. 43 and 44, a substrate 200 is provided. First material layers and second material layers including a material different from the first material layers, which are repeatedly and alternatingly stacked on the substrate 200, may be provided. The first material layers are gate layers 210U, 210n, 210 and 210L, and the second material layers may be insulation layers 220U, 220 and 220L. The gate layers may include a lower selection gate layer 210L, cell gate layers 210n and 210 and an upper selection gate layer 210U. The cell gate layers may include a lowermost cell gate layer 210n and a cell gate layer 210 thereabove. The uppermost cell gate layer 210n may be a dummy gate layer. A buffer insulation layer 205 may be provided between the substrate 200 and the lower selection gate layer 210L.

A vertical channel structure 239 extending vertically from the substrate 200 may be provided. The vertical channel structure 239 may include a first channel pattern G1 in a first through region 227 which penetrates the lower selection gate layer 210L and the lowermost insulation layer 220L. The first channel pattern G1 may include a first semiconductor layer 282 filling the first through region 227. A lower tunnel insulation layer 254 may be provided between an inner sidewall of the first through region 227 and the first semiconductor layer 282. The lower tunnel insulation layer 254 may be an oxide layer.

The vertical channel structure 239 may include a second channel pattern G2 in a second through region 228 which penetrates the upper selection gate layer and the cell gate layers 210U, 210 and 210n and the uppermost insulation layer and the insulation layer 220U and 220. The second channel pattern G2 may include a second semiconductor layer 284 filling the second through region 228. A data storage layer 250 may be provided between inner sidewalls of the second through region 228 and the second semiconductor layer 284. The data storage layer 250 may include a blocking layer 253, a charge storage layer 252 and a tunnel insulation layer 251 which are stacked in sequence.

A third channel pattern G3 may be provided between the first channel pattern G1 and the second channel pattern G2. The third channel pattern G3 may be a region in which the first semiconductor layer 282 and the second semiconductor layer 284 overlap. The third channel pattern G3 may be disposed adjacent the lowermost insulation pattern 220L. A bottom surface of the second semiconductor layer 284 may be positioned between the lower selection gate layer 210L and the lowermost cell gate layer 210n. Although it was illustrated for convenience only that the data storage layer 250 and the lower tunnel insulation layer 254 are aligned, alternatively, the first semiconductor layer 282 may be provided between the data storage layer 250 and the lower tunnel insulation layer 254.

Figure 45:
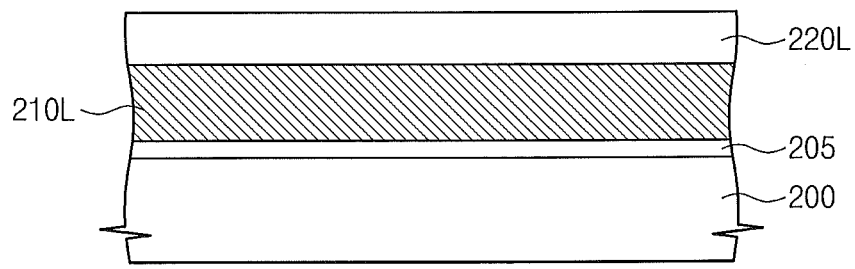
FIGS. 45 through 49 are cross-sectional views illustrating a method of fabricating a semiconductor device according to some embodiments.

FIG. 45 illustrates a method of fabricating a semiconductor device according to some embodiments. Referring to FIG. 45, a lower selection gate layer 210L and a lowermost insulation layer 220L may be sequentially stacked on a substrate 200. A buffer insulation layer 205 may be provided between the lower selection gate layer 210L and the substrate 200.

Figure 46:
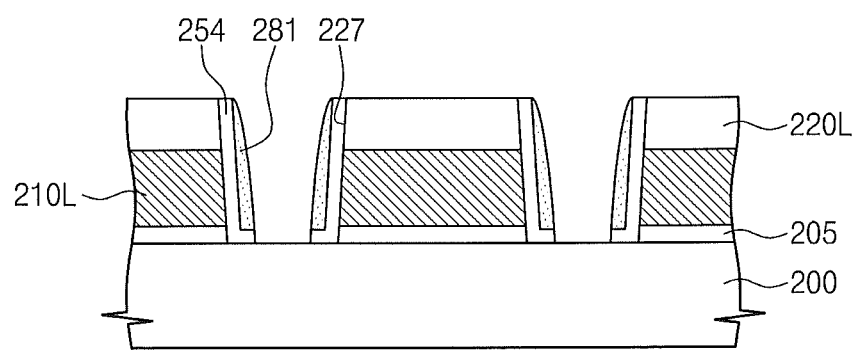

Referring to FIG. 46, a first through region 227 may be formed by continuously patterning the lower selection gate layer 210L and the lowermost insulation layer 220L. A lower tunnel insulation layer 254 may be formed on a sidewall of the first through region 227. An insulation layer (not illustrated) is formed in the first through region 227, and then a first spacer 281 is formed on a sidewall of the insulation layer. Then, the lower tunnel insulation layer 254 may be formed by etching the insulation layer using the first spacer 281 as an etch mask. The first spacer 281 may be formed of amorphous or polycrystalline silicon.

Figure 47:
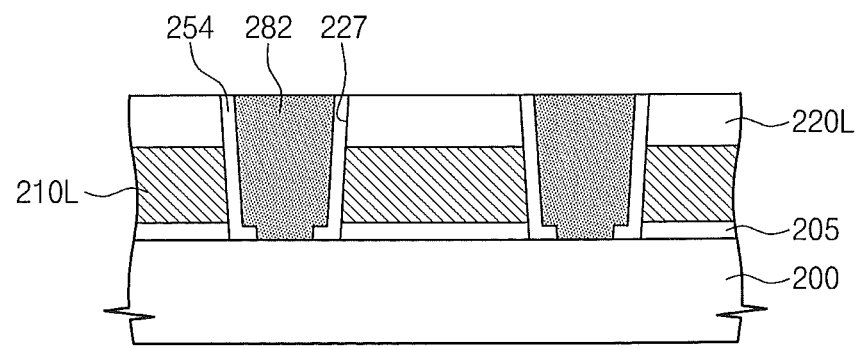

Referring to FIG. 47, a first semiconductor layer 282 filling the first through region 227 may be formed. The first semiconductor layer 282 may be formed by forming a first preliminary semiconductor layer (not illustrated), and then performing a first heat treatment process on the first preliminary semiconductor layer and the first spacer 281. The first heat treatment process may be a laser heat treatment process.

Figure 48:
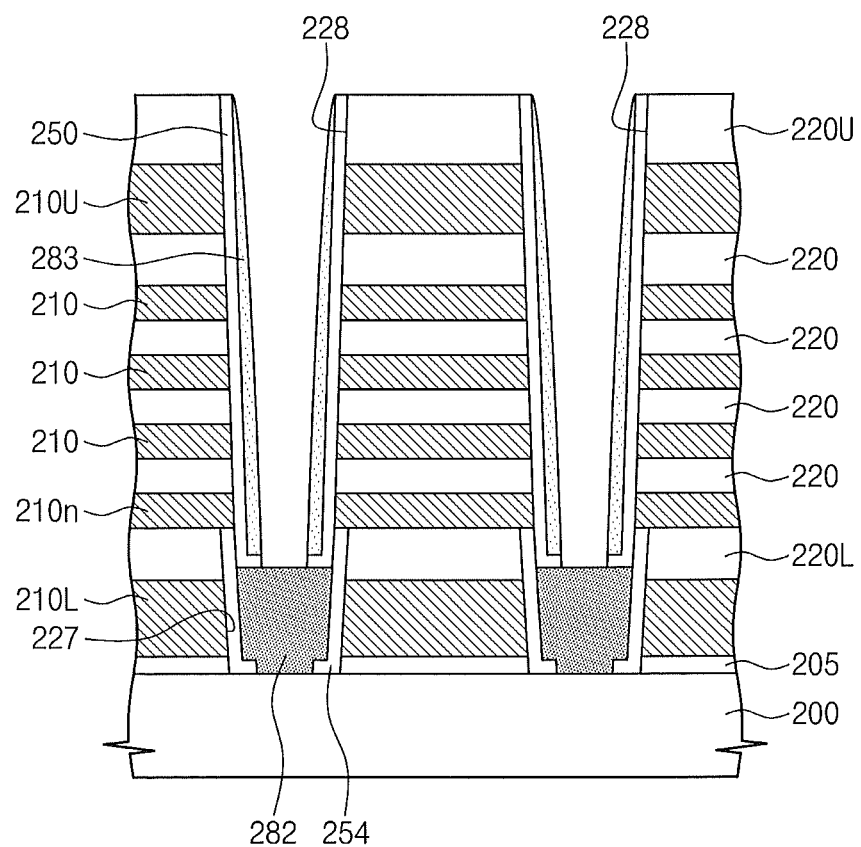

Referring to FIG. 48, gate layers 210n, 210 and 210U and insulation layers 220 and 220U may be formed repeatedly and alternatingly on the lowermost insulation layer 220L. A second through region 228, which exposes an upper portion of the first semiconductor layer 282, may be formed by patterning the gate layers 210n, 210 and 210U and the insulation layers 220 and 220U. During the forming of the second through region 228, the upper portion of the first semiconductor layer 282 may be etched. A data storage layer 250 may be formed on sidewalls of the second through region 228. The data storage layer 250 may be formed by forming a preliminary data storage layer in the second through region 228, and then etching using a second spacer 283 as an etch mask. The second spacer 283 may be formed of amorphous or polycrystalline silicon.

Figure 49:
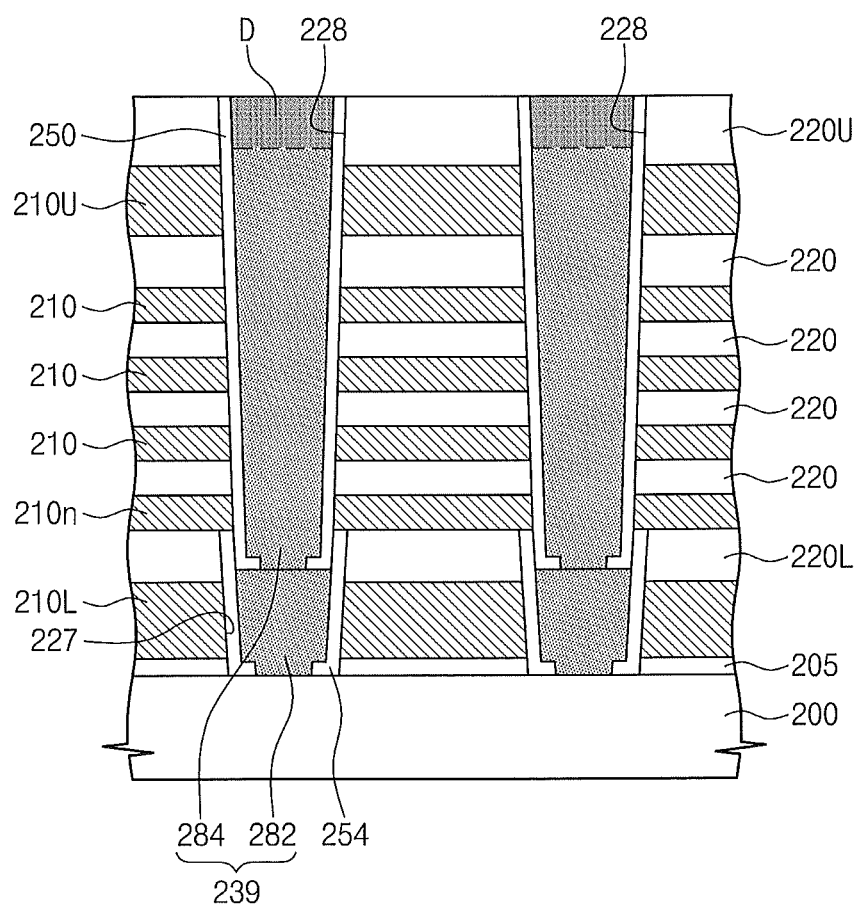

Referring to FIG. 49, a second semiconductor layer 284 filling the second through region 228 may be formed. The second semiconductor layer 284 may be formed by forming a second preliminary semiconductor layer (not illustrated) filling the second through region 228, and then performing a second heat treatment on the second preliminary semiconductor layer and the second spacer 283. The first semiconductor layer 282 and the second semiconductor layer 284 may constitute a vertical channel structure 239. A drain region D may be formed at a top portion of the vertical channel structure 239.

Figure 50:
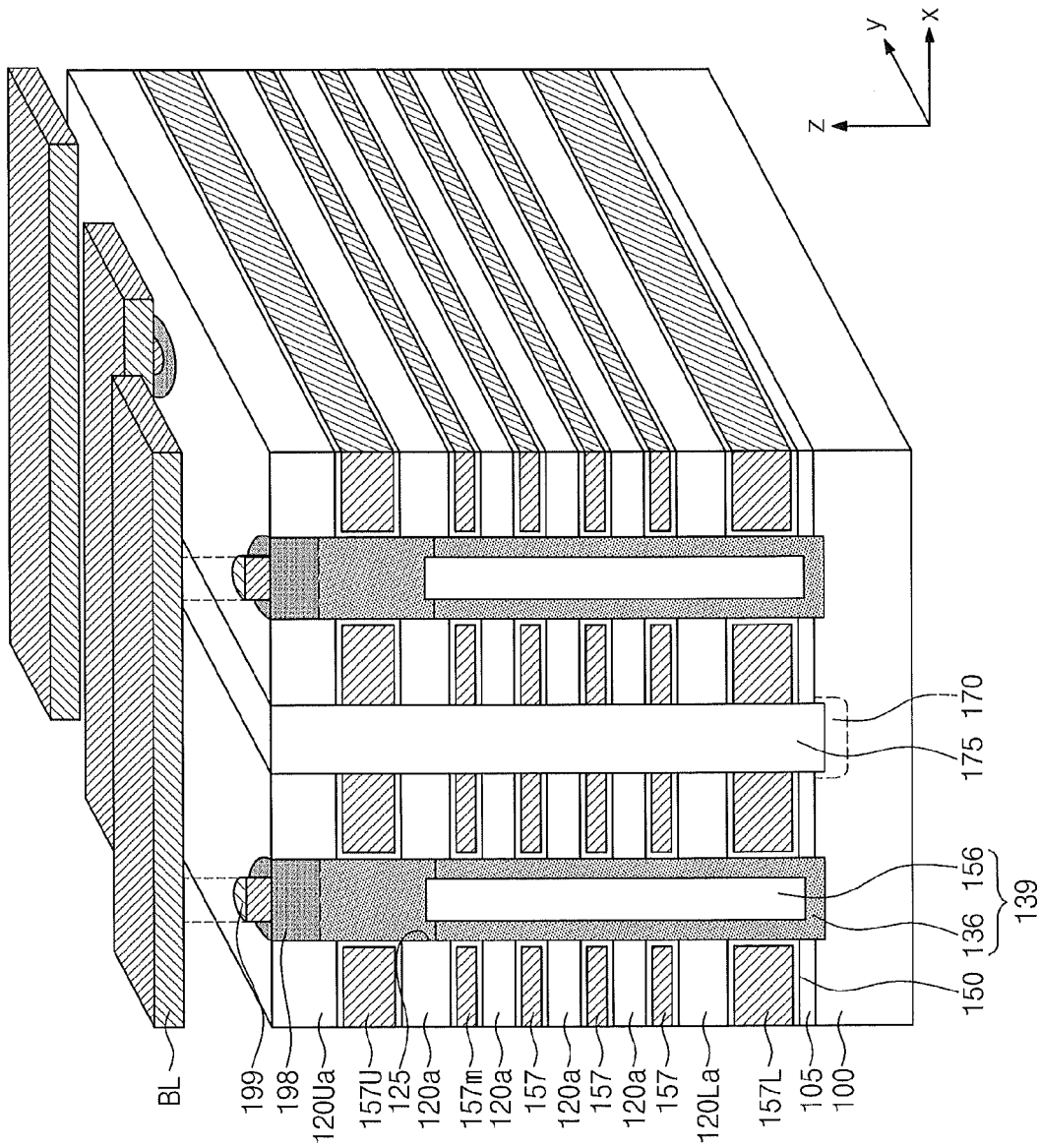
FIG. 50 is a perspective view of a semiconductor device according to some embodiments.
Figure 51:
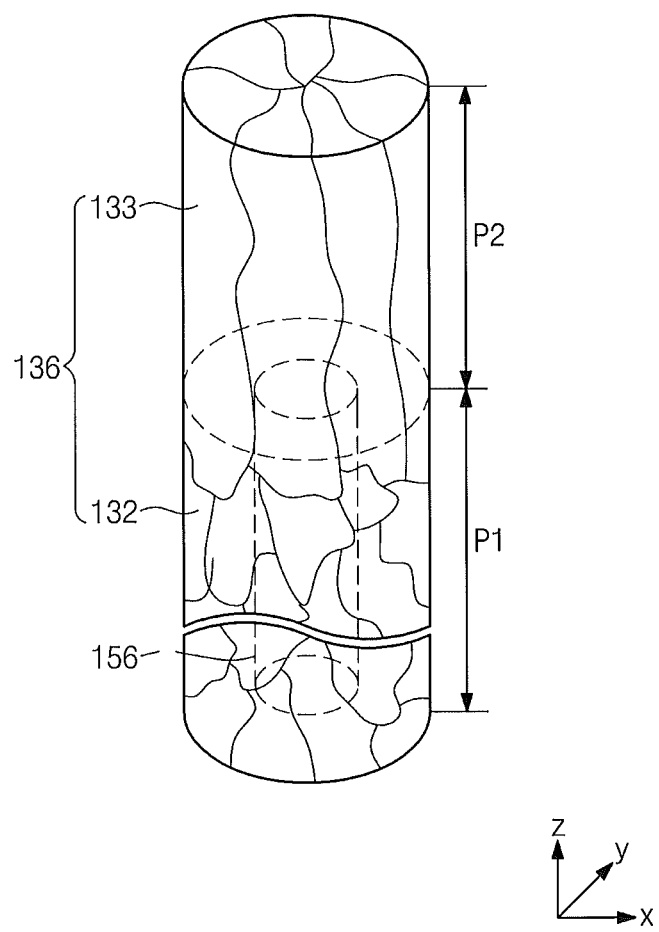
FIG. 51 is an enlarged view of a channel structure in FIG. 50.

FIG. 50 is a perspective view of a semiconductor device according to some embodiments, and FIG. 51 is an enlarged view of a channel structure in FIG. 50.

Referring to FIGS. 50 and 51, a stack structure is provided on a substrate 100. The stack structure may include gate patterns and insulation patterns which are repeatedly and alternatingly stacked on the substrate 100. The gate patterns may include a lower selection gate pattern 157L, cell gate patterns 157m and 157, and an upper selection gate pattern 157U. The cell gate patterns may include an uppermost cell gate pattern 157m and the cell gate patterns 157 therebelow. A buffer insulation layer 105 may be provided between the substrate 100 and the lower selection gate pattern 157L. The insulation patterns may include an uppermost insulation pattern 120Ua, a lowermost insulation pattern 120La, and intermediate insulation patterns 120a between the uppermost insulation pattern 120Ua and the lowermost insulation pattern 120La.

Channel structures 139, which extend from the substrate 100 to penetrate the gate patterns 157U, 157m, 157 and 157L and the insulation patterns 120Ua, 120a and 120La, may be provided. The channel structures 139 may be provided in first through regions 125 penetrating the gate patterns 157U, 157m, 157 and 157L and the insulation patterns 120Ua, 120a and 120La.

The channel structures 139 may include a first region P1 including a first semiconductor layer 132, and a second region P2 including a second semiconductor layer 133. The first region P1 may be an active region of the cell gate patterns 157m and 157 and the lower selection gate pattern 157L, and the second region P2 may be an active region of the upper selection gate pattern 157U. The second region P2 may be provided on the first region P1. A boundary between the first region P1 and the second region P2 may be provided between the upper selection gate pattern 157U and the uppermost cell gate pattern 157m. The second region P2 may be adjacent the upper selection gate pattern 157U, and the first region P1 may be adjacent the cell gate patterns 157m and 157. That is, when the upper selection gate pattern 157U is a gate electrode of a string selection transistor, a portion of the second region P2 may be a channel region of the string selection transistor. When the cell gate patterns 157m and 157 are gate electrodes of memory cell transistors, a portion of the first region P1 may be a channel region of the memory cell transistors.

A grain size of the second region P2 may be larger than that of the first region P1. For example, grains of the second region P2 may have longer lengths in a direction (z direction) perpendicular to a surface of the substrate 100 (e.g., a top surface of the substrate 100) than widths in a direction (x direction or y direction) parallel to the surface of the substrate 100. For example, aspect ratios of the grains in the second region P2 may be about 2:100. For example, the lengths of the grains in the second region P2 in the z direction may be greater than a thickness of the upper selection gate pattern 157U. That is, the string selection transistor may have a channel region with a relatively larger grain size than the memory cell transistors. Therefore, the area of grain boundaries in the channel region of the string selection transistor may be reduced. Accordingly, electrical characteristics of a semiconductor device, such as a leakage current generated by grain boundaries, may be improved.

The channel structures 139 may further include a buried pattern 156 surrounded by the first region P1. For example, lower portions of the channel structures 139 may have a macaroni shape or a shell shape in which the buried pattern 156 is filled in the semiconductor pattern 136 formed along lower surfaces and inner walls of the first through regions 125. The buried pattern 156 may be spaced apart from the substrate 100 by means of the semiconductor pattern 136. Alternatively, upper portions of the channel structures 139 may not include the buried pattern 156. For example, the upper portions of the channel structures 139 may be regions in which the semiconductor patterns 136 are completely filled in the first through regions 125. Therefore, the string selection transistor may secure a relatively wider channel region than the memory cell transistors.

An upper surface of the buried pattern 156 may be provided between the upper selection gate pattern 157U and the uppermost cell gate pattern 157m. For example, the buried pattern 156 may include at least one of a silicon oxide layer or a silicon nitride layer. The semiconductor pattern 136 may include at least one of silicon having a first conductive type or an intrinsic state, or silicon-germanium.

The channel structures 139 arranged in the x direction constitute one row, and the channel structures 139 arranged in the y direction constitute one column. A plurality of rows and a plurality of columns may be arranged on the substrate 100. A device isolation pattern 175 may be arranged between a pair of adjacent ones of the rows. That is, the device isolation pattern 175 may extend in the y direction. The device isolation pattern 175 may include an insulating material. For example, the device isolation pattern 175 may be formed of a high-density plasma oxide layer, a spin on glass (SOG) layer and/or a chemical vapor deposition (CVD) oxide layer, etc. A first impurity region 170 may be formed in the substrate 100 under the device isolation pattern 175. For example, the first impurity region 170 may have a line shape extending in the y direction. The first impurity region 170 may be a region doped with a second conductive type impurity. The second conductive type may be a conductive type different from the first conductive type. A data storage layer 150 may be provided between the gate patterns 157U, 157m, 157 and 157L and the channel structures 139.

A second impurity region 198 may be provided in an upper portion of the semiconductor pattern 136 adjacent the uppermost insulation pattern 120Ua. The second impurity region 198 may be an impurity region having the same conductive type as the first impurity region 170. Bit lines BL may extend in a direction (e.g., x direction) crossing the gate patterns 157U, 157m, 157 and 157L and may be electrically connected to the second impurity region 198. The bit lines BL may be connected to the channel structures 139 through contact plugs 199. The bit lines BL may include at least one of metal, conductive metal nitride, or a doped semiconductor material.

According to some embodiments, the selection transistor may have a channel region with a relatively larger grain size than the memory cell transistors. Therefore, increases in leakage current due to the grain boundaries may be reduced/mitigated. Also, since the selection transistor may secure a relatively wider channel region than the memory cell transistors, channel resistance may be reduced.

FIGS. 52 through 62 are cross-sectional views and upper surface views illustrating a method of fabricating a semiconductor device according to some embodiments.

Figure 52:
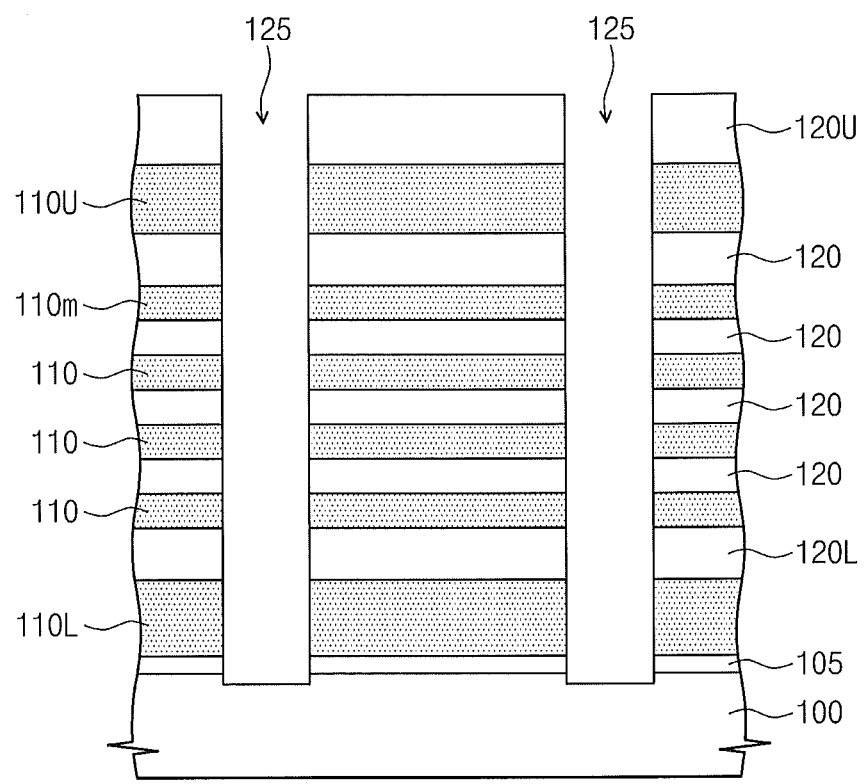
FIGS. 52 through 62 are cross-sectional views and upper surface views illustrating a method of fabricating a semiconductor device according to some embodiments.

Referring to FIG. 52, a substrate 100 is prepared. The substrate 100 may be a semiconductor substrate. For example, the substrate 100 may be a silicon substrate, a germanium substrate, a silicon-germanium substrate, or a compound semiconductor substrate. For example, the substrate 100 may be doped with a first conductive type impurity.

A stack structure, in which first material layers and second material layers are repeatedly and alternatingly stacked, may be provided on the substrate 100. The second material layers may include a material different from the first material layers. For example, the first material layers may be sacrificial layers 110L, 110m, 110 and 110U. The second material layers may be insulation layers 120L, 120 and 120U. The sacrificial layers 110L, 110m, 110 and 110U may be formed of a material having an etch selectivity with respect to the insulation layers 120L, 120 and 120U. Before forming the sacrificial layers 110L, 110m, 110 and 110U and the insulation layers 120L, 120 and 120U, a buffer insulation layer 105 may be formed on the substrate 100.

The buffer insulation layer 105, the insulation layers 120L, 120 and 120U and the sacrificial layers 110L, 110m, 110 and 110U are continuously patterned such that first through regions 125 exposing the substrate 100 may be formed. The first through regions 125 may be formed by using an anisotropic etching process. During formation of the first through regions 125, an upper portion of the substrate 100 may be etched as a result of over-etching.

Figure 53:
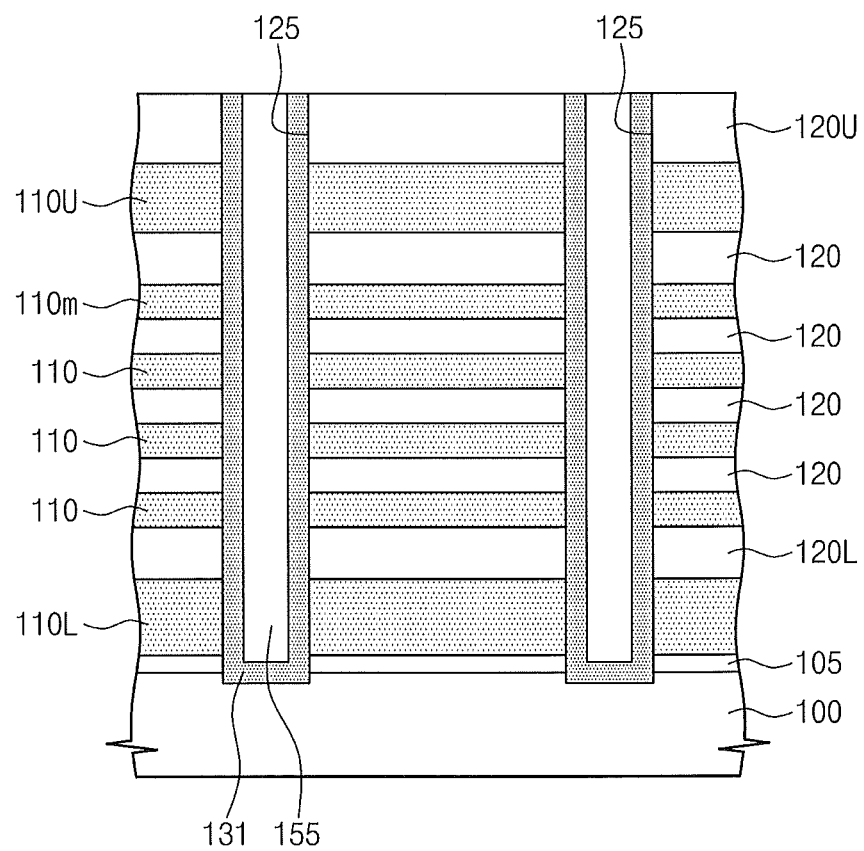

Referring to FIG. 53, preliminary channel structures may be formed in the first through regions 125. Forming the preliminary channel structures may include forming first preliminary semiconductor layers 131 along sidewalls and lower portions of the first through regions 125. The first preliminary semiconductor layer 131 may be a silicon layer. The first preliminary semiconductor layers 131 may not completely fill the first through regions 125. A buried layer 155 filling the first through region 125 may be formed on the first preliminary semiconductor layer 131. For example, the buried layer 155 may include at least one of a silicon oxide layer, a silicon nitride layer, or a silicon oxynitride layer. The first preliminary semiconductor layer 131 and the buried layer 155 may be formed by chemical vapor deposition (CVD) or atomic layer deposition (ALD). According to some embodiments, forming the first preliminary semiconductor layer 131 may include recrystallization by means of a first heat treatment process. When the semiconductor layer is substantially amorphous after deposition, the semiconductor layer may become a polycrystalline silicon layer having relatively small grains by means of the recrystallization. The first heat treatment process may be a solid phase crystallization process. The first preliminary semiconductor layer 131 and the buried layer 155 are deposited, and then the uppermost insulation layer 120U may be exposed by a planarization process. Alternatively, the planarization process may not be performed.

Figure 54:
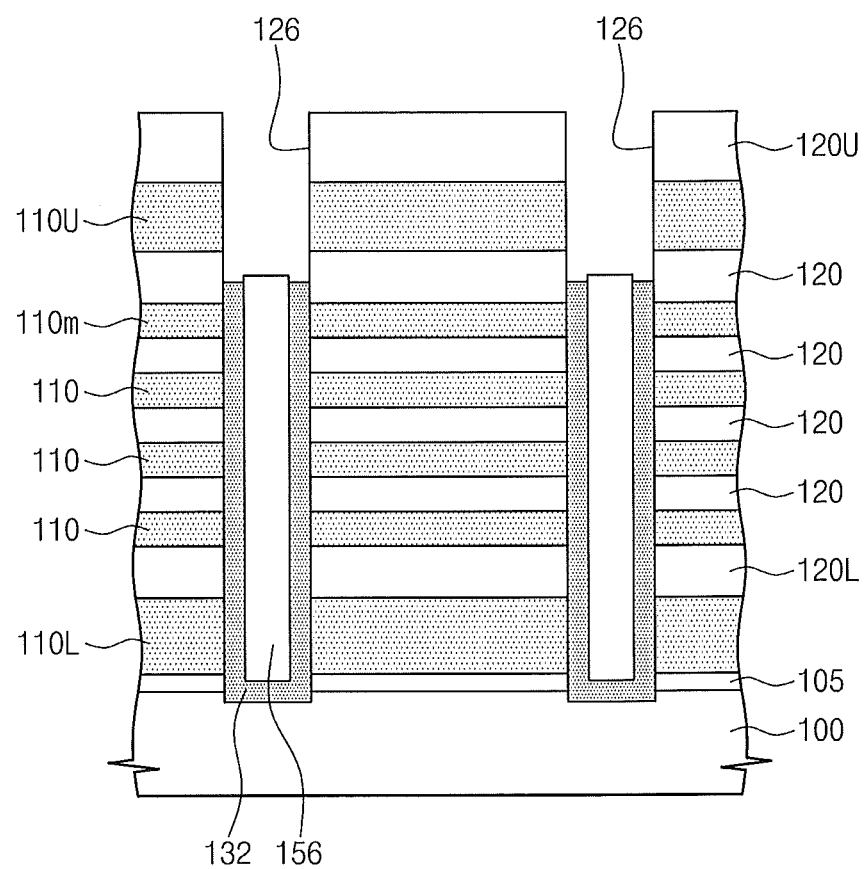
Figure 55:
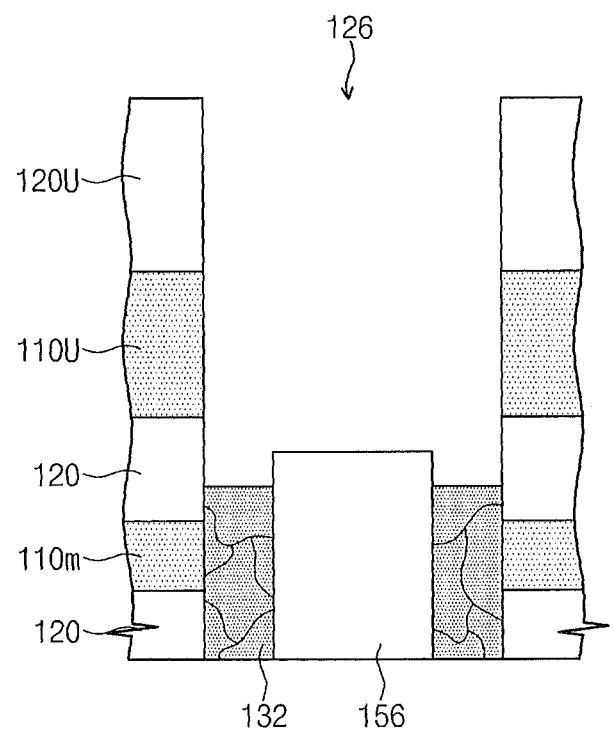
Figure 56:
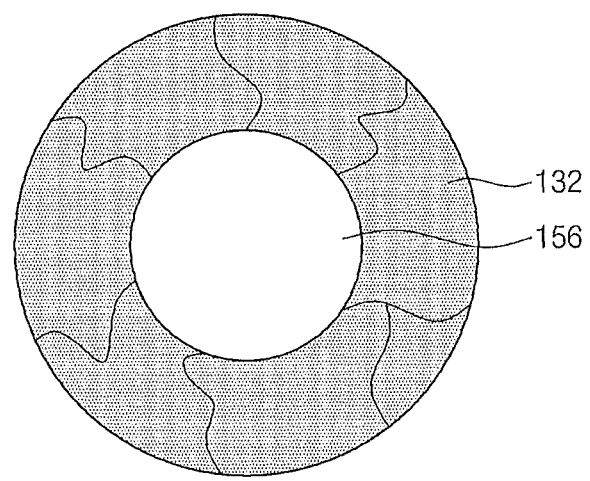

Referring to FIGS. 54 through 56, an upper portion of the preliminary channel structure may be etched. For example, a first semiconductor layer 132 may be formed by etching the upper portion of the first preliminary semiconductor layer 131. FIG. 55 is an enlarged view of the first semiconductor layer 132 in FIG. 54, and FIG. 56 is an upper surface view of the first semiconductor layer 132. A top surface of the first semiconductor layer 132 may be exposed by second through regions 126. The etching process may be performed to a depth of the second through region 126 that is between a top surface of the uppermost cell gate sacrificial layer 110m and a bottom surface of the upper selection gate sacrificial layer 110U. That is, bottom surfaces of the second through regions 126 may be disposed between the top surface of the uppermost cell gate sacrificial layer 110m and the bottom surface of the upper selection gate sacrificial layer 110U.

A buried pattern 156 may be formed by etching an upper portion of the buried layer 155. For example, a top surface of the buried pattern 156 may be disposed between the top surface of the uppermost cell gate sacrificial layer 110m and the bottom surface of the upper selection gate sacrificial layer 110U. A height of the top surface of the buried pattern 156 may be the same as or higher (e.g., closer to the bottom surface of the upper selection gate sacrificial layer 110U) than a height of the top surface of the first semiconductor layer 132. The bottom surfaces of the second through regions 126 may be defined by the top surface of the buried pattern 156 and the top surface of the first semiconductor layer 132. Therefore, in comparison with a device that does not have the buried pattern 156, the top surface of the first semiconductor layer 132 may expose a relatively small number of grains by means of the second through regions 126.

The second through regions 126 may be formed by various etching processes such as dry etching, wet etching, or combinations thereof. According to some embodiments, etching processes for forming the first semiconductor layer 132 and the buried pattern 156 may be performed at the same time. As such, the etching process may be performed by an etching recipe having slightly different etch rates with respect to the first semiconductor layer 132 and the buried pattern 156. As the etching process is performed, a step height between the top surface of the first semiconductor layer 132 and the top surface of the buried pattern 156 may be generated due to the difference in the etch rates.

In some embodiments, etching processes for forming the first semiconductor layer 132 and the buried pattern 156 may be performed at different times and/or using different processes. In some embodiments, the first preliminary semiconductor layer 131 and the buried layer 155 are etched together, and an additional process further etching one of the first preliminary semiconductor layer 131 or the buried layer 155 may be performed. During the etching of the buried layer 155, a portion of the uppermost insulation layer 120U or the upper selection gate sacrificial layer 110U may be etched together.

Figure 57:
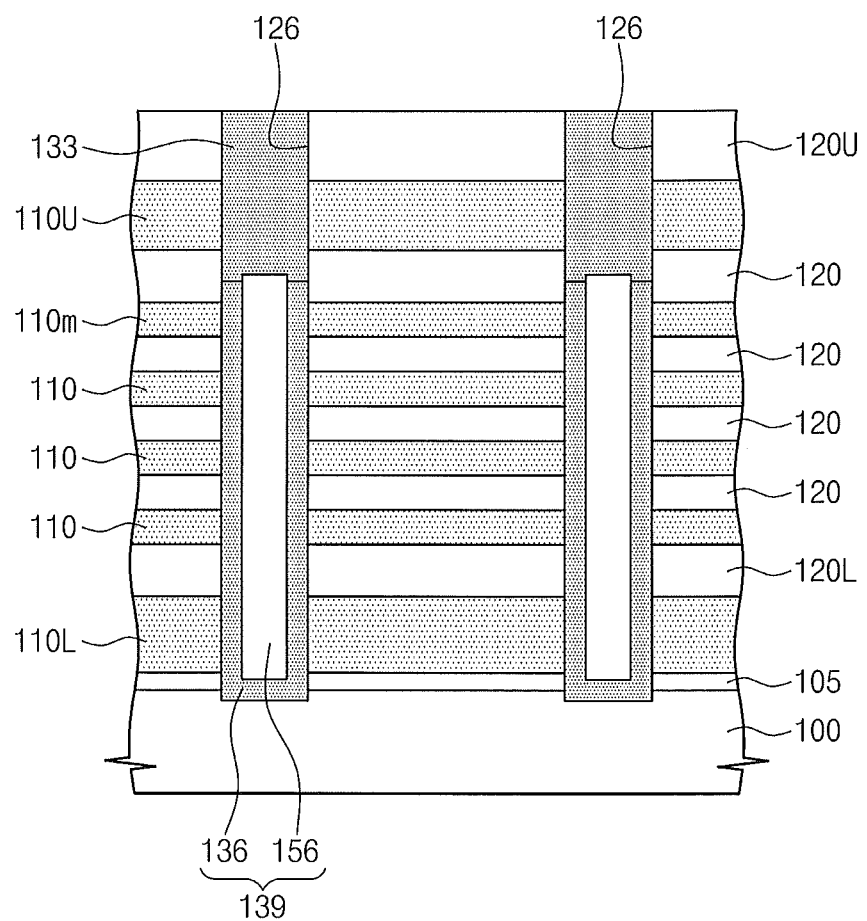
Figure 58:
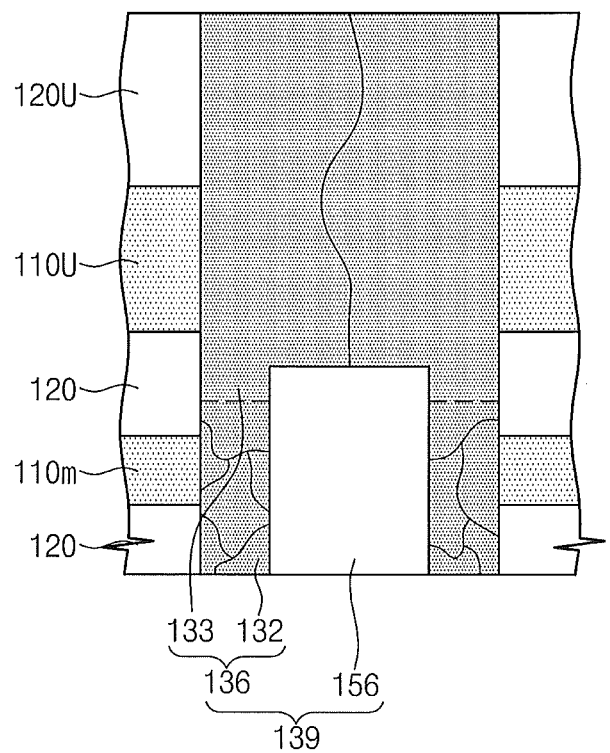
Figure 59:
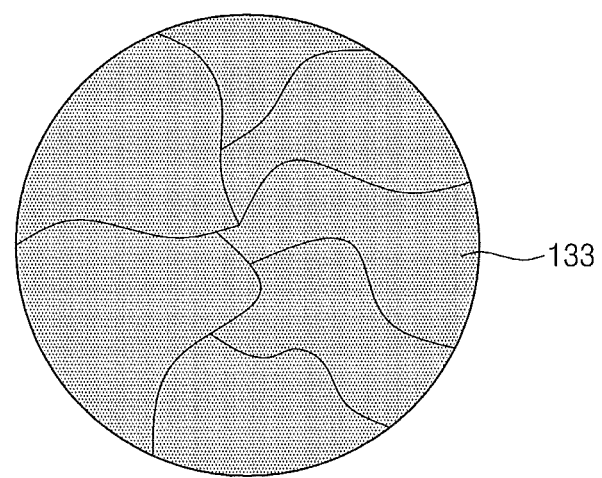

Referring to FIGS. 57 through 59, a second semiconductor layer 133 filling the second through regions 126 may be formed. FIG. 58 is an enlarged view of the first and second semiconductor layers 132 and 133 in FIG. 57, and FIG. 59 is an upper surface view of the second semiconductor layer 133. The second semiconductor layer 133 may include at least one of silicon or silicon-germanium. The second semiconductor layer 133 may be formed through an epitaxial growth process that uses the top surface of the first semiconductor layer 132 exposed by the second through regions 126 as a seed. That is, the epitaxial process may be performed by using grains constituting the top surface of the first semiconductor layer 132 as a seed. In comparison with a device that does not have the buried pattern 156, the first semiconductor layer 132 exposes a relatively small number of grains. Therefore, when the second semiconductor layer 133 is grown by using the first semiconductor layer 132 as a seed, the second semiconductor layer 133 may be composed of a relatively small number of grains as illustrated in FIG. 59. Each of the grains grown by using the first semiconductor layer 132 as a seed may form grain boundaries by contacting one another on the buried pattern 156. Although some grains are combined together or one grain is divided into a plurality of grains during the growth process, the growth may be maintained only in some seed grains until the completion of the process. However, the number of grains formed in the second semiconductor layer 133 may be similar to the number of the seed grains. The grains constituting the second semiconductor layer 133 may have a shape with a relatively long extension in a direction perpendicular to the top surface of the substrate 100. The second semiconductor layer 133 may be formed higher than the top surface of the uppermost insulation layer 120U, and may be planarized to have substantially the same height as the uppermost insulation layer 120U. The second semiconductor layer 133 may have an intrinsic state or may be doped with a first conductive type impurity.

Figure 60:
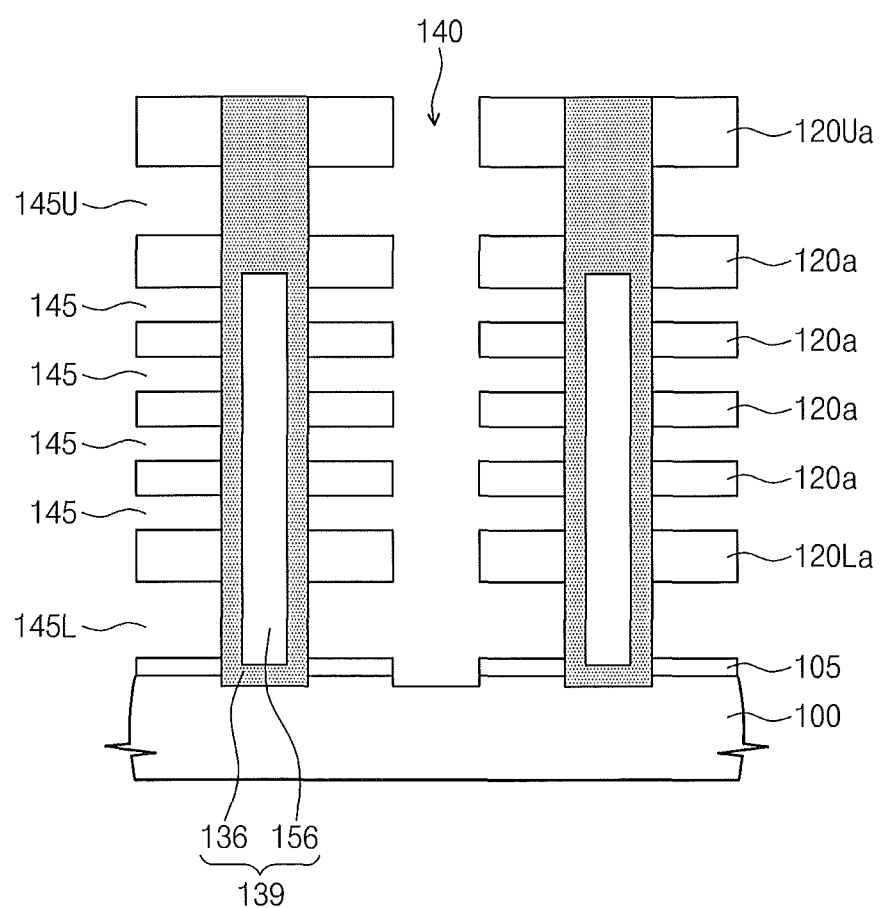

Referring to FIG. 60, the sacrificial layers 110U, 110m, 110 and 110L may be removed. The removal process may include forming a first trench 140 by continuously patterning the insulation layers 120U, 120 and 120L and the sacrificial layers 110U, 110m, 110 and 110L. The insulation layers 120U, 120 and 120L may be separated into the insulation patterns 120Ua, 120a and 120La by means of forming the first trench 140. Forming the first trench 140 may be performed by an anisotropic etching process. Recess regions 145L, 145 and 145U may be formed by removing the sacrificial patterns 110La, 110ma, 110a and 110Ua exposed by the first trench 140 through performing a selective etching process. An etch rate of the sacrificial patterns 110La, 110ma, 110a and 110Ua in the selective etching process may be faster/larger than etch rates of the insulation patterns 120La, 120a and 120Ua, the buffer insulation layer 105 and the semiconductor pattern 136. Therefore, after the performing of the selective etching process, the insulation patterns 120La, 120a and 120Ua, the buffer insulation layer 105 and the channel structures 139 may remain. The recess regions 145L, 145 and 145U may expose portions of sidewalls of the channel structures 139 that were in contact with the sacrificial patterns 110La, 110ma, 110a and 110Ua, respectively.

Figure 61:
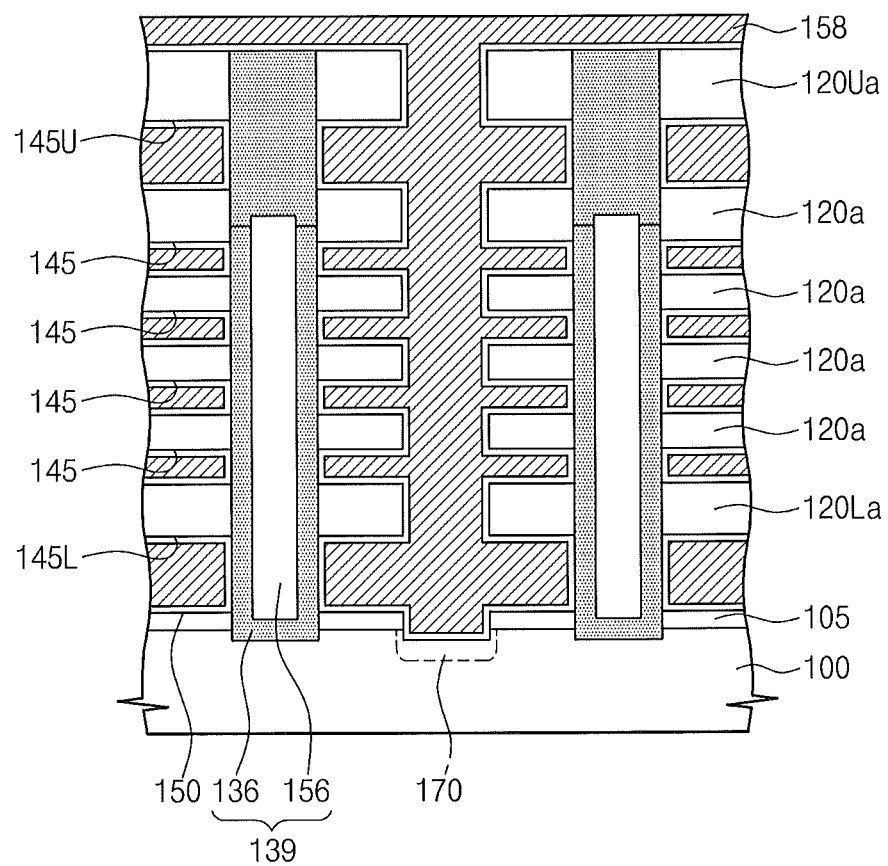

Referring to FIG. 61, a data storage layer 150 may be formed in the recess regions 145L, 145 and 145U. The data storage layer 150 may be formed by using deposition technology (e.g., CVD or ALD, etc.) that can provide excellent step coverage. Therefore, the data storage layer 150 may be substantially formed conformally along the recess regions 145L, 145 and 145U. The data storage layer 150 may fill a portion of the recess regions 145L, 145 and 145U.

After forming the data storage layer 150, a gate conductive layer 158 filling the recess regions 145L, 145 and 145U may be formed. The gate conductive layer 158 may fill at least a portion of the first trench 140. The gate conductive layer 158 may be electrically isolated from the channel structures 139 and the substrate 100 by the data storage layer 150.

Figure 62:
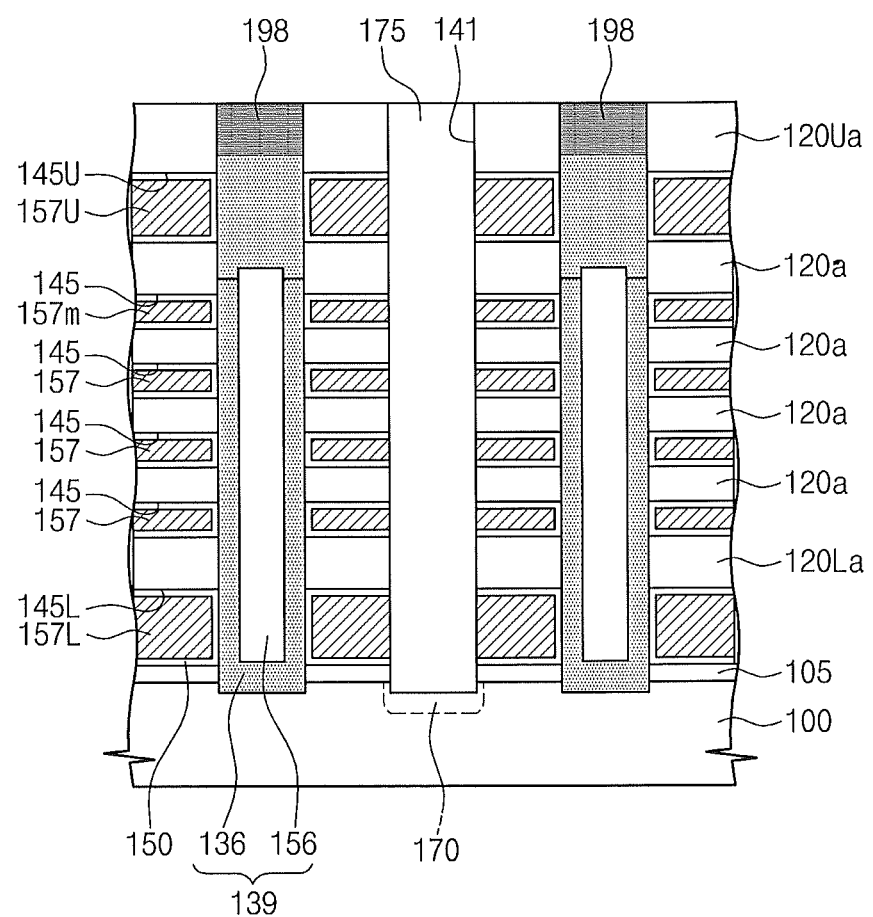

Referring to FIG. 62, after forming the gate conductive layer 158, a portion of the gate conductive layer 158 outside of the recess regions 145L, 145 and 145U is removed to form gate electrodes 157L, 157m, 157 and 157U in the recess regions 145L, 145 and 145U. The gate conductive layer 158 outside of the recess regions 145L, 145 and 145U may be removed by a wet etching and/or a dry etching process. As a result, a second trench 141 may be formed.

A lowermost pattern among the gate electrodes is a lower selection gate pattern 157L, and an uppermost pattern may be an upper selection gate pattern 157U. Cell gate patterns 157m and 157 may be provided between the lower selection gate pattern 157L and the upper selection gate pattern 157U. The cell gate patterns may include an uppermost cell gate pattern 157m and cell gate patterns 157 thereunder.

A first impurity region 170 may be formed in the substrate 100 under a bottom surface of the second trench 141. The first impurity region 170 may extend along the second trench 141. The first impurity region 170 may be formed by implanting second conductive type impurity ions. The uppermost insulation pattern 120Ua may be used as an ion implantation mask.

Second impurity regions 198 may be formed at upper portions of the channel structures 139 (e.g., on the second semiconductor layer 133). Each of the second impurity regions 198 may be doped with the second conductive type impurity. A bottom surface of the second impurity region(s) 198 may be higher than a top surface of the upper selection gate pattern 157U. The second impurity region(s) 198 may be formed at the same time as the first impurity region 170. Alternatively, the second impurity region 198 may be formed before forming the first impurity region 170. As such, the second impurity region 198 may be formed after forming the channel structures 139 and before forming the second trench 141. Alternatively, the second impurity region 198 may be formed after forming the first impurity region 170.

A device isolation pattern 175 filling the second trench 141 may be formed. Forming the device isolation pattern 175 may include forming a device isolation layer filling the second trench 141 on the substrate 100 and performing a planarization process on an upper surface of the data storage layer 150 using the uppermost insulation pattern 120Ua as an etch stop layer. The device isolation pattern 175 may include an insulating material. For example, the device isolation pattern 175 may be formed of a high-density plasma oxide layer, a spin on glass (SOG) layer and/or a chemical vapor deposition (CVD) oxide layer, etc. After forming the device isolation pattern 175, the exposed data storage layer 150 is etched such that the uppermost insulation pattern 120Ua may be exposed. As such, the second impurity region 198 may be exposed together with the uppermost insulation pattern 120Ua.

Referring again to FIG. 50, bit lines BL, which are electrically connected to the second impurity regions 198, may be formed. The bit lines BL may extend in the x direction. An interlayer dielectric (not shown), which covers the uppermost insulation pattern 120Ua and the device isolation pattern 175, is formed, and the bit lines BL may be formed on the interlayer dielectric(s). The bit lines BL may connect via contact plugs 199 penetrating the interlayer dielectric(s) to the second impurity regions 198. The contact plugs 199 may include at least one of metal, conductive metal nitride, or a doped semiconductor material.

Figure 63:
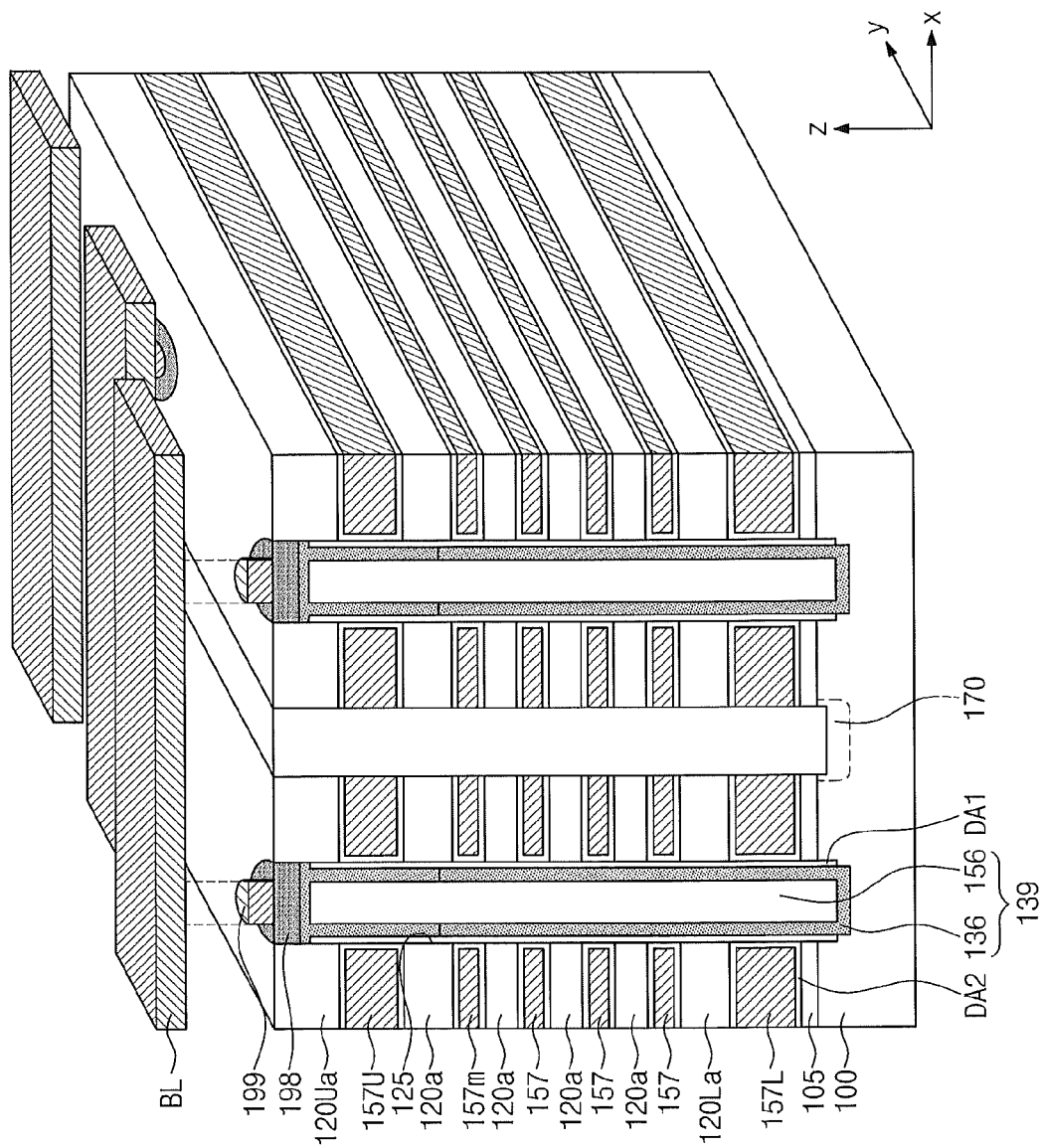
FIG. 63 is a perspective view of a semiconductor device according to some embodiments.
Figure 64:
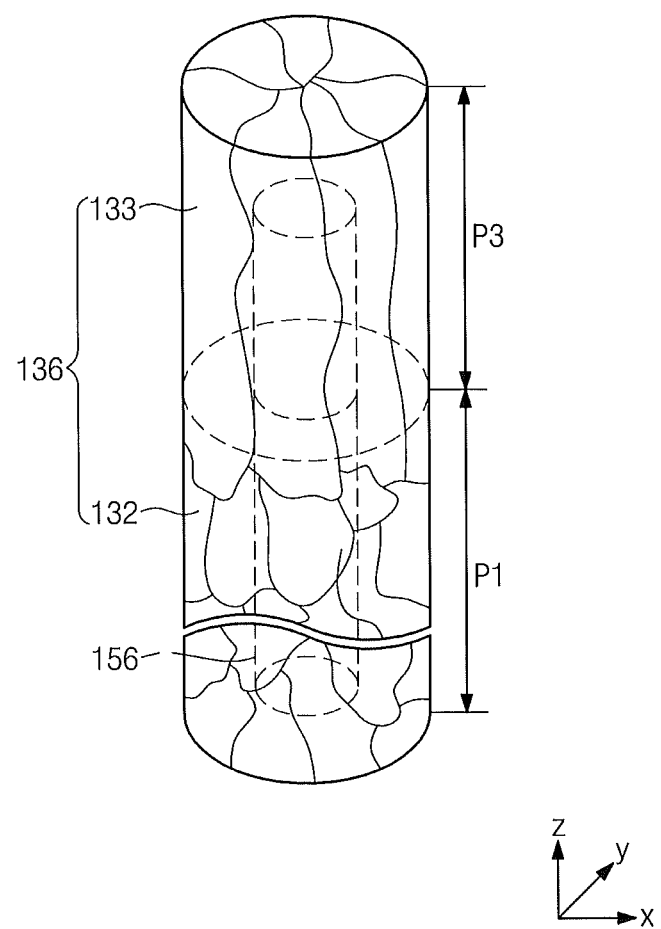
FIG. 64 is an enlarged view of a channel structure in FIG. 63.

FIG. 63 is a perspective view of the semiconductor device according to some embodiments, and FIG. 64 is an enlarged view of a channel structure in FIG. 63. For descriptive simplicity, the description related to technical characteristics overlapping with other Figures may not be provided below.

Referring to FIGS. 63 and 64, a stack structure is provided on a substrate 100. The stack structure may include gate patterns and insulation patterns which are repeatedly and alternatingly stacked on the substrate 100. The gate patterns may include a lower selection gate pattern 157L, cell gate patterns 157m and 157, and an upper selection gate pattern 157U. Channel structures 139, which extend from the substrate 100 to penetrate the gate patterns 157U, 157m, 157 and 157L and the insulation patterns 120Ua, 120a and 120La, may be provided. The channel structures 139 may be provided in first through regions 125 penetrating the gate patterns 157U, 157m, 157 and 157L and the insulation patterns 120Ua, 120a and 120La.

The channel structures 139 may include a first region P1 containing a first semiconductor layer 132, and a third region P3 containing a second semiconductor layer 133. The first region P1 may be an active region of the cell gate patterns 157m and 157 and the lower selection gate pattern 157L, and the third region P3 may be an active region of the upper selection gate pattern 157U. The third region P3 may be provided on the first region P1. A boundary between the first region P1 and the third region P3 may be provided between the upper selection gate pattern 157U and the uppermost cell gate pattern 157m. The first and second semiconductor layers 132 and 133 may constitute a portion of a semiconductor pattern 136. The third region P3 may be adjacent the upper selection gate pattern 157U, and the first region P1 may be adjacent the cell gate patterns 157m and 157. That is, when the upper selection gate pattern 157U is a gate electrode of a string selection transistor, a portion of the third region P3 may be a channel region of the string selection transistor. When the cell gate patterns 157m and 157 are gate electrodes of memory cell transistors, a portion of the first region P1 may be a channel region of the memory cell transistors.

A grain size in the third region P3 may be larger than that in the first region P1. For example, grains of the third region P3 may have longer lengths in a direction (z direction) perpendicular to the substrate 100 than widths in a direction (x direction or y direction) parallel to a surface of the substrate 100. For example, aspect ratios of the grains in the third region P3 may be about 5:100. For example, the lengths of the grains in the third region P3 in the z direction may be greater than a thickness of the upper selection gate pattern 157U. That is, the string selection transistor may have a channel region with a relatively larger grain size than the memory cell transistors. Therefore, the area of grain boundaries in the channel region of the string selection transistor may be reduced. Accordingly, electrical characteristics of a semiconductor device such as a leakage current generated by grain boundaries may be improved.

The channel structures 139 may further include a buried pattern 156 surrounded by the semiconductor pattern 136. For example, the semiconductor pattern 136 is provided along bottom surfaces and inner walls of the first through regions 125, and the buried pattern 156 may be filled in the semiconductor pattern 136. The buried pattern 156 may be spaced apart from the substrate 100 by means of the semiconductor pattern 136. A top surface of the buried pattern 156 may be higher (e.g., closer to a top surface of the uppermost insulation pattern 120Ua) than a top surface of the upper selection gate pattern 157U.

A device isolation pattern 175 extending between the channel structures 139 may be provided. A first impurity region 170 may be formed in the substrate 100 under the device isolation pattern 175. The first impurity region 170 may have a line shape extending in the y direction. The first impurity region 170 may be a region doped with a second conductive type impurity. The second conductive type may be a conductive type different from the first conductive type.

First and second data storage layers DA1 and DA2 may be provided between the gate patterns 157U, 157m, 157 and 157L and the channel structures 139. The first data storage layer DA1 may extend vertically along the sidewalls of the first through regions 125. The second data storage layer DA2 may extend along upper surfaces, lower surfaces and sidewalls of the gate patterns 157U, 157m, 157 and 157L.

A second impurity region 198 may be provided in an upper portion of the semiconductor pattern 136 adjacent the uppermost insulation pattern 120Ua. The second impurity region 198 may be an impurity region having the same conductive type as the first impurity region 170. Bit lines BL may extend in a direction (e.g., x direction) crossing the gate patterns 157U, 157m, 157 and 157L, and may be electrically connected to the second impurity region 198. The bit lines BL may be connected to the channel structures 139 through contact plugs 199. The bit lines BL may include at least one of metal, conductive metal nitride, or a semiconductor material.

FIGS. 65 through 72 are cross-sectional views and upper surface views illustrating a method of fabricating a semiconductor device according to some embodiments.

Figure 65:
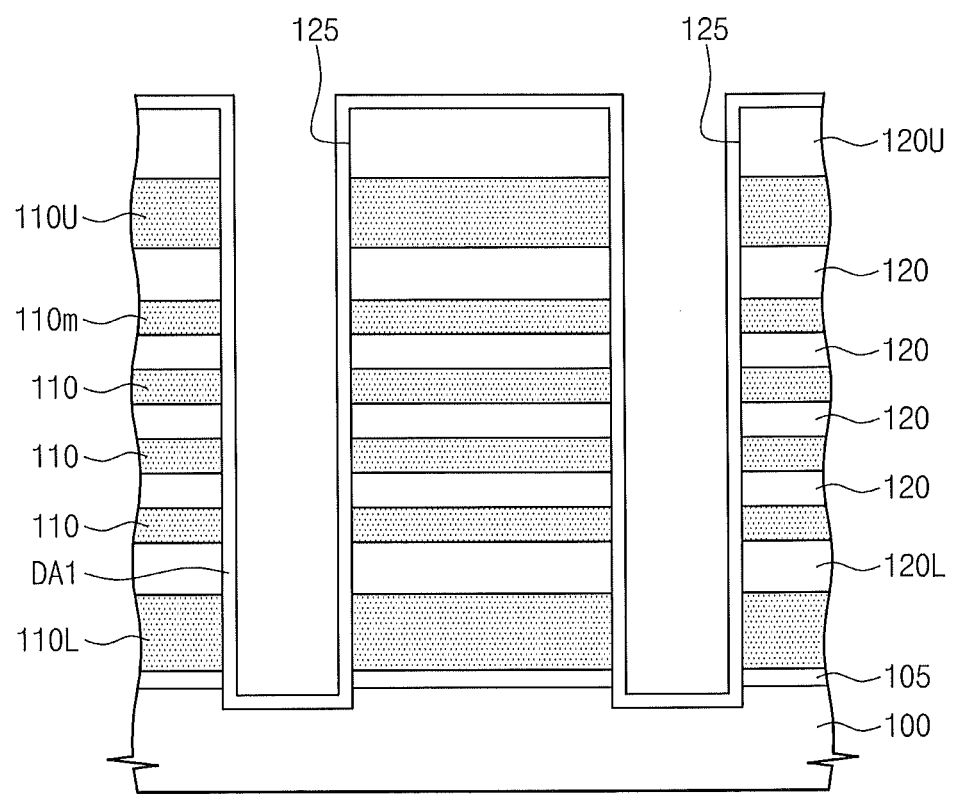
FIGS. 65 through 72 are cross-sectional views and upper surface view illustrating a method of fabricating a semiconductor device according to some embodiments.

Referring to FIG. 65, a stack structure, in which first material layers and second material layers are repeatedly and alternatingly stacked, may be provided on a substrate 100. The first material layers may be sacrificial layers 110L, 110m, 110 and 110U. The second material layers may be insulation layers 120L, 120 and 120U. Buffer insulation layer 105, the insulation layers 120L, 120 and 120U and the sacrificial layers 110L, 110m, 110 and 110U are continuously patterned such that first through regions 125 exposing the substrate 100 may be formed.

First data storage layers DA1 may be formed along sidewalls and bottom surfaces of the first through regions 125. The first data storage layer DA1 may include at least one insulation layer.

Figure 66:
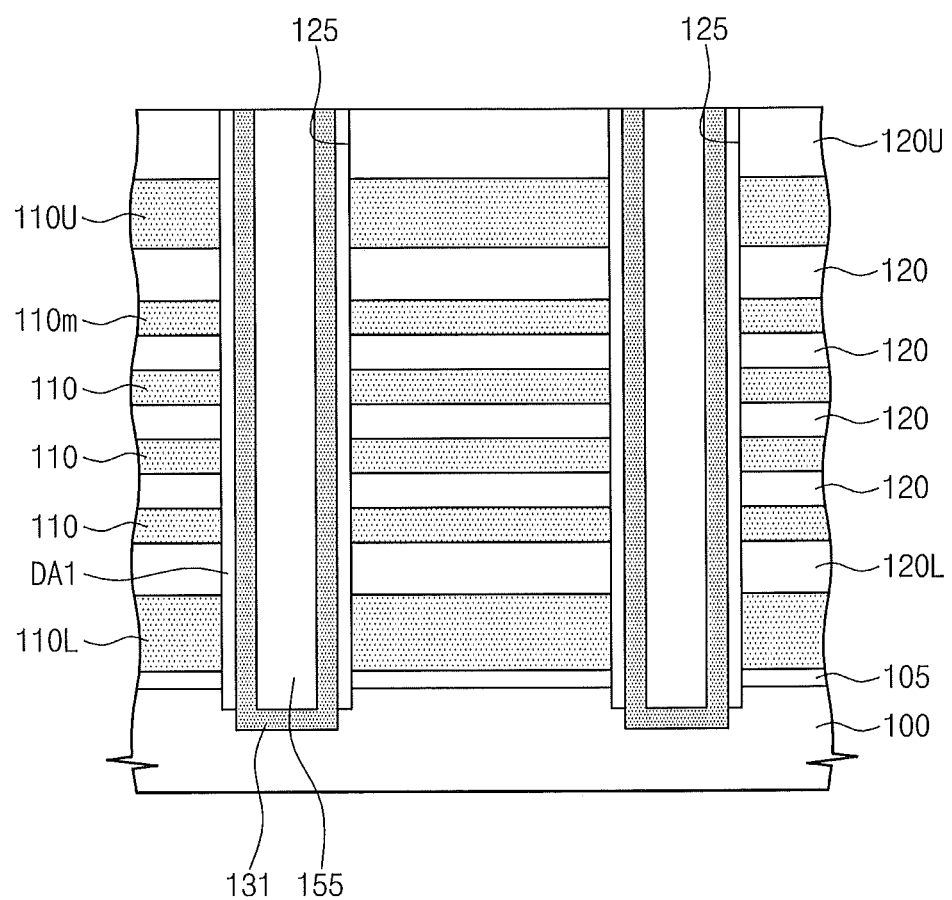

Referring to FIG. 66, preliminary channel structures may be formed in the first through regions 125. Forming the preliminary channel structures may include sequentially forming first preliminary semiconductor layers 131 and buried layers 155 in the first through regions 125. The first preliminary semiconductor layer 131 may be formed on the first data storage layer DA1. Before forming the first preliminary semiconductor layer 131, a lower portion of the first data storage layer DA1 may be etched to expose the substrate 100. Therefore, the first preliminary semiconductor layer 131 may be electrically connected to the substrate 100. The etching of the first data storage layer DA1 may be performed by using a spacer (not shown) as an etch mask after forming the spacer exposing the lower portion of the first data storage layer DA1 on the sidewalls of the first through regions 125. The spacer may include a silicon material. The spacer may be removed (or, alternatively, may not be removed) after the etching process, and may constitute a portion of the first preliminary semiconductor layer 131. Forming the first preliminary semiconductor layer 131 may include a recrystallization process by means of a first heat treatment process. The first preliminary semiconductor layer 131 may become a polycrystalline silicon layer having relatively small grains by means of the recrystallization process. For example, the first heat treatment process may be a solid phase crystallization process. The first preliminary semiconductor layer 131 and the buried layer 155 are deposited, and then the uppermost insulation layer 120U may be exposed by a planarization process. Alternatively, the planarization process may not be performed.

Figure 67:
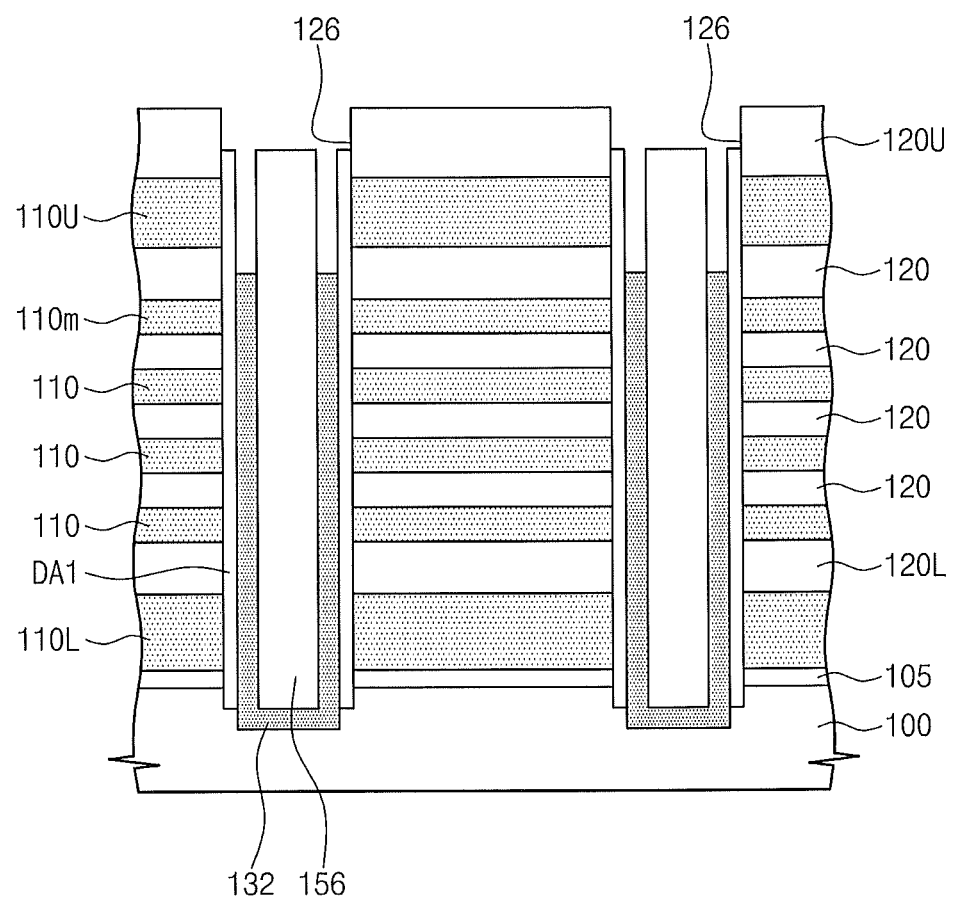
Figure 68:
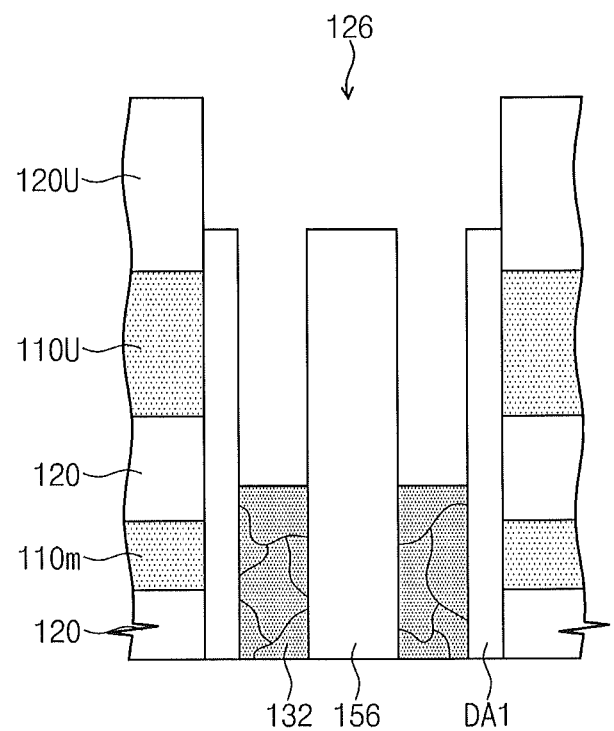
Figure 69:
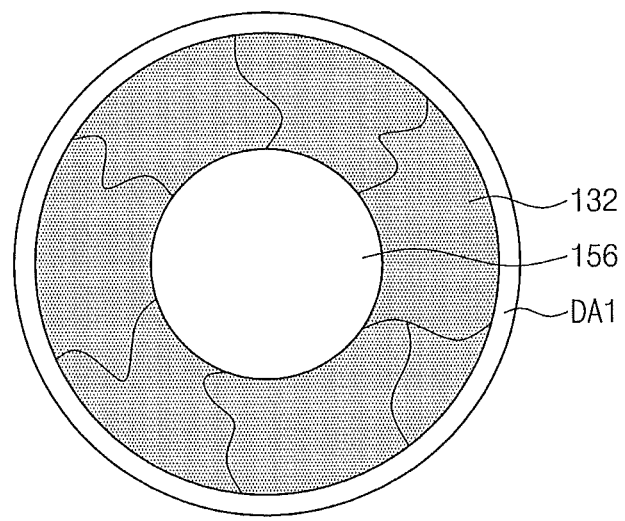

Referring to FIGS. 67 through 69, an upper portion of the preliminary channel structure may be etched. For example, a first semiconductor layer 132 is formed by etching the upper portion of the first preliminary semiconductor layer 131. FIG. 68 is an enlarged view of the first semiconductor layer 132 in FIG. 67, and FIG. 69 is an upper surface view of the first semiconductor layer 132. The first semiconductor layer 132 may have a top surface exposed by second through regions 126. The etching process may be performed to a depth between a top surface of the uppermost cell gate sacrificial layer 110m and a bottom surface of the upper selection gate sacrificial layer 110U. That is, bottom surfaces of the second through regions 126 may be disposed between the top surface of the uppermost cell gate sacrificial layer 110m and the bottom surface of the upper selection gate sacrificial layer 110U.

A buried pattern 156 may be formed by etching an upper portion of the buried layer 155. For example, a top surface of the buried pattern 156 may be higher than a top surface of the upper selection gate sacrificial layer 110U and may be lower than a top surface of the uppermost insulation layer 120U. During the etching of the buried layer 155, an upper portion of the first data storage layer DA1 may also be etched. Alternatively, the upper portion of the first data storage layer DA1 may not be etched.

The top surface of the first semiconductor layer 132 may define the bottom surface of the second through regions 126. Therefore, the top surface of the first semiconductor layer 132 may expose a relatively small number of grains in the second through regions 126 (e.g., in comparison with a device not having the buried pattern 156).

The second through regions 126 may be formed by various etching processes such as dry etching, wet etching, or combinations thereof. According to some embodiments, etchings for forming the first semiconductor layer 132 and the buried pattern 156 may be performed at the same time. As such, the etching process may be performed by an etching recipe having a relatively higher etch rate with respect to the first semiconductor layer 132. In some embodiments, etching processes for forming the first semiconductor layer 132 and the buried pattern 156 may be performed at different times and/or using different processes. In some embodiments, the buried pattern 156 may be formed after forming a second semiconductor layer 133.

Figure 70:
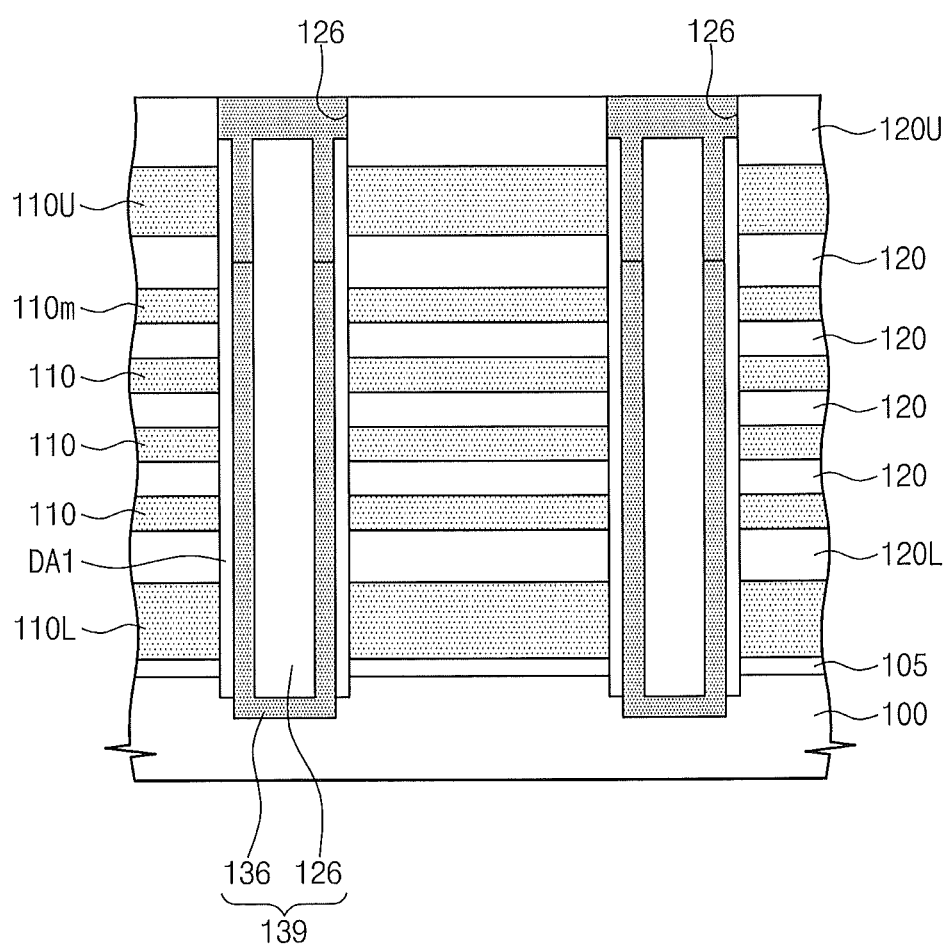
Figure 71:
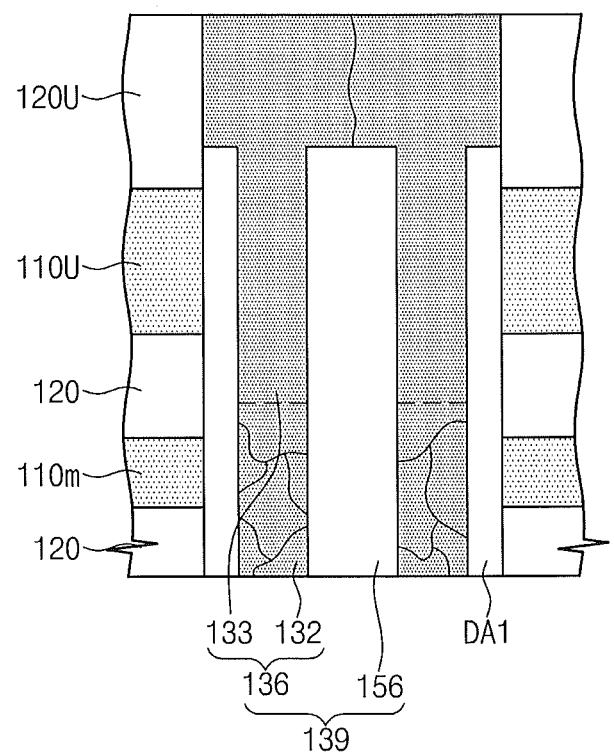

Referring to FIGS. 70 and 71, a second semiconductor layer 133 filling the second through regions 126 may be formed. FIG. 71 is an enlarged view of the first and second semiconductor layers 132 and 133 in FIG. 70. An upper surface view of the second semiconductor layer 133 may be substantially the same as FIG. 59. The second semiconductor layer 133 may include at least one of silicon or silicon-germanium. The second semiconductor layer 133 may be formed through an epitaxial growth process that uses the first semiconductor layer 132 exposed by the second through regions 126 as a seed. That is, the epitaxial process may be performed by using grains constituting the top surface of the first semiconductor layer 132 as a seed. The first semiconductor layer 132 exposes a relatively small number of grains (e.g., in comparison with a device not having the buried pattern 156). Therefore, when the second semiconductor layer 133 is grown by using the first semiconductor layer 132 as a seed, the second semiconductor layer 133 may be composed of a relatively small number of grains as illustrated in FIG. 59. Each of the grains grown by using the first semiconductor layer 132 as a seed may form grain boundaries by contacting one another on the buried pattern 156. Although some grains may be combined together or one grain may be divided into a plurality of grains during the growth process, the growth may be maintained only in some seed grains until the completion of the process. However, the number of grains formed in the second semiconductor layer 133 may be similar to the number of the seed grains. The grains constituting the second semiconductor layer 133 may have a shape that extends long in a direction perpendicular to the top surface of the substrate 100. The second semiconductor layer 133 may be formed higher than the top surface of the uppermost insulation layer 120U, and the second semiconductor layer 133 may be subsequently planarized to have substantially the same height as the uppermost insulation layer 120U. The second semiconductor layer 133 may have an intrinsic state or may be doped with a first conductive type impurity.

Figure 72:
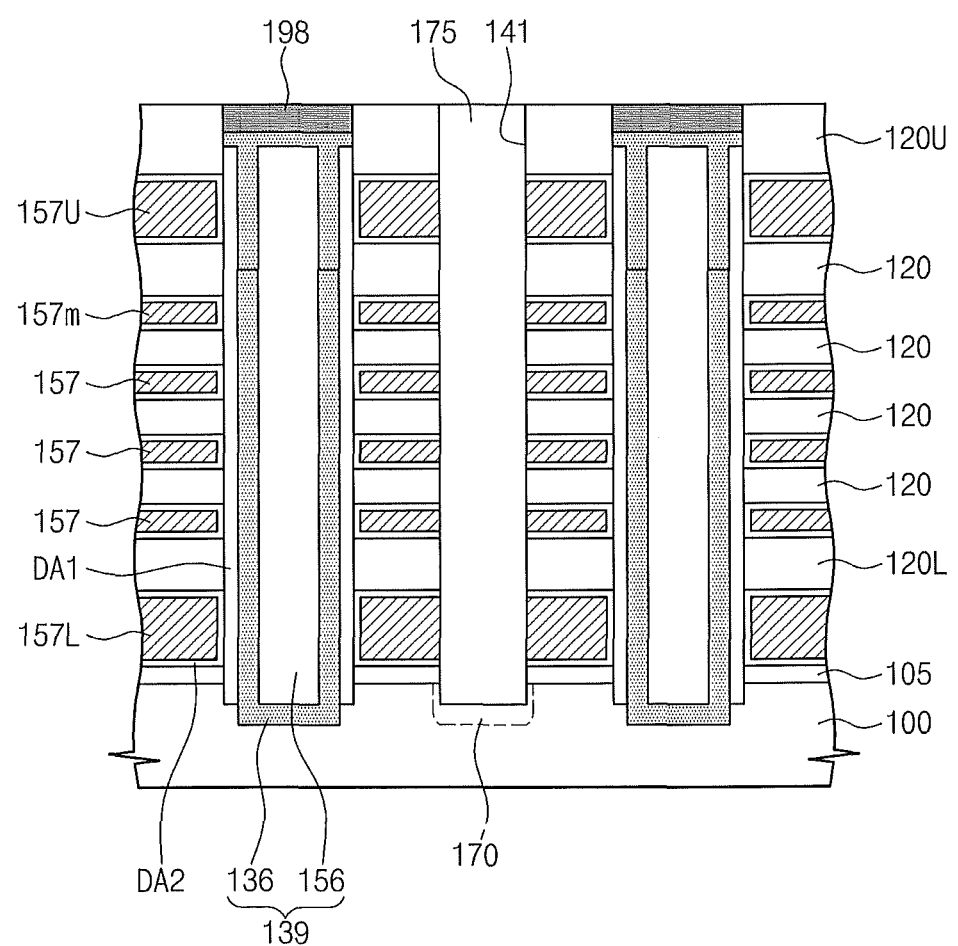

Referring to FIG. 72, the sacrificial layers 110U, 110m, 110 and 110L may be removed to form recess regions (not shown), and a second data storage layer DA2 and gate electrodes 157L, 157m, 157 and 157U are formed in the recess regions. A lowermost pattern among the gate electrodes is a lower selection gate pattern 157L, and an uppermost pattern may be an upper selection gate pattern 157U. Cell gate patterns 157m and 157 may be provided between the lower selection gate pattern 157L and the upper selection gate pattern 157U. The cell gate patterns may include an uppermost cell gate pattern 157m and cell gate patterns 157 thereunder.

A first impurity region 170 may be formed in the substrate 100 under a bottom surface of the second trench 141. The first impurity region 170 may be formed by implanting second-type dopant ions. Second impurity regions 198 may be formed at upper portions of the channel structures 139. The second impurity region 198 may be doped with the second-type dopant. A bottom surface of the second impurity region 198 may be higher than a top surface of the upper selection gate pattern 157U. The second impurity region 198 may be formed at the same time as the first impurity region 170. A device isolation pattern 175 filling the second trench 141 may be formed.

Referring again to FIG. 63, bit lines BL, which are electrically connected to the second impurity regions 198, may be formed. The bit lines BL may extend in the x direction. The bit lines BL may connect via contact plugs 199 penetrating interlayer dielectric(s) (not shown) to the second impurity regions 198. The contact plugs 199 may include at least one of metal, conductive metal nitride, or a doped semiconductor material.

Figure 73:
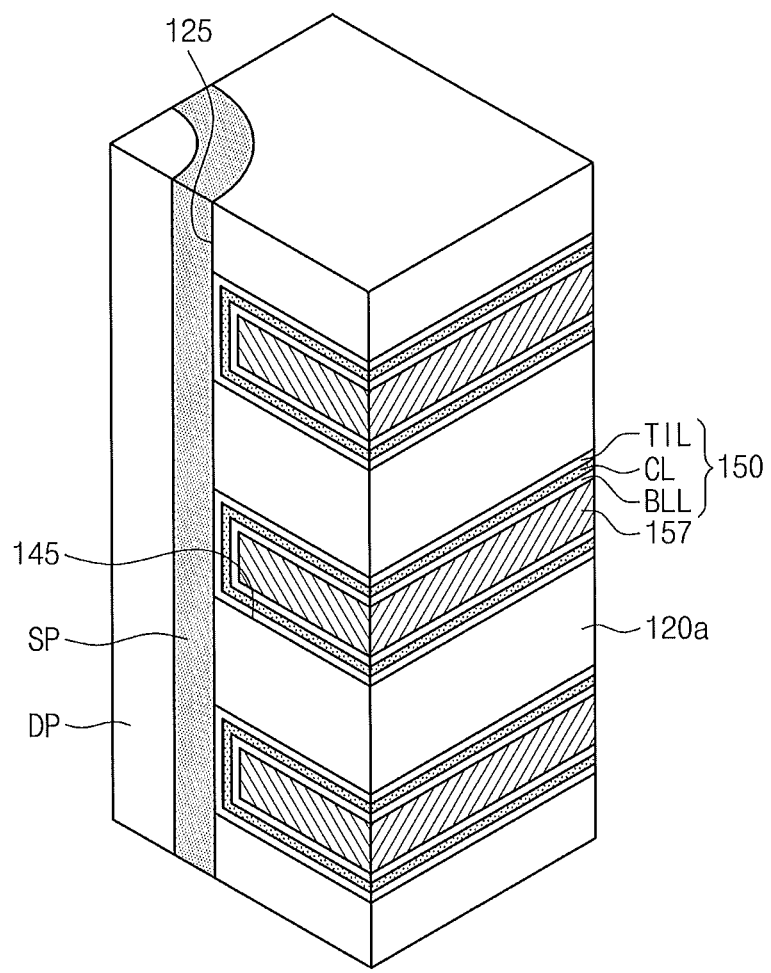
FIGS. 73 and 74 are perspective views illustrating structures of data storage layers according to some embodiments.
Figure 74:
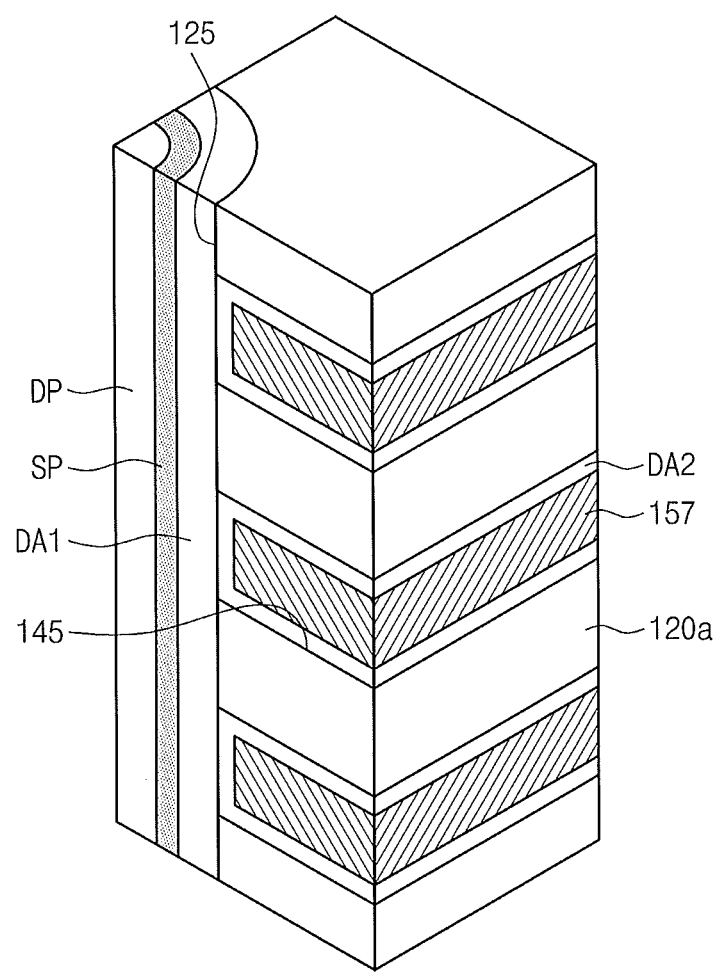

FIGS. 73 and 74 are perspective views illustrating structures of data storage layers according to some embodiments.

FIG. 73 is a perspective view illustrating the data storage layer 150 according to some embodiments. For example, the data storage layer 150 of FIG. 73 may be the data storage layer 150 illustrated in FIG. 50.

Buried pattern DP and semiconductor pattern SP are provided in first through regions 125, and a data storage layer 150 may be provided on a sidewall of the semiconductor pattern SP. The data storage layer 150 may include a tunnel insulation layer TIL, a charge storage layer CL, and a blocking insulation layer BLL that are sequentially stacked in recess regions 145. Layers constituting the data storage layer 150 may be formed by using deposition technology (e.g., chemical vapor deposition or atomic layer deposition technology), which can provide excellent step coverage.

The charge storage layer CL may be one of various insulation layers having abundant trap sites and one of various insulations layers including nanoparticles, and may be formed by using one of chemical vapor deposition or atomic layer deposition technology. For example, the charge storage layer CL may include one of various insulation layers including a trap insulation layer, a floating gate electrode, or conductive nano dots. For example, the charge storage layer CL may include at least one of a silicon nitride layer, a silicon oxynitride layer, a Si-rich nitride layer, nanocrystalline Si, and a laminated trap layer.

The tunnel insulation layer TIL may include one of various materials having a larger bandgap than the charge storage layer CL, and may be formed by using one of chemical vapor deposition or atomic layer deposition technology. For example, the tunnel insulation layer TIL may be a silicon oxide layer formed by using one of the foregoing deposition technologies. In addition, a predetermined heat treatment carried out after the deposition process may be further performed on the tunnel insulation layer TIL. The heat treatment may be a rapid thermal nitridation (RTN) or an annealing process performed in an atmosphere including at least one of nitrogen or oxygen.

The blocking insulation layer BLL may be a single insulation layer. Alternatively, the blocking insulation layer BLL may include first and second blocking insulation layers (not shown). The first and second blocking insulation layers may be formed of different materials, and one of the first and second blocking insulation layers may be one of various materials having a bandgap that is smaller than the tunnel insulation layer TIL and larger than the charge storage layer CL. Also, the first and second blocking insulation layers may be formed by using one of chemical vapor deposition or atomic layer deposition technology, and at least one of the first and second blocking insulation layers may be formed through a wet oxidation process. According to some embodiments, the first blocking insulation layer is one of high-k dielectric layers such as an aluminum oxide layer and a hafnium oxide layer, and the second blocking insulation layer may be a material having a dielectric constant smaller than the first blocking insulation layer. According to some embodiments, the second blocking insulation layer is one of high-k dielectric layers, and the first blocking insulation layer may include a material having a dielectric constant smaller than the second blocking insulation layer.

FIG. 74 is a perspective view illustrating a structure of a data storage layer according to some embodiments. For example, the data storage layers DA1 and DA2 of FIG. 74 may be the data storage layers illustrated in FIG. 63. The data storage layer according to some embodiments may include a first data storage layer DA1 and a second data storage layer DA2. The first data storage layer DA1 may be formed in the first through regions 125, and may extend along a sidewall of the first through regions 125. The second data storage layer DA2 may be formed in the recess regions 145. The first and second data storage layers DA1 and DA2 may include one or more of the blocking insulation layer BLL, the charge storage layer CL, and the tunnel insulation layer TIL.

Figure 75:
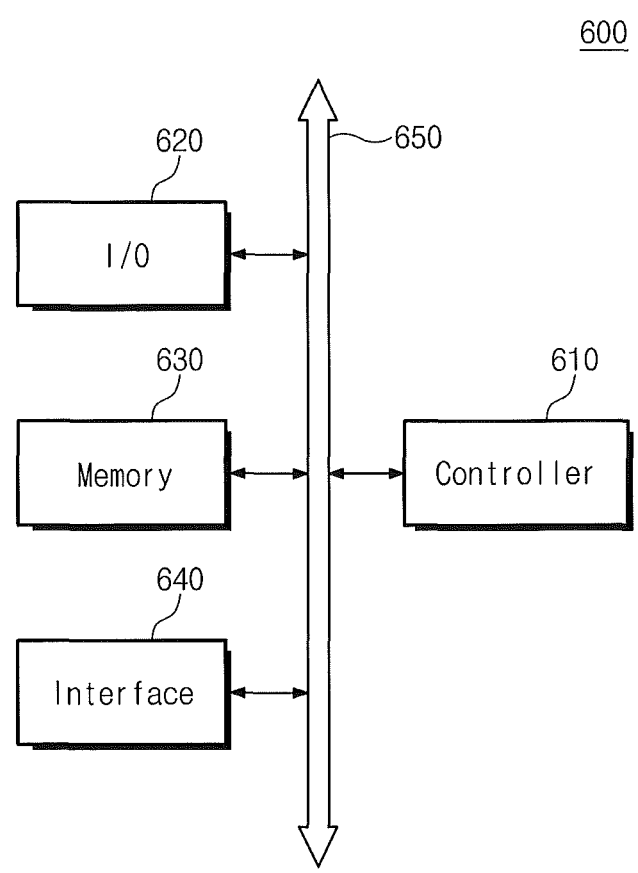
FIG. 75 is a schematic block diagram illustrating an example of a memory system including the semiconductor device formed according to some embodiments.

FIG. 75 is a schematic block diagram illustrating an example of a memory system including a semiconductor memory device formed according to some embodiments.

Referring to FIG. 75, the memory system 600 may be applied to a personal digital assistant (PDA), a portable computer, a web tablet, a wireless phone, a mobile phone, a digital music player, a memory card and all devices which may transmit and/or receive data in a wireless environment.

The memory system 600 includes an input/output device 620, a controller 610, a memory 630, an interface 640, and a bus 650. The memory 630 and the interface 640 intercommunicate through the bus 650.

The controller 610 includes at least one micro processor, a digital signal processor, a micro controller, and/or other process devices capable of performing similar functions to the above elements. The memory 630 may be used to store a command performed by the controller 610. The input/output device 620 may input data or a signal from outside of the memory system 600 or may output data or a signal outside of the memory system 600. For example, the input/output device 620 may include a keyboard, a key pad, and/or a display device.

The memory 630 includes a non-volatile memory device according to some embodiments. For example, the memory 630 may include a semiconductor device illustrated in FIGS. 1-74. The memory 630 may further include another kind of memory, such as a randomly accessible volatile memory and/or various other kinds of memories.

The interface 640 may serve to transmit/receive data to/from a communication network.

Figure 76:
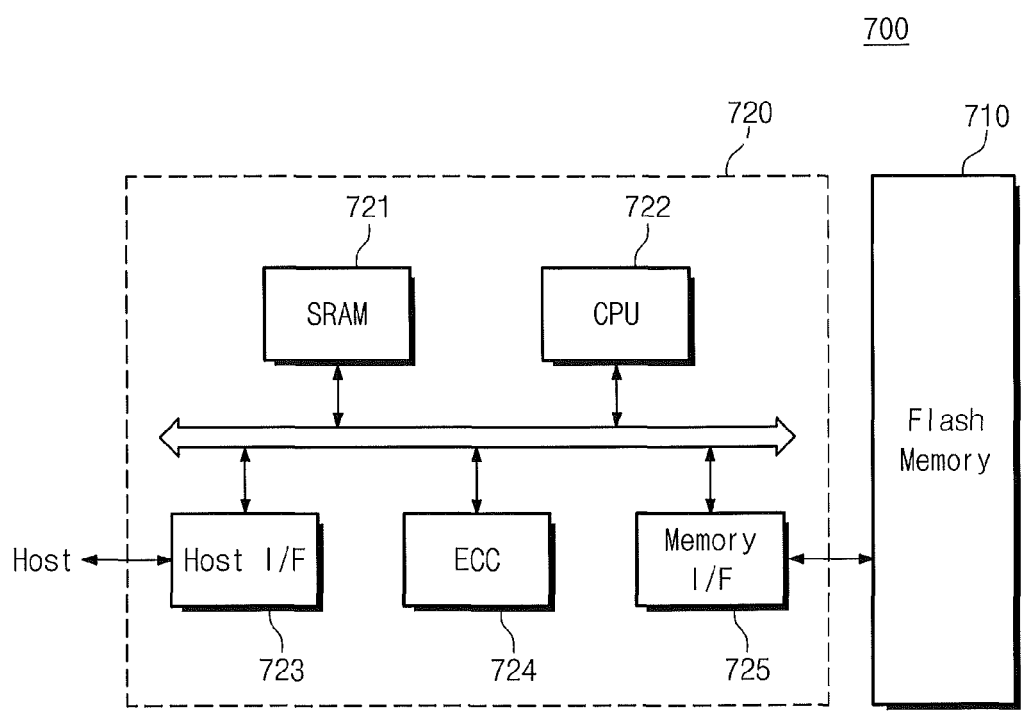
FIG. 76 is a schematic block diagram illustrating an example of a memory card having the semiconductor device formed according to some embodiments.

FIG. 76 is a schematic block diagram illustrating an example of a memory card having a semiconductor memory device formed according to some embodiments. For example, the memory card in FIG. 76 may include a semiconductor memory device illustrated in FIGS. 1-74.

Referring to FIG. 76, the memory card 700, which may support a high volume of data storage capacity, is provided with a flash memory device 710 according to some embodiments. The memory card 700 according to some embodiments includes a memory controller 720 which controls various data exchanges between a host and the flash memory 710.

A static random access memory (SRAM) 721 may be used as a working memory of a processing unit, such as a central processing unit (CPU) 722. A host interface 723 may have a data exchange protocol of the host contacting the memory card 700. An error correction code 724 may detect and correct an error which is included in the data read out from the multi-bit flash memory device 710. A memory interface 725 may be configured to interface with the flash memory device 710. The processing unit 722 performs various control operations for data exchange of the memory controller 720. Although not illustrated in the drawings, the memory card 700 according to the inventive concept may be further supplied with a read only memory (ROM) (not illustrated), or the like, which stores code data for interfacing with the host.

Figure 77:
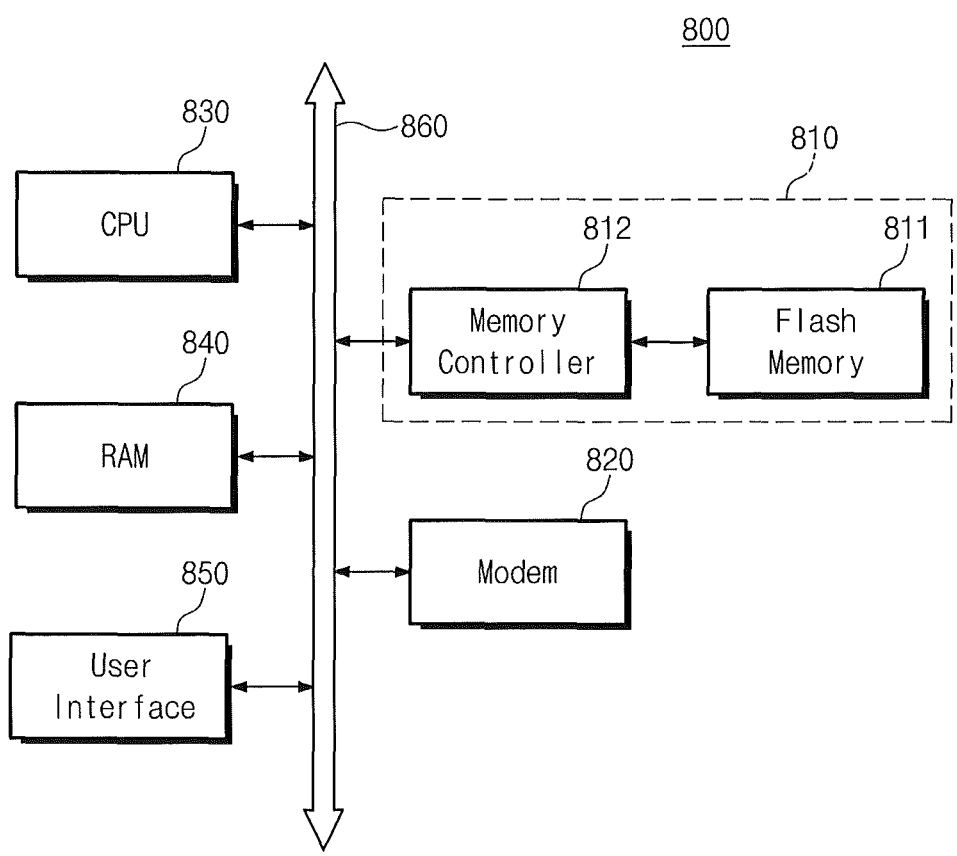
FIG. 77 is a schematic block diagram illustrating an example of a data processing system mounting the semiconductor device formed according to some embodiments.

FIG. 77 is a schematic block diagram illustrating an example of a data processing system mounting a semiconductor memory device formed according to some embodiments. For example, the semiconductor memory device may include a semiconductor memory device illustrated in FIGS. 1-74.

Referring to FIG. 77, a flash memory system 810 is mounted on a data processing system such as a mobile device or a desktop computer. The data processing system 800 according to some embodiments includes the flash memory system 810, a modem 820, a central processing unit (CPU) 830, a random access memory (RAM) 840 and a user interface 850 which is electrically connected to a system bus 860. The flash memory system 810 includes a flash memory 811 and a memory controller 812 controlling the flash memory 811. The flash memory system 810 may be substantially similar/equal to the memory system 600 or the flash memory system 710. In the flash memory system 810, the data processed by the central processing unit 830 or the data input from the outside are stored. Herein, the above-described flash memory system 810 may be include a solid state disk (SSD), and the data processing system 800 may thus stably store a high volume of data in the flash memory system 810. Due to the increase in reliability, the flash memory system 810 may reduce the resources required for an error correction, thereby providing a high-speed data exchange function to the data processing system 800. Although not illustrated in the drawings, the data processing system 800 according to some embodiments may be further supplied with an application chipset, a camera image processor (CIS) and/or an input/out device or the like.

Also, the flash memory device or the memory system according to some embodiments may be mounted in various types of packages. Examples of the packages of the semiconductor devices according to some embodiments may include package on package (PoP), ball grid arrays (BGAs), chip scale packages (CSPs), a plastic leaded chip carrier (PLCC), a plastic dual in-line package (PDIP), a die in waffle pack, a die in wafer form, a chip on board (COB), a ceramic dual in-line package (CERDIP), a plastic metric quad flat pack (MQFP), a thin quad flat pack (TQFP), a small outline package (SOP), a shrink small outline package (SSOP), a thin small outline package (TSOP), a thin quad flat package (TQFP), a system in package (SIP), a multi chip package (MCP), a wafer-level fabricated package (WFP), a wafer-level processed package (WSP) and so on.

According to some embodiments, a channel pattern, where a cell gate pattern and a selection gate pattern have different structures from each other, can be provided. A selection transistor region, which has an active region wider than an active region of a cell region, can be provided.

While the inventive concept has been particularly shown and described with reference to various embodiments thereof, it will be understood by those of ordinary skill in the art that various changes in form and details may be made therein without departing from the spirit and scope of the inventive concept as defined by the following claims. Therefore, the above-disclosed subject matter is to be considered illustrative and not restrictive.

What is claimed is:

1. A method of fabricating a semiconductor device, the method comprising:
    stacking first and second material layers repeatedly and alternatingly on a substrate;
    patterning the first and second material layers to form a first through region exposing the substrate;
    forming a first semiconductor layer in the first through region on the substrate and on sidewalls of the first and second material layers;
    forming a buried layer filling the first through region on the first semiconductor layer;
    removing a portion of the buried layer to form a second through region between opposing exposed sidewalls of the first semiconductor layer that are between the sidewalls of the first and second material layers; and
    forming a second semiconductor layer in the second through region, between the opposing exposed sidewalls of the first semiconductor layer, the second semiconductor layer having a grain size larger than the first semiconductor layer.

2. The method of claim 1, further comprising, before forming the second through region, performing a first heat treatment on the first semiconductor layer to crystallize the first semiconductor layer.

3. The method of claim 2, further comprising, after forming the second semiconductor layer, performing a second heat treatment on the second semiconductor layer and portions of the first semiconductor layer in the second through region to crystallize the second semiconductor layer.

4. The method of claim 3, wherein the second heat treatment comprises a laser heat treatment.

5. The method of claim 1,
    wherein the first material layer comprises an uppermost cell gate layer, and an upper selection gate layer on the uppermost cell gate layer,
    wherein the second material layer comprises an insulation layer, and
    wherein a bottom surface of the second through region is formed between the uppermost cell gate layer and the upper selection gate layer.

6. The method of claim 1, wherein forming the second through region further comprises removing an upper portion of the first semiconductor layer.

7. The method of claim 6, wherein removing the portion of the buried layer comprises etching the buried layer such that a top surface of the buried layer is higher than that of the first semiconductor layer.

8. The method of claim 6, wherein the second semiconductor layer is epitaxially grown from a top surface of the first semiconductor layer exposed by the second through region.

9. The method of claim 1, wherein forming the second semiconductor layer comprises forming the second semiconductor layer on a surface of the buried layer, after removing the portion of the buried layer.

10. The method of claim 1, wherein:
    removing the portion of the buried layer comprises exposing a surface of the buried layer; and
    forming the second semiconductor layer comprises forming the second semiconductor layer on the surface of the buried layer.

11. The method of claim 1, wherein forming the second semiconductor layer comprises forming the second semiconductor layer to a first width that is equal to a second width of the buried layer.

12. The method of claim 1, wherein forming the second semiconductor layer comprises forming the second semiconductor layer directly on the opposing exposed sidewalls of the first semiconductor layer and directly on a surface of the buried layer that is farthest from the substrate.

13. The method of claim 1,
    wherein the first material layer comprises an uppermost cell gate sacrificial layer, and an upper selection gate sacrificial layer on the uppermost cell gate sacrificial layer,
    wherein the second material layer comprises an insulation layer, and wherein a bottom surface of the second through region is formed between the uppermost cell gate sacrificial layer and the upper selection gate sacrificial layer.

14. A method of fabricating a semiconductor device, the method comprising:
   stacking first and second material layers repeatedly and alternatingly on a substrate;
   patterning the first and second material layers to form a first through region exposing the substrate;
   forming a first semiconductor layer in the first through region on the substrate and on sidewalls of the first and second material layers;
   forming a buried layer filling the first through region on the first semiconductor layer;
   removing a portion of the buried layer to form a second through region between the sidewalls of the first and second material layers; and
   forming a second semiconductor layer in the second through region, the second semiconductor layer having a grain size larger than the first semiconductor layer,
   wherein the first material layer comprises an uppermost cell gate sacrificial layer, and an upper selection gate sacrificial layer on the uppermost cell gate sacrificial layer,
   wherein the second material layer comprises an insulation layer, and
   wherein a bottom surface of the second through region is formed between the uppermost cell gate sacrificial layer and the upper selection gate sacrificial layer.

15. The method of claim 14, wherein a top surface of the buried layer after removing the portion of the buried layer is higher than a top surface of the uppermost cell gate sacrificial layer.

16. A method of forming a semiconductor device comprising:
   patterning insulation layers and sacrificial layers on a substrate to form a first through region therethrough exposing the substrate;
   forming a first preliminary semiconductor layer in the first through region;
   forming a first semiconductor layer by performing a first heat treatment process on the first preliminary semiconductor layer;
   forming a second through region in a portion of the first through region;
   forming a second preliminary semiconductor layer in the second through region;
   forming a second semiconductor layer by performing a second heat treatment process on the second preliminary semiconductor layer, the second semiconductor layer having a grain size larger than the first semiconductor layer;
   patterning the insulation layers and the sacrificial layers to form a first trench exposing the substrate;
   forming recess regions between the insulation layers by removing the sacrificial patterns;
   forming a data storage layer in the recess regions; and
   forming a gate conductive layer in the first trench and in the recess regions such that the data storage layer is between the gate conductive layer and the first and second semiconductor layers.

17. The method of claim 16,
   further comprising forming gate electrodes in the recess regions by removing portions of the gate conductive layer that are outside of the recess regions,
   wherein removing portions of the gate conductive layer comprises forming a second trench in the first trench.

18. The method of claim 17,
   wherein, before forming the first preliminary semiconductor layer, forming a first data storage layer in the first through region,
   wherein forming the first preliminary semiconductor layer comprises forming the first preliminary semiconductor layer on the first data storage layer, and
   wherein the data storage layer formed in the recess regions comprises a second data storage layer.

19. The method of claim 16, further comprising:
   forming a buried layer in the first through region to divide the first preliminary semiconductor layer, wherein forming the second through region comprises removing a portion of the buried layer.

* * * * *